US010705274B2

(12) United States Patent
Ito

(10) Patent No.: US 10,705,274 B2
(45) Date of Patent: Jul. 7, 2020

(54) OPTICALLY ANISOTROPIC LAYER AND PRODUCTION METHOD THEREFOR, OPTICALLY ANISOTROPIC LAMINATE AND PRODUCTION METHOD THEREFOR, OPTICALLY ANISOTROPIC TRANSFER BODY, POLARIZATION PLATE, AND IMAGE DISPLAY DEVICE

(71) Applicant: ZEON CORPORATION, Chiyoda-ku, Tokyo (JP)

(72) Inventor: Manabu Ito, Tokyo (JP)

(73) Assignee: ZEON COPORATION, Chiyoda-ku, Tokyo (JP)

( * ) Notice: Subject to any disclaimer, the term of this patent is extended or adjusted under 35 U.S.C. 154(b) by 156 days.

(21) Appl. No.: 16/088,688

(22) PCT Filed: Mar. 27, 2017

(86) PCT No.: PCT/JP2017/012486
§ 371 (c)(1),
(2) Date: Sep. 26, 2018

(87) PCT Pub. No.: WO2017/170455
PCT Pub. Date: Oct. 5, 2017

(65) Prior Publication Data
US 2019/0113667 A1     Apr. 18, 2019

(30) Foreign Application Priority Data

Mar. 30, 2016 (JP) .................................. 2016-068385

(51) Int. Cl.
*G02B 5/30* (2006.01)
*G02F 1/1335* (2006.01)
(Continued)

(52) U.S. Cl.
CPC .............. *G02B 5/3016* (2013.01); *B32B 7/02* (2013.01); *C09K 19/2007* (2013.01);
(Continued)

(58) Field of Classification Search
CPC .. G02B 5/3083; G02B 27/286; G02B 5/3025; G02B 1/04; G02B 30/25; G02B 1/08;
(Continued)

(56) References Cited

U.S. PATENT DOCUMENTS 8,477,274 B2    7/2013  Nakayama et al.
8,647,725 B2    2/2014  Shimamura et al.
(Continued)

FOREIGN PATENT DOCUMENTS

EP    2703385 A1    3/2014
EP    2871192 A1    5/2015
(Continued)

OTHER PUBLICATIONS

Oct. 21, 2019, the Extended European Search Report issued by the European Patent Office in the corresponding European Patent Application No. 17774992.6.
(Continued)

*Primary Examiner* — Collin X Beatty
*Assistant Examiner* — Grant A Gagnon
(74) *Attorney, Agent, or Firm* — Kenja IP Law PC

(57) ABSTRACT

An optically anisotropic layer including a polymer and a compound having a mesogen skeleton, wherein the polymer has a property such that a film of the polymer that is formed by a coating method using a solution of the polymer satisfies $nz(P) > nx(P) \geq ny(P)$, wherein $nx(P)$ is a refractive index in a direction which, among in-plane directions of the film, gives a maximum refractive index, $ny(P)$ is a refractive index in a direction which is perpendicular to the direction of $nx(P)$ among the in-plane directions of the film, and $nz(P)$ a
(Continued)

refractive index in a thickness direction of the film, and the compound having a mesogen skeleton shows an in-plane retardation with reverse wavelength distribution under specific conditions.

25 Claims, 2 Drawing Sheets

(51) Int. Cl.
| | |
|---|---|
| H01L 51/52 | (2006.01) |
| C09K 19/20 | (2006.01) |
| C09K 19/54 | (2006.01) |
| G02F 1/13363 | (2006.01) |
| C09K 19/38 | (2006.01) |
| H01L 51/50 | (2006.01) |
| H05B 33/02 | (2006.01) |
| C09K 19/30 | (2006.01) |
| B32B 7/02 | (2019.01) |
| C09K 19/34 | (2006.01) |
| C09K 19/24 | (2006.01) |
| G02F 1/137 | (2006.01) |

(52) U.S. Cl.
CPC .............. *C09K 19/24* (2013.01); *C09K 19/30* (2013.01); *C09K 19/3001* (2013.01); *C09K 19/34* (2013.01); *C09K 19/3497* (2013.01); *C09K 19/38* (2013.01); *C09K 19/3838* (2013.01); *C09K 19/3852* (2013.01); *C09K 19/54* (2013.01); *G02B 5/30* (2013.01); *G02F 1/137* (2013.01); *G02F 1/1335* (2013.01); *G02F 1/13363* (2013.01); *G02F 1/133528* (2013.01); *G02F 1/133634* (2013.01); *H01L 51/50* (2013.01); *H01L 51/5281* (2013.01); *H05B 33/02* (2013.01); *C09K 2219/03* (2013.01); *G02F 2001/13706* (2013.01); *G02F 2001/133541* (2013.01); *G02F 2001/133562* (2013.01); *G02F 2001/133633* (2013.01); *G02F 2001/133637* (2013.01); *G02F 2001/133638* (2013.01)

(58) Field of Classification Search
CPC .... G02B 27/28; G02B 5/3058; G02B 27/281; G02B 5/3016; G02B 5/3041; G02B 1/02; G02B 5/1809; G02B 5/3075; G02B 21/0092; G02B 1/06; G02B 1/115; G02B 26/105; G02B 27/283; G02B 27/288; G02B 27/48; G02B 30/27; G02B 5/00; G02B 5/30; G02B 5/3066; G02B 5/32; G02B 6/305; G02B 6/32; G02B 6/34; G02B 6/4208; G02B 6/4214; G02B 6/43; G02B 13/001; G02B 13/0045; G02B 13/143; G02B 17/08; G02B 17/0892; G02B 19/0028; G02B 19/0033; G02B 1/041; G02B 1/10; G02B 1/11; G02B 1/12; G02B 1/14; G02B 21/0016; G02B 21/0032; G02B 21/0056; G02B 21/0068; G02B 21/14; G02B 2207/117; G02B 23/00; G02B 23/12; G02B 26/001; G02B 26/008; G02B 27/0025; G02B 27/0927; G02B 27/095; G02B 27/0977; G02B 27/0988; G02B 27/1006; G02B 27/1033; G02B 27/108; G02B 27/141; G02B 27/285; G02B 27/60; G02B 27/642; G02B 3/0056; G02B 5/003; G02B 5/008; G02B 5/0252; G02B 5/0263; G02B 5/0278; G02B 5/04; G02B 5/18; G02B 5/201; G02B 5/28; G02B 5/284; G02B 5/285; G02B 5/288; G02B 5/3008; G02B 5/3033; G02B 5/305; G02B 6/2713; G02B 6/272; G02B 6/2726; G02B 6/276; G02B 6/2766; G02B 6/4246; G02B 7/008; G02B 9/34; B32B 2250/05; B32B 2250/244; B32B 2250/42; B32B 2305/55; B32B 2307/418; B32B 2307/42; B32B 2307/516; B32B 2310/0831; B32B 2333/04; B32B 2457/202; B32B 2551/00; B32B 27/08; B32B 27/36; B32B 37/182; B32B 38/0008; B32B 7/02; C09K 19/04; C09K 19/0403; C09K 19/3809; C09K 2019/0407; C09K 2019/0414; H01L 27/3232; H01L 31/02366; H01L 31/048; H01L 51/5281

USPC ........................................................ 359/489
See application file for complete search history.

(56) References Cited

U.S. PATENT DOCUMENTS

| | | |
|---|---|---|
| 8,722,842 B2 | 5/2014 | Iida et al. |
| 2005/0237440 A1 | 10/2005 | Sugimura et al. |
| 2010/0245744 A1 | 9/2010 | Yoshida et al. |
| 2014/0116292 A1 | 5/2014 | Kim et al. |
| 2014/0116293 A1 | 5/2014 | Kim et al. |
| 2015/0041051 A1 | 2/2015 | Kobayashi |
| 2015/0079380 A1 | 3/2015 | Muramatsu et al. |

FOREIGN PATENT DOCUMENTS

| | | |
|---|---|---|
| JP | H09127885 A | 5/1997 |
| JP | 2002321302 A | 11/2002 |
| JP | 2008268336 A | 11/2008 |
| JP | 2010020269 A | 1/2010 |
| JP | 2010195858 A | 9/2010 |
| JP | 2010235878 A | 10/2010 |
| JP | 2010254949 A | 11/2010 |
| JP | 2014513323 A | 5/2014 |
| JP | 2014123134 A | 7/2014 |
| JP | 2014520192 A | 8/2014 |
| JP | 2014520288 A | 8/2014 |
| JP | 2015014712 A | 1/2015 |
| JP | 2015057646 A | 3/2015 |
| WO | 2007024463 A1 | 3/2007 |
| WO | 2012139698 A1 | 10/2012 |

OTHER PUBLICATIONS

Oct. 2, 2018, International Preliminary Report on Patentability issued in the International Patent Application No. PCT/JP2017/012486.

OPTICALLY ANISOTROPIC LAYER AND PRODUCTION METHOD THEREFOR, OPTICALLY ANISOTROPIC LAMINATE AND PRODUCTION METHOD THEREFOR, OPTICALLY ANISOTROPIC TRANSFER BODY, POLARIZATION PLATE, AND IMAGE DISPLAY DEVICE

FIELD

The present invention relates to an optically anisotropic layer and a method for producing the same; an optically anisotropic layered body including the optically anisotropic layer and a method for producing the same; and an optically anisotropic transfer body, a polarizing plate, and an image display device each including the optically anisotropic layer.

BACKGROUND

Image display devices such as a liquid crystal display device and an organic electroluminescent display device are provided with various optical films.

Hereinafter, "organic electroluminescent" may be appropriately referred to as "organic EL". Techniques involved in such optical films have been investigated in prior art as described in Patent Literatures 1 to 10.

CITATION LIST

Patent Literature

Patent Literature 1: Japanese Patent Application Laid-Open No. 2015-14712 A
Patent Literature 2: Japanese Patent Application Laid-Open No. 2015-57646 A
Patent Literature 3: Japanese Patent Application Laid-Open No. 2014-513323 A
Patent Literature 4: Japanese Patent Application Laid-Open No. 2014-520192 A
Patent Literature 5: Japanese Patent Application Laid-Open No. 2014-520288 A
Patent Literature 6: Japanese Patent Application Laid-Open No. 2010-20269 A
Patent Literature 7: Japanese Patent Application Laid-Open No. 2010-195858 A
Patent Literature 8: Japanese Patent Application Laid-Open No. 2010-235878 A
Patent Literature 9: Japanese Patent Application Laid-Open No. 2010-254949 A
Patent Literature 10: Japanese Patent Application Laid-Open No. 2008-268336 A

SUMMARY

Technical Problem

An image display device may be provided with a circularly polarizing plate on its display surface. The term "circularly polarizing plate" herein includes not only a narrowly-defined circularly polarizing plate but also an elliptically polarizing plate. As the circularly polarizing plate, an optical film including a linear polarizer and an optically anisotropic layer is usually used. Regarding the cases wherein the display surface is viewed in a front direction, provision of the circularly polarizing plate to the display surface of the image display device can realize suppression of external light reflection, and also realize passage of light for displaying the image through polarized sunglasses. Therefore, the visibility of the image can be enhanced.

However, regarding the cases wherein the display surface is viewed in a tilt direction, it is difficult to suppress reflection of external light, and to allow the image displaying light to pass through polarized sunglasses by mere provision of a common circularly polarizing plate in prior art to the display surface of the image display device.

In the light of the above, it is conceivable to provide a positive C film to the circularly polarizing plate. The positive C film is a film in which refractive indices nx, ny, and nz satisfy nz>nx≥ny. By the provision of the positive C film to the circularly polarizing plate, suppression of external light reflection and passage of image displaying light through polarized sunglasses can be achieved even when the display surface is viewed in a tilt direction.

It is preferable that the aforementioned positive C film is a film whose thickness direction retardation Rth exhibits reverse wavelength distribution. Herein, the thickness direction retardation Rth exhibiting reverse wavelength distribution is that thickness direction retardations Rth(450) and Rth(550) at wavelengths of 450 nm and 550 nm, respectively, satisfy Rth(450)/Rth(550)<1.00. When such a positive C film whose thickness direction retardation Rth exhibits its reverse wavelength distribution is provided to the circularly polarizing plate, suppression of external light reflection and passage of image displaying light through the polarized sunglasses can be achieved in a wide wavelength range even when the display surface is viewed in a tilt direction. Accordingly, visibility of the image displayed on the display surface can be especially effectively improved.

In the prior art technique, production of the positive C film whose thickness direction retardation Rth exhibits reverse wavelength distribution is difficult. For example, a production method using a liquid crystal compound is conceivable as described in Patent Literatures 1 and 2. However, in a method using an orientation film as described in Patent Literatures 1 and 2, adjustment of compatibility between the orientation film and the liquid crystal compound is required, and the adjustment is complicated. Further, a step of applying the orientation film on a substrate is added. Therefore, use of the orientation film may lead to an increase in cost.

The present invention has been made in view of the foregoing problems. An object of the present invention is to provide an optically anisotropic layer that can be produced without using an orientation film and used as a positive C plate whose thickness direction retardation Rth exhibits reverse wavelength distribution and a method for producing the same; an optically anisotropic layered body including the optically anisotropic layer and a method for producing the same; and an optically anisotropic transfer body, a polarizing plate, and an image display device that include the optically anisotropic layer.

Solution to Problem

The present invention is as follows:
<1> An optically anisotropic layer comprising a polymer and a compound having a mesogen skeleton whose orientation state is optionally fixed, wherein
the polymer has a property such that a film of the polymer that is formed by a coating method using a solution of the polymer satisfies nz(P)>nx(P)≥ny(P), wherein nx(P) is a refractive index in a direction which, among in-plane directions of the film, gives a maximum refractive index, ny(P) is a refractive index in a direction which is perpendicular to the direction of nx(P) among the in-plane directions of the film, and nz(P) a refractive index in a thickness direction of the film, the compound having a mesogen skeleton is at least one selected from the group consisting of a first compound that exhibits liquid crystal property and also exhibits, when homogeneously oriented, an in-plane retardation with reverse wavelength distribution; and a second compound that does not solely exhibit liquid crystal property, the second compound has a property such that a mixture of the second compound with an evaluator liquid crystal compound exhibits liquid crystal property, and, in a case where the mixture is homogeneously oriented, the second compound exhibits an in-plane retardation with reverse wavelength distribution, wherein the evaluator liquid crystal compound is a compound that exhibits an in-plane retardation with forward wavelength distribution in a case where the compound is homogeneously orientated, and wherein the mixture is a mixture obtained by mixing the second compound with the evaluator liquid crystal compound at at least any one ratio in a range of the second compound being 30 parts by weight to 70 parts by weight relative to 100 parts by weight of a total of the evaluator liquid crystal compound and the second compound, a refractive index nx(A) in a direction which, among in-plane directions of the optically anisotropic layer, gives a maximum refractive index, a refractive index ny(A) in a direction which is perpendicular to the direction of nx(A) among the in-plane directions of the optically anisotropic layer, and a refractive index nz(A) in a thickness direction of the optically anisotropic layer satisfy nz(A)>nx(A)≥ny(A), and a thickness direction retardation Rth(A450) of the optically anisotropic layer at a wavelength of 450 nm, a thickness direction retardation Rth(A550) of the optically anisotropic layer at a wavelength of 550 nm, and a thickness direction retardation Rth(A650) of the optically anisotropic layer at a wavelength of 650 nm satisfy the following expressions (1) and (2):

$$0.50 < Rth(A450)/Rth(A550) < 1.00 \quad (1), \text{ and}$$

$$1.00 \leq Rth(A650)/Rth(A550) < 1.25 \quad (2).$$

<2> The optically anisotropic layer according to <1>, wherein the compound having the mesogen skeleton includes a main chain mesogen skeleton and a side chain mesogen skeleton bonded to the main chain mesogen skeleton in a molecule of the compound having the mesogen skeleton.

<3> The optically anisotropic layer according to <1> or <2>, wherein the compound having the mesogen skeleton is represented by the following Formula (I):

—O—C(=O)—O—, —NR$^1$—C(=O)—, —C(=O)—NR$^1$—, —O—C(=O)—NR$^1$—, —NR$^1$—C(=O)—O—, —NR$^1$—C(=O)—NR$^1$—, —O—NR$^1$—, or —NR$^1$—O—, wherein R$^1$ is a hydrogen atom or an alkyl group of 1 to 6 carbon atoms;

G$^1$ and G$^2$ are each independently a divalent aliphatic group of 1 to 20 carbon atoms optionally having a substituent; the aliphatic groups may have one or more per one aliphatic group of —O—, —S—, —O—C(=O)—, —C(=O)—O—, —O—C(=O)—O—, —NR$^2$—C(=O)—, —C(=O)—NR$^2$—, —NR$^2$—, or —C(=O)— inserted therein; with a proviso that cases where two or more of each of —O— or —S— groups are adjacently inserted are excluded, wherein R$^2$ is a hydrogen atom or an alkyl group of 1 to 6 carbon atoms;

Z$^1$ and Z$^2$ are each independently an alkenyl group of 2 to 10 carbon atoms optionally being substituted by a halogen atom;

A$^x$ is an organic group of 2 to 30 carbon atoms having at least one aromatic ring selected from the group consisting of an aromatic hydrocarbon ring and an aromatic heterocyclic ring;

A$^y$ is a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R$^3$, —SO$_2$—R$^4$, —C(=S)NH—R$^9$, or an organic group of 2 to 30 carbon atoms having at least one aromatic ring selected from the group consisting of an aromatic hydrocarbon ring and an aromatic heterocyclic ring, wherein R$^3$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms; R$^4$ is an alkyl group of 1 to 20 carbon atoms, an alkenyl group of 2 to 20 carbon atoms, a phenyl group, or a 4-methylphenyl group; R$^9$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent; the aromatic ring that A$^x$ and A$^y$ have may have a substituent; and A$^x$ and A$^y$ may form a ring together;

A$^1$ is a trivalent aromatic group optionally having a substituent;

A$^2$ and A$^3$ are each independently a divalent alicyclic hydrocarbon group of 3 to 30 carbon atoms optionally having a substituent;

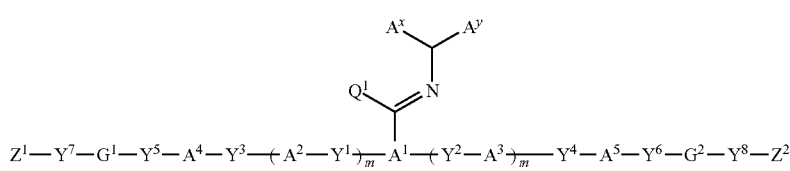

(I)

(in the Formula (I),

Y$^1$ to Y$^8$ are each independently a chemical single bond, —O—, —S—, —O—C(=O)—, —C(=O)—O—, A$^4$ and A$^5$ are each independently a divalent aromatic group of 6 to 30 carbon atoms optionally having a substituent;

Q¹ is a hydrogen atom or an alkyl group of 1 to 6 carbon atoms optionally having a substituent; and m is each independently 0 or 1).

<4> The optically anisotropic layer according to any one of <1> to <3>, wherein the compound having a mesogen skeleton contains at least one selected from the group consisting of a benzothiazole ring, and a combination of a cyclohexyl ring and a phenyl ring in the molecule of the compound having a mesogen skeleton.

<5> The optically anisotropic layer according to any one of <1> to <4>, wherein the polymer is at least one polymer selected from the group consisting of polyvinyl carbazole, a polyfumaric acid ester, and a cellulose derivative.

<6> The optically anisotropic layer according to any one of <1> to <5>, wherein a ratio of the compound having a mesogen skeleton in a total solid content of the optically anisotropic layer is 20% by weight to 60% by weight.

<7> The optically anisotropic layer according to any one of <1> to <6>, wherein an in-plane retardation Re(A590) of the optically anisotropic layer at a wavelength of 590 nm and a thickness direction retardation Rth(A590) of the optically anisotropic layer at a wavelength of 590 nm satisfy the following formulae (3) and (4):

$$Re(A590) \leq 10 \text{ nm} \quad (3), \text{ and}$$

$$-200 \text{ nm} \leq Rth(A590) \leq -10 \text{ nm} \quad (4).$$

<8> An optically anisotropic transfer body comprising a substrate and the optically anisotropic layer according to any one of <1> to <7>.

<9> An optically anisotropic layered body comprising the optically anisotropic layer according to any one of <1> to <7> and a phase difference layer, wherein a refractive index nx(B) in a direction which, among in-plane directions of the phase difference layer, gives a maximum refractive index, a refractive index ny(B) in a direction which is perpendicular to the direction of nx(B) among the in-plane directions of the phase difference layer, and a refractive index nz(B) in a thickness direction of the phase difference layer satisfy nx(B)>ny(B)≥nz(B).

<10> The optically anisotropic layered body according to <9>, wherein the phase difference layer is a stretched film containing an alicyclic structure-containing polymer.

<11> The optically anisotropic layered body according to <10>, wherein the phase difference layer is an obliquely stretched film.

<12> The optically anisotropic layered body according to any one of <9> to <11>, wherein the phase difference layer is a stretched film having a multilayer structure.

<13> The optically anisotropic layered body according to <9>, wherein an in-plane retardation Re(B450) of the phase difference layer at a wavelength of 450 nm, an in-plane retardation Re(B550) of the phase difference layer at a wavelength of 550 nm, and an in-plane retardation Re(B650) of the phase difference layer at a wavelength of 650 nm satisfy the following formulae (5) and (6):

$$0.75 < Re(B450)/Re(B550) < 1.00 \quad (5), \text{ and}$$

$$1.01 < Re(B650)/Re(B550) < 1.25 \quad (6).$$

<14> The optically anisotropic layered body according to <9> or <13>, wherein the phase difference layer contains a liquid crystal compound for a phase difference layer whose orientation state is optionally fixed, the liquid crystal compound being represented by the following Formula (II):

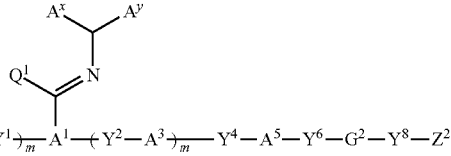

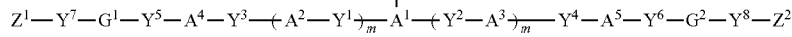

(in the Formula (II), $Y^1$ to $Y^8$ are each independently a chemical single bond, —O—, —S—, —O—C(=O)—, —C(=O)—O—, —O—C(=O)—O—, —NR¹—C(=O)—, —C(=O)—NR¹—, —O—C(=O)—NR¹—, —NR¹—C(=O)—O—, —NR¹—C(=O)—NR¹—, —O—NR¹—, or —NR¹—O—, wherein R¹ is a hydrogen atom or an alkyl group of 1 to 6 carbon atoms;

$G^1$ and $G^2$ are each independently a divalent aliphatic group of 1 to 20 carbon atoms optionally having a substituent; the aliphatic groups may have one or more per one aliphatic group of —O—, —S—, —O—C(=O)—, —C(=O)—O—, —O—C(=O)—O—, —NR²—C (=O)—, —C(=O)—NR²—, —NR²—, or —C(=O)— inserted therein; with a proviso that cases where two or more of each of —O— or —S— groups are adjacently inserted are excluded, wherein R² is a hydrogen atom or an alkyl group of 1 to 6 carbon atoms;

$Z^1$ and $Z^2$ are each independently an alkenyl group of 2 to 10 carbon atoms optionally being substituted by a halogen atom;

$A^x$ is an organic group of 2 to 30 carbon atoms having at least one aromatic ring selected from the group consisting of an aromatic hydrocarbon ring and an aromatic heterocyclic ring;

$A^y$ is a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R³, —SO₂—R⁴, —C(=S)NH—R⁹, or an organic group of 2 to 30 carbon atoms having at least one aromatic ring selected from the group consisting of an aromatic hydrocarbon ring and an aromatic heterocyclic ring, wherein R³ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms; R⁴ is an alkyl group of 1 to 20 carbon atoms, an alkenyl group of 2 to 20 carbon atoms, a phenyl group, or a 4-methylphenyl group; R⁹ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent; the aromatic ring that $A^x$ and $A^y$ have may have a substituent; and $A^x$ and $A^y$ may form a ring together;

$A^1$ is a trivalent aromatic group optionally having a substituent;

$A^2$ and $A^3$ are each independently a divalent alicyclic hydrocarbon group of 3 to 30 carbon atoms optionally having a substituent;

$A^4$ and $A^5$ are each independently a divalent aromatic group of 6 to 30 carbon atoms optionally having a substituent;

$Q^1$ is a hydrogen atom or an alkyl group of 1 to 6 carbon atoms optionally having a substituent; and m is each independently 0 or 1).

<15> The optically anisotropic layered body according to any one of <9> to <14>, wherein an in-plane retardation Re(B590) of the phase difference layer at a wavelength of 590 nm, an in-plane retardation Re(A590) of the optically anisotropic layer at a wavelength of 590 nm, and a thickness direction retardation Rth(A590) of the optically anisotropic layer at a wavelength of 590 nm satisfy the following formulae (7), (8), and (9):

$$110 \text{ nm} \leq Re(B590) \leq 170 \text{ nm} \quad (7),$$

$$Re(A590) \leq 10 \text{ nm} \quad (8), \text{ and}$$

$$-110 \text{ nm} \leq Rth(A590) \leq -20 \text{ nm} \quad (9).$$

<16> A polarizing plate comprising:
a linear polarizer; and
the optically anisotropic layer according to any one of <1> to <7>, the optically anisotropic transfer body according to <8>, or the optically anisotropic layered body according to any one of <9> to <15>.

<17> An image display device comprising the polarizing plate according to <16>.

<18> An image display device comprising:
the optically anisotropic layered body according to any one of <9> to <15>;
a linear polarizer; and
an image display element, which are included in this order, wherein
the image display element is a liquid crystal cell or an organic electroluminescent element.

<19> An image display device comprising:
a linear polarizer;
the optically anisotropic layered body according to any one of <9> to <15>; and
an organic electroluminescent element, which are included in this order.

<20> A method for producing an optically anisotropic layer comprising the steps of:
applying a coating liquid containing a polymer, a compound having a mesogen skeleton, and a solvent onto a support surface to obtain a coating liquid layer; and
drying the coating liquid layer,
the polymer has a property such that a film of the polymer that is formed by a coating method using a solution of the polymer satisfies $nz(P) > nx(P) \geq ny(P)$, wherein $nx(P)$ is a refractive index in a direction which, among in-plane directions of the film, gives a maximum refractive index, $ny(P)$ is a refractive index in a direction which is perpendicular to the direction of $nx(P)$ among the in-plane directions of the film, and $nz(P)$ a refractive index in a thickness direction of the film,
the compound having a mesogen skeleton is at least one selected from the group consisting of a first compound that exhibits liquid crystal property and also exhibits, when homogeneously oriented, an in-plane retardation with reverse wavelength distribution; and a second compound that does not solely exhibit liquid crystal property, the second compound has a property such that a mixture of the second compound with an evaluator liquid crystal compound exhibits liquid crystal property, and, in a case where the mixture is homogeneously oriented, the second compound exhibits an in-plane retardation with reverse wavelength distribution, wherein the evaluator liquid crystal compound is a compound that exhibits an in-plane retardation with forward wavelength distribution in a case where the compound is homogeneously orientated, and wherein the mixture is a mixture obtained by mixing the second compound with the evaluator liquid crystal compound at at least any one ratio in a range of the second compound being 30 parts by weight to 70 parts by weight relative to 100 parts by weight of a total of the evaluator liquid crystal compound and the second compound, a refractive index $nx(A)$ in a direction which, among in-plane directions of the optically anisotropic layer, gives a maximum refractive index, a refractive index $ny(A)$ in a direction which is perpendicular to the direction of $nx(A)$ among the in-plane directions of the optically anisotropic layer, and a refractive index $nz(A)$ in a thickness direction of the optically anisotropic layer satisfy $nz(A) > nx(A) \geq ny(A)$, and a thickness direction retardation $Rth(A450)$ of the optically anisotropic layer at a wavelength of 450 nm, a thickness direction retardation $Rth(A550)$ of the optically anisotropic layer at a wavelength of 550 nm, and a thickness direction retardation $Rth(A650)$ of the optically anisotropic layer at a wavelength of 650 nm satisfy the following expressions (1) and (2):

$$0.50 < Rth(A450)/Rth(A550) < 1.00 \quad (1), \text{ and}$$

$$1.00 \leq Rth(A650)/Rth(A550) < 1.25 \quad (2).$$

<21> A method for producing an optically anisotropic layered body comprising the steps of:
bonding the optically anisotropic layer of the optically anisotropic transfer body according to <8> to a phase difference layer; and
peeling the substrate of the optically anisotropic transfer body,
wherein a refractive index $nx(B)$ in a direction which, among in-plane directions of the phase difference layer, gives a maximum refractive index, a refractive index $ny(B)$ in a direction which is perpendicular to the direction of $nx(B)$ among the in-plane directions of the phase difference layer, and a refractive index $nz(B)$ in a thickness direction of the phase difference layer satisfy $nx(B) > ny(B) \geq nz(B)$.

Advantageous Effects of Invention

According to the present invention, there can be provided an optically anisotropic layer that can be produced without using an orientation film and used as a positive C plate whose thickness direction retardation Rth exhibits reverse wavelength distribution and a method for producing the same; an optically anisotropic layered body including the optically anisotropic layer and a method for producing the same; and an optically anisotropic transfer body, a polarizing plate, and an image display device that include the optically anisotropic layer.

DESCRIPTION OF EMBODIMENTS

Figure 1:
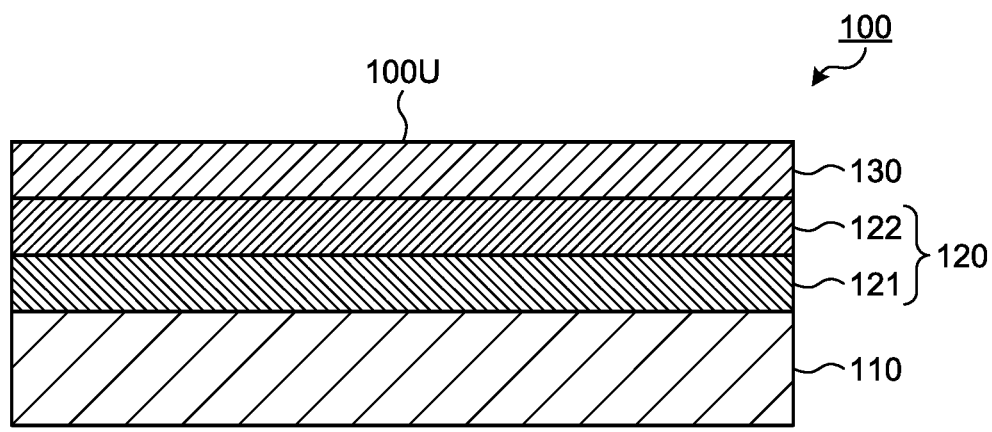
FIG. 1 is a cross-sectional view schematically illustrating an organic EL display device as an image display device according to a first embodiment of the present invention.

Hereinafter, the present invention will be described in detail with reference to examples and embodiments. However, the present invention is not limited to the following examples and embodiments and may be freely modified for implementation without departing from the scope of claims of the present invention and the scope of their equivalents.

In the following description, a front direction of a surface means a normal direction of the surface unless otherwise specified. The front direction specifically represents a direction of polar angle of 0° and azimuth angle of 0° of the surface.

In the following description, a tilt direction of a surface means a direction that is not parallel to or perpendicular to the surface unless otherwise specified. The tilt direction specifically represents a direction within a range of polar angle of the surface of larger than 0° and less than 90°.

In the following description, an in-plane retardation Re of a certain layer is a value represented by Re=(nx−ny)×d, and a thickness direction retardation Rth of a certain layer is a value represented by Rth=[((nx+ny)/2)−nz]×d, unless otherwise specified. Herein, nx represents a refractive index in a direction which, among in-plane directions of the layer, gives the maximum refractive index. ny represents a refractive index in a direction that is perpendicular to the direction of nx among the in-plane directions of the layer. nz represents a refractive index in a thickness direction of the layer. d represents a thickness of the layer. The in-plane directions represent directions that are perpendicular to the thickness direction.

In the following description, the measurement wavelength of the refractive indices is 590 nm, unless otherwise specified.

In the following description, a "long-length" entity refers to an entity with the length that is 5 times or more the width, and preferably an entity with the length that is 10 times or more the width, and specifically refers to an entity having a length that allows a film to be wound up into a rolled shape for storage or transportation.

In the following description, "polarizing plate" and "wave plate" encompass not only a rigid member, but also a flexible member such as a resin film, unless otherwise specified.

In the following description, "(meth)acryl-" is a term encompassing "acryl-", "methacryl-" and a combination thereof, unless otherwise specified.

In the following description, a direction of an element being "parallel" and "perpendicular" may allow an error within the range of not impairing the advantageous effects of the present invention, for example, within a range of ±5°, unless otherwise specified.

In the following description, a resin having a positive intrinsic birefringence value means a resin of which the refractive index in a stretching direction becomes larger than the refractive index in a direction orthogonal to the stretching direction. A resin having a negative intrinsic birefringence value means a resin of which the refractive index in the stretching direction becomes smaller than the refractive index in the direction orthogonal to the stretching direction.

The intrinsic birefringence value may be calculated from dielectric constant distribution.

[1. Optically Anisotropic Layer]

The optically anisotropic layer of the present invention includes a specific polymer and a specific compound having a mesogen skeleton, and has specific optical properties. Hereinafter, the aforementioned polymer contained in the optically anisotropic layer may be appropriately referred to as "positive C polymer". Hereinafter, the compound having a mesogen skeleton contained in the optically anisotropic layer may be appropriately referred to as "mesogen compound".

[1.1. Positive C Polymer]

The positive C polymer is a polymer having a property such that, when a film of the positive C polymer is formed by a coating method using a solution of the positive C polymer, refractive indices $nx(P)$, $ny(P)$, and $nz(P)$ of the film satisfy $nz(P) > nx(P) \geq ny(P)$. Herein, $nx(P)$ represents a refractive index in a direction which, among in-plane directions of the film, gives the maximum refractive index, $ny(P)$ represents a refractive index in a direction which is perpendicular to the direction of $nx(P)$ among the in-plane directions of the film, and $nz(P)$ represents a refractive index in a thickness direction of the film. When such a positive C polymer is used in combination with the specific mesogen compound, an optically anisotropic layer that can be produced without using an orientation film and can be used as a positive C polymer in which the thickness direction retardation Rth exhibits reverse wavelength distribution can be realized.

Whether or not a certain polymer is the positive C polymer may be confirmed by the following method.

A polymer as a sample is first added to a solvent such as methyl ethyl ketone (MEK), 1,3-dioxolane, and N-methylpyrrolidone (NMP) so that the concentration of the polymer is 10% by weight to 20% by weight, and is dissolved in the solvent at room temperature, to thereby obtain a polymer solution.

The polymer solution is applied onto an unstretched film formed of a resin by an applicator, to form a layer of the polymer solution. Subsequently, the layer is dried in an oven of 85° C. for about 10 minutes, to evaporate the solvent. As a result, a polymer film having a thickness of about 10 μm is obtained.

Whether or not the refractive indices $nx(P)$, $ny(P)$, and $nz(P)$ of the polymer film satisfy $nz(P) > nx(P) \geq ny(P)$ is evaluated. When they satisfy, the polymer as the sample can be judged as being the positive C polymer.

In particular, the values of the aforementioned refractive indices $nx(P)$ and $ny(P)$ are preferably the same as each other or close to each other. Specifically, the difference $nx(P)−ny(P)$ between the refractive indices $nx(P)$ and $ny(P)$ is preferably 0.00000 to 0.00100, more preferably 0.00000 to 0.00050, and particularly preferably 0.00000 to 0.00020. When the refractive index difference $nx(P)−ny(P)$ falls within the aforementioned range, the optically anisotropic layer of the present invention can be easily obtained.

As the positive C polymer, any optional polymer having refractive indices satisfying the aforementioned expression $nz(P) > nx(P) \geq ny(P)$ may be used. It is particularly preferable that the positive C polymer is at least one polymer selected from the group consisting of polyvinyl carbazole, a polyfumaric acid ester, and a cellulose derivative. When the polymer is used as the positive C polymer, an optically anisotropic layer having a large thickness direction retardation Rth can be easily obtained by coating.

Specific examples of the positive C polymer may include poly(9-vinyl carbazole); a copolymer of diisopropyl fumarate with 3-ethyl-3-oxetanylmethyl acrylate; and a copolymer of diisopropyl fumarate with a cinnamic acid ester.

As the positive C polymer, one type thereof may be solely used, and two or more types thereof may also be used in combination at any ratio.

The ratio of the positive C polymer in the total solid content of the optically anisotropic layer is preferably 40% by weight or more, more preferably 45% by weight or more, further preferably 50% by weight or more, and particularly preferably 55% by weight or more, and is preferably 80% by weight or less, more preferably 70% by weight or less, further preferably 65% by weight or less, and particularly preferably 60% by weight or less. When the ratio of the positive C polymer is equal to or more than the lower limit value of the aforementioned range, the mesogen compound can be uniformly dispersed in the optically anisotropic layer, and the mechanical strength of the optically anisotropic layer can be enhanced. When the ratio is equal to or less than the upper limit value of the aforementioned range, the wavelength distribution of the thickness direction retardation Rth of the optically anisotropic layer can be easily made closer to reverse distribution. Herein, a solid content of a certain layer refers to a component that remains after drying the layer.

[1.2. Mesogen Compound]

The mesogen compound is a compound having a mesogen skeleton. Herein, the mesogen skeleton means a molecular skeleton that essentially contributes to generation of a liquid crystal (LC: liquid-crystalline) phase in a substance having a low molecular weight or a high molecular weight due to the anisotropy of attractive and repulsive interactions thereof. The mesogen compound having a mesogen skeleton may not necessarily by itself have liquid crystal property that may cause phase transition to the liquid crystal phase. The mesogen compound may therefore be a liquid crystal compound that may solely cause phase transition to the liquid crystal phase, and may also be a non-liquid crystal compound that does not solely cause phase transition to the liquid crystal phase. Examples of the mesogen skeleton may include rigid rod-shaped and disk-shaped units. For the mesogen skeleton, Pure Appl. Chem. 2001, vol. 73 (No. 5), p. 888, and C. Tschierske, G. Pelzl, S. Diele, Angew. Chem., 2004, vol. 116, pp. 6340 to 6368 may be referred to.

In the optically anisotropic layer, an orientation state of the mesogen compound may be fixed. For example, the orientation state of the mesogen compound may be fixed by polymerization. Usually the mesogen compound may form a polymer by polymerization with the orientation state of the mesogen compound maintained. Therefore, the orientation state of the mesogen compound is fixed by the aforementioned polymerization. Therefore, the term "mesogen compound whose orientation state is fixed" encompasses a polymer of the mesogen compound. Accordingly, when the mesogen compound is a liquid crystal compound having liquid crystal property, this liquid crystal compound may exhibit a liquid crystal phase in the optically anisotropic layer, or may not exhibit a liquid crystal phase by having the orientation state being fixed.

As the specific mesogen compound, at least one compound selected from the group consisting of a liquid crystal compound with reverse wavelength distribution as a first compound and a mesogen compound with reverse wavelength distribution as a second compound is used.

Herein, the liquid crystal compound with reverse wavelength distribution means a compound that satisfies all of the following requirements (i) and (ii).

(i) The liquid crystal compound with reverse wavelength distribution exhibits liquid crystal property.

(ii) The liquid crystal compound with reverse wavelength distribution exhibits an in-plane retardation with reverse wavelength distribution when the liquid crystal compound with reverse wavelength distribution is homogeneously oriented.

The mesogen compound with reverse wavelength distribution means a compound that satisfies all of the following requirements (iii), (iv), and (v).

(iii) The mesogen compound with reverse wavelength distribution does not solely exhibit liquid crystal property.

(iv) A specific evaluation mixture containing the mesogen compound with reverse wavelength distribution exhibits liquid crystal property.

(v) When the evaluation mixture is homogeneously oriented, the mesogen compound with reverse wavelength distribution exhibits an in-plane retardation with reverse wavelength distribution.

The evaluation mixture is a mixture obtained by mixing in an evaluator liquid crystal compound the mesogen compound with reverse wavelength distribution at at least any ratio in a range of the the mesogen compound with reverse wavelength distribution being 30 parts by weight to 70 parts by weight relative to 100 parts by weight of the total of the evaluator liquid crystal compound and the mesogen compound with reverse wavelength distribution, wherein the evaluator liquid crystal compound is a compound that exhibits an in-plane retardation with forward wavelength distribution during homogeneous orientation.

When such a mesogen compound selected from the group consisting of the liquid crystal compound with reverse wavelength distribution and the mesogen compound with reverse wavelength distribution is used in combination with the positive C polymer, an optically anisotropic layer that can be produced without using an orientation film and can be used as a positive C polymer in which the thickness direction retardation Rth exhibits reverse wavelength distribution can be realized.

Hereinafter, the liquid crystal compound with reverse wavelength distribution will be described.

When the liquid crystal compound with reverse wavelength distribution is homogeneously oriented, the liquid crystal compound with reverse wavelength distribution exhibits an in-plane retardation with reverse wavelength distribution. Herein, that the liquid crystal compound is homogeneously oriented means that a layer containing the liquid crystal compound is formed, and a long-axis direction of the mesogen skeleton of the molecule of the liquid crystal compound in the layer is oriented in a direction parallel to the plane of the layer. When the liquid crystal compound contains a plurality of mesogen skeletons having different orientation directions, a direction in which the longest type of the mesogen among the mesogens is oriented is the aforementioned orientation direction. Whether or not the liquid crystal compound is homogeneously oriented and the orientation direction thereof may be confirmed by measurement of slow axis direction using a phase difference meter typified by AxoScan (manufactured by Axometrics, Inc.) and measurement of retardation distribution of each incidence angle in the slow axis direction.

That the in-plane retardation Re exhibits reverse wavelength distribution means that the in-plane retardations Re(450) and Re(550) at wavelengths of 450 nm and 550 nm, respectively, satisfy Re(450)/Re(550)<1.00.

Therefore, when a liquid crystal layer containing the liquid crystal compound with reverse wavelength distribution is formed and the long-axis direction of the mesogen skeleton of molecule of the liquid crystal compound in the liquid crystal layer is oriented in a certain direction parallel to the plane of the liquid crystal layer, the in-plane retardations Re(L450) and Re(L550) of the liquid crystal layer at wavelengths of 450 nm and 550 nm, respectively, usually satisfy Re(L450)/Re(L550)<1.00.

It is further preferable that the in-plane retardations Re(L450), Re(L550), and Re(L650) of the liquid crystal layer at wavelengths of 450 nm, 550 nm, and 650 nm, respectively, satisfy Re(L450)<Re(L550)≤Re(L650) from the viewpoint of further favorably exhibiting desired effects of the present invention.

As the liquid crystal compound with reverse wavelength distribution, for example, a compound having a main chain mesogen skeleton and a side chain mesogen skeleton bonded to the main chain mesogen skeleton in the molecule of the liquid crystal compound with reverse wavelength distribution may be used. While the liquid crystal compound with reverse wavelength distribution having the main chain mesogen skeleton and the side chain mesogen skeleton is oriented, the side chain mesogen skeleton may be oriented in a direction different from that of the main chain mesogen skeleton. In this case, birefringence is expressed as a difference between the refractive index corresponding to the main chain mesogen skeleton and the refractive index corresponding to the side chain mesogen skeleton. Therefore, when the liquid crystal compound with reverse wavelength distribution is homogeneously oriented, the liquid crystal compound with reverse wavelength distribution can exhibit an in-plane retardation with reverse wavelength distribution.

For example, the liquid crystal compound with reverse wavelength distribution usually has a specific steric structure that is different from the steric structure of a general liquid crystal compound with forward wavelength distribution, such as the compound having the main chain mesogen skeleton and the side chain mesogen skeleton. Herein, the "compound with forward wavelength distribution" refers to a liquid crystal compound that may exhibit an in-plane retardation with forward wavelength distribution during homogeneous orientation. The in-plane retardation with forward wavelength distribution represents an in-plane retardation that becomes smaller as the measurement wavelength is longer. It is inferable that one factor bringing about the effect of the present invention is that the reverse wavelength polymerizable liquid crystal compound has such a specific steric structure.

Further, it is preferable that the liquid crystal compound with reverse wavelength distribution has polymerizability. It is thus preferable that the liquid crystal compound with reverse wavelength distribution has a polymerizable group. When a liquid crystal compound with reverse wavelength distribution having polymerizability is used, the orientation state of the liquid crystal compound with reverse wavelength distribution can be easily fixed by polymerization. Therefore, an optically anisotropic layer having stable optical properties can be easily obtained.

The CN point of the liquid crystal compound with reverse wavelength distribution is preferably 25° C. or higher, more preferably 45° C. or higher, and particularly preferably 60° C. or higher, and is preferably 120° C. or lower, more preferably 110° C. or lower, and particularly preferably 100° C. or lower. Herein, "CN point" represents a crystal-nematic phase transition temperature. When a liquid crystal compound with reverse wavelength distribution having a CN point within the aforementioned range is used, the optically anisotropic layer can be easily produced.

When the liquid crystal compound with reverse wavelength distribution is a monomer, the molecular weight thereof is preferably 300 or more, more preferably 700 or more, and particularly preferably 1,000 or more, and is preferably 2,000 or less, more preferably 1,700 or less, and particularly preferably 1,500 or less. When the liquid crystal compound with reverse wavelength distribution has the aforementioned molecular weight, the coating property of a coating liquid for forming an optically anisotropic layer can be particularly improved.

As the liquid crystal compound with reverse wavelength distribution, one type thereof may be solely used, and two or more types thereof may also be used in combination at any ratio.

Examples of the liquid crystal compound with reverse wavelength distribution may include those described in Japanese Patent Application Laid-Open No. 2014-123134 A. Examples of the liquid crystal compound with reverse wavelength distribution may also include compounds that exhibit liquid crystal property among the compounds represented by the following formula (Ia). In the following description, the compound represented by the formula (Ia) may be appropriately referred to as "compound (Ia)".

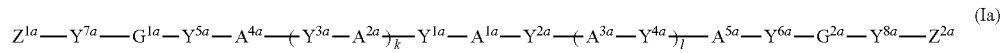

(Ia)

$$Z^{1a} - Y^{7a} - G^{1a} - Y^{5a} - A^{4a} - (Y^{3a} - A^{2a})_{\overline{k}} - Y^{1a} - A^{1a} - Y^{2a} - (A^{3a} - Y^{4a})_{\overline{l}} - A^{5a} - Y^{6a} - G^{2a} - Y^{8a} - Z^{2a}$$

In the formula (Ia) described above, $A^{1a}$ represents an aromatic hydrocarbon ring group having as a substituent an organic group of 1 to 67 carbon atoms that has at least one aromatic ring selected from the group consisting of an aromatic hydrocarbon ring and an aromatic heterocycle; or an aromatic heterocycle group having as a substituent an organic group of 1 to 67 carbon atoms that has at least one aromatic ring selected from the group consisting of an aromatic hydrocarbon ring and an aromatic heterocycle.

Specific examples of $A^{1a}$ may include a phenylene group substituted with a group represented by a formula: —R$^f$C(=N—NR$^g$R$^h$) or a formula: —R$^f$C(=N—N=R$^{f1}$R$^h$); a benzothiazol-4,7-diyl group substituted with a 1-benzofuran-2-yl group; a benzothiazol-4,7-diyl group substituted with a 5-(2-butyl)-1-benzofuran-2-yl group; a benzothiazol-4,7-diyl group substituted with a 4,6-dimethyl-1-benzofuran-2-yl group; a benzothiazol-4,7-diyl group substituted with a 6-methyl-1-benzofuran-2-yl group; a benzothiazol-4,7-diyl group substituted with a 4,6,7-trimethyl-1-benzofuran-2-yl group; a benzothiazol-4,7-diyl group substituted with a 4,5,6-trimethyl-1-benzofuran-2-yl group; a benzothiazol-4,7-diyl group substituted with a 5-methyl-1-benzofuran-2-yl group; a benzothiazol-4,7-diyl group substituted with a 5-propyl-1-benzofuran-2-yl group; a benzothiazol-4,7-diyl group substituted with a 7-propyl-1-benzofuran-2-yl group; a benzothiazol-4,7-diyl group substituted with a 5-fluoro-1-benzofuran-2-yl group; a benzothiazol-4,7-diyl group substituted with a phenyl group; a benzothiazol-4,7-diyl group substituted with a 4-fluorophenyl group; a benzothiazol-4,7-diyl group substituted with a 4-nitrophenyl group; a benzothiazol-4,7-diyl group substituted with a 4-trifluoromethylphenyl group; a benzothiazol-4,7-diyl group substituted with a 4-cyanophenyl group; a benzothiazol-4,7-diyl group substituted with a 4-methansulfonylphenyl group; a benzothiazol-4,7-diyl group substituted with a thiophen-2-yl group; a benzothiazol-4,7-diyl group substituted with a thiophen-3-yl group; a benzothiazol-4,7-diyl group substituted with a 5-methlthiophen-2-yl group; a benzothiazol-4,7-diyl group substituted with a 5-chlorothiophen-2-yl group; a benzothiazol-4,7-diyl group substituted with a thieno[3,2-b]thiophen-2-yl group; a benzothiazol-4,7-diyl group substituted with a 2-benzothiazoryl group; a benzothiazol-4,7-diyl group substituted with a 4-biphenyl group; a benzothiazol-4,7-diyl group substituted with a 4-propylbiphenyl group; a benzothiazol-4,7-diyl group substituted with a 4-thiazolyl group; a benzothiazol-4,7-diyl group substituted with a 1-phenylethylen-2-yl group; a benzothiazol-4,7-diyl group substituted with a 4-pyridyl group; a benzothiazol-4,7-diyl group substituted with a 2-furyl group; a benzothiazol-4,7-diyl group substituted with a naphtho[1,2-b]furan-2-yl group; a 1H-isoindole-1,3(2H)-dione-4,7-diyl group substituted with a 5-methoxy-2-benzothiazolyl group; a 1H-isoindole-1,3(2H)-dione-4,7-diyl group substituted with a phenyl group; a 1H-isoindole-1,3(2H)-dione-4,7-diyl group substituted with a 4-nitrophenyl group; and a 1H-isoindole-1,3(2H)-dione-4,7-diyl group substituted with a 2-thiazolyl group. Herein, $R^f$ and $R^{f1}$ are each independently represent the same meaning as that of $Q^1$ described later. $R^g$ represents the same meaning as that of $A^y$ described later. $R^h$ represents the same meaning as that of $A^x$ described later.

In the aforementioned formula (Ia), $Y^{1a}$ to $Y^{8a}$ each independently represent a chemical single bond, —O—, —S—, —O—C(=O)—, —C(=O)—O—, —O—C(=O)—O—, NR$^1$—C(=O)—, —C(=O)—NR$^1$—, —O—C(=O)—NR$^1$—, —NR$^1$—C(=O)—O—, —NR$^1$—C(=O)—NR$^1$—, —O—NR$^1$—, or —NR$^1$—O—. Herein, $R^1$ represents a hydrogen atom or an alkyl group of 1 to 6 carbon atoms.

In the aforementioned formula (Ia), $G^{1a}$ and $G^{1a}$ each independently represent a divalent aliphatic group of 1 to 20 carbon atoms optionally having a substituent. In the aliphatic group, one or more of —O—, —S—, —O—C(=O)—, —C(=O)—O—, —O—C(=O)—O—, —NR$^2$—C(=O)—, —C(=O)—NR$^2$—, —NR$^2$—, or —C(=O)— may be interposed per one aliphatic group, with a proviso that cases where 2 or more of —O— or —S— are adjacently interposed therein are excluded. Herein, $R^2$ represents a hydrogen atom or an alkyl group of 1 to 6 carbon atoms.

In the aforementioned formula (Ia), $Z^{1a}$ and $Z^{2a}$ each independently represent an alkenyl group of 2 to 20 carbon atoms optionally substituted with a halogen atom.

In the aforementioned formula (Ia), $A^{2a}$ and $A^{3a}$ each independently represent a divalent alicyclic hydrocarbon group of 3 to 30 carbon atoms optionally having a substituent.

In the aforementioned formula (Ia), $A^{4a}$ and $A^{5a}$ each independently represent a divalent aromatic group of 6 to 30 carbon atoms optionally having a substituent.

In the aforementioned formula (Ia), k and l each independently represent 0 or 1.

Specific examples of particularly preferable liquid crystal compounds with reverse wavelength distribution may include a compound having liquid crystal property among compounds represented by the following formula (I). In the following description, the compound represented by the formula (I) may be appropriately referred to as "compound (I)".

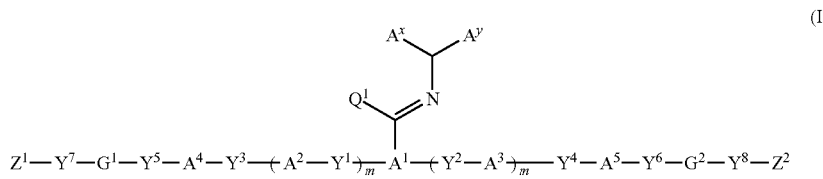

(I)

As shown in the following formula, the compound (I) usually includes two mesogen skeletons including a main chain mesogen skeleton 1a composed of a group —$Y^5$-$A^4$-($Y^3$-$A^2$)$_n$-$Y^1$-$A^1$-$Y^2$-($A^3$-$Y^4$)$_m$-$A^5$-$Y^6$— and a side chain mesogen skeleton 1b composed of a group >$A^1$-C($Q^1$)=N—N($A^x$)$A^y$. The main chain mesogen skeleton 1a and the side chain mesogen skeleton 1b cross each other. The aforementioned main chain mesogen skeleton 1a and side chain mesogen skeleton 1b may be collectively regarded as one mesogen skeleton, but in the present invention, are described as two separate mesogen skeletons.

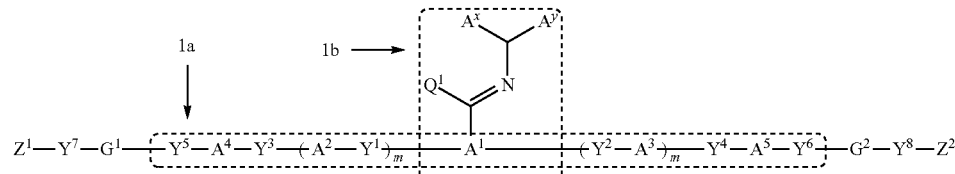

The refractive index of the main chain mesogen skeleton 1a in the long-axis direction is denoted by n1, and the refractive index of the side chain mesogen skeleton 1b in the long-axis direction is denoted by n2. In this case, the absolute value and wavelength distribution of the refractive index n1 usually depend on the molecular structure of the main chain mesogen skeleton 1a. The absolute value and wavelength distribution of the refractive index n2 usually depend on the molecular structure of the side chain mesogen skeleton 1b. Herein, the compound (I) is usually subjected to rotational motion around the long-axis direction of the main chain mesogen skeleton 1a as a rotational axis in the liquid crystal phase. Therefore, the refractive indices n1 and n2 herein represent the refractive indices of rotating bodies.

Due to the molecular structures of the main chain mesogen skeleton 1a and the side chain mesogen skeleton 1b, the absolute value of the refractive index n1 is larger than the absolute value of the refractive index n2. Further, the refractive indices n1 and n2 usually exhibit forward wavelength distribution. A refractive index with forward wavelength distribution herein means a refractive index of which the absolute value becomes smaller as the measurement wavelength is longer. The refractive index n1 of the main chain mesogen skeleton 1a exhibits small forward wavelength distribution. Therefore, although the refractive index n1 measured at a long wavelength is smaller than the refractive index measured at a short wavelength, the difference thereof is small. In contrast, the refractive index n2 of the side chain mesogen skeleton 1b exhibits large forward wavelength distribution. Therefore, the refractive index n2 measured at a long wavelength is smaller than the refractive index n2 measured at a short wavelength, and the difference thereof is large. Consequently, the difference Δn between the refractive index n1 and the refractive index n2 is small at the short measurement wavelength, and the difference Δn between the refractive index n1 and the refractive index n2 is large at the long measurement wavelength. Accordingly, when a homogeneous orientation is given, the compound (I) can express an in-plane retardation with reverse wavelength distribution on the basis of the main chain mesogen skeleton 1a and the side chain mesogen skeleton 1b.

In the formula (I) mentioned above, $Y^1$ to $Y^8$ are each independently a chemical single bond, —O—, —S—, —O—C(=O)—, —C(=O)—O—, —O—C(=O)—O—, —NR$^1$—C(=O)—, —C(=O)—NR$^1$—, —O—C(=O)—NR$^1$—, —NR$^1$—C(=O)—O—, —NR$^1$—C(=O)—NR$^1$—, —O—NR$^1$—, or —NR$^1$—O—.

Herein, $R^1$ is a hydrogen atom or an alkyl group of 1 to 6 carbon atoms.

Examples of the alkyl group of 1 to 6 carbon atoms of $R^1$ may include a methyl group, an ethyl group, a n-propyl group, an isopropyl group, a n-butyl group, a sec-butyl group, a t-butyl group, a n-pentyl group, and a n-hexyl group.

It is preferable that $R^1$ is a hydrogen atom or an alkyl group of 1 to 4 carbon atoms.

In the compound (I), it is preferable that $Y^1$ to $Y^8$ are each independently a chemical single bond, —O—, —O—C(=O)—, —C(=O)—O—, or —O—C(=O)—O—.

In the formula (I) mentioned above, $G^1$ and $G^2$ are each independently a divalent aliphatic group of 1 to 20 carbon atoms optionally having a substituent.

Examples of the divalent aliphatic group of 1 to 20 carbon atoms may include a divalent aliphatic group having a linear structure, such as an alkylene group of 1 to 20 carbon atoms and an alkenylene group of 2 to 20 carbon atoms; and a divalent aliphatic group, such as a cycloalkanediyl group of 3 to 20 carbon atoms, a cycloalkenediyl group of 4 to 20 carbon atoms, and a divalent alicyclic fused ring group of 10 to 30 carbon atoms.

Examples of the substituent in the divalent aliphatic group of $G^1$ and $G^2$ may include a halogen atom, such as a fluorine atom, a chlorine atom, a bromine atom, and an iodine atom; and an alkoxy group of 1 to 6 carbon atoms, such as a methoxy group, an ethoxy group, a n-propoxy group, an isopropoxy group, a n-butoxy group, a sec-butoxy group, a t-butoxy group, a n-pentyloxy group, and a n-hexyloxy group. Among these, a fluorine atom, a methoxy group, and an ethoxy group are preferable.

The aforementioned aliphatic groups may have one or more per one aliphatic group of —O—, —S—, —O—C(=O)—, —C(=O)—O—, —O—C(=O)—O—, —NR$^2$—C(=O)—, —C(=O)—NR$^2$—, —NR$^2$—, or —C(=O)— inserted therein. However, cases where two or more —O— or —S— are adjacently inserted are excluded. Herein, $R^2$ is a hydrogen atom or an alkyl group of 1 to 6 carbon atoms. It is preferable that $R^2$ is a hydrogen atom or a methyl group.

It is preferable that the group inserted into the aliphatic groups is —O—, —O—C(=O)—, —C(=O)—O—, or —C(=O)—.

Specific examples of the aliphatic groups into which the group is inserted may include —CH$_2$—CH$_2$—O—CH$_2$—CH$_2$—, —CH$_2$—CH$_2$—S—CH$_2$—CH$_2$—, —CH$_2$—CH$_2$—O—C(=O)—CH$_2$—CH$_2$—, —CH$_2$—CH$_2$C(=O)—O—CH$_2$—CH$_2$—, —CH$_2$—CH$_2$—C(=O)—O—CH$_2$—, —CH$_2$—O—C(=O)—O—CH$_2$—CH$_2$—, —CH$_2$—CH$_2$—NR$^2$—C(=O)—CH$_2$—CH$_2$—, —CH$_2$—CH$_2$—C(=O)—NR$^2$—CH$_2$—, —CH$_2$—NR$^2$—CH$_2$—CH$_2$—, and —CH$_2$—C(=O)—CH$_2$—.

Among these, from the viewpoint of more favorably expressing the desired effect of the present invention, $G^1$ and $G^2$ are each independently preferably a divalent aliphatic group having a linear structure, such as an alkylene group of 1 to 20 carbon atoms and an alkenylene group of 2 to 20 carbon atoms, more preferably an alkylene group of 1 to 12 carbon atoms, such as a methylene group, an ethylene group, a trimethylene group, a propylene group, a tetramethylene group, a pentamethylene group, a hexamethylene group, an octamethylene group, and a decamethylene group [—(CH$_2$)$_{10}$—], and particularly preferably a tetramethylene group [—(CH$_2$)$_4$—], a hexamethylene group [—(CH$_2$)$_6$—], an octamethylene group [—(CH$_2$)$_8$—], or a decamethylene group [—(CH$_2$)$_{10}$—].

In the formula (I) mentioned above, $Z^1$ and $Z^2$ are each independently an alkenyl group of 2 to 10 carbon atoms that may be substituted by a halogen atom.

It is preferable that the number of carbon atoms in the alkenyl group is 2 to 6. Examples of the halogen atom that is a substituent in the alkenyl group of $Z^1$ and $Z^2$ may include a fluorine atom, a chlorine atom, and a bromine atom. A chlorine atom is preferable.

Specific examples of the alkenyl group of 2 to 10 carbon atoms of $Z^1$ and $Z^2$ may include CH$_2$=CH—, CH$_2$=C(CH$_3$)—, CH$_2$=CH—CH$_2$—, CH$_3$—CH=CH—, CH$_2$=CH—CH$_2$—CH$_2$—, CH$_2$=C(CH$_3$)—CH$_2$—CH$_2$—, (CH$_3$)$_2$C=CH—CH$_2$—, (CH$_3$)$_2$C=CH—CH$_2$—CH$_2$—, CH$_2$=C(Cl)—, CH$_2$=C(CH$_3$)—CH$_2$—, and CH$_3$—CH=CH—CH$_2$—.

Among these, from the viewpoint of favorably expressing the desired effect of the present invention, $Z^1$ and $Z^2$ are each independently preferably CH$_2$=CH—, CH$_2$=C(CH$_3$)—, CH$_2$=C(Cl)—, CH$_2$=CH—CH$_2$—, CH$_2$=C(CH$_3$)—CH$_2$—, or CH$_2$=C(CH$_3$)—CH$_2$—CH$_2$—, more preferably CH$_2$=CH—, CH$_2$=C(CH$_3$)— or CH$_2$=C(Cl)—, and particularly preferably CH$_2$=CH—.

In the formula (I) mentioned above, $A^x$ is an organic group of 2 to 30 carbon atoms having at least one aromatic ring selected from the group consisting of an aromatic hydrocarbon ring and an aromatic heterocyclic ring. The "aromatic ring" means a cyclic structure having aromaticity in the broad sense based on Huckel rule, that is, a cyclic conjugated structure having (4n+2) π electrons, and a cyclic structure that exhibits aromaticity by involving a lone pair of electrons of a heteroatom, such as sulfur, oxygen, and nitrogen, in a π electron system, typified by thiophene, furan, and benzothiazole.

The organic group of 2 to 30 carbon atoms having at least one aromatic ring selected from the group consisting of an aromatic hydrocarbon ring and an aromatic heterocyclic ring, of $A^x$, may have a plurality of aromatic rings, or have both an aromatic hydrocarbon ring and an aromatic heterocyclic ring.

Examples of the aromatic hydrocarbon ring may include a benzene ring, a naphthalene ring, and an anthracene ring. Examples of the aromatic heterocyclic ring may include a monocyclic aromatic heterocyclic ring, such as a pyrrole ring, a furan ring, a thiophene ring, a pyridine ring, a pyridazine ring, a pyrimidine ring, a pyrazine ring, a pyrazole ring, an imidazole ring, an oxazole ring, and a thiazole ring; and a fused aromatic heterocyclic ring, such as a benzothiazole ring, a benzoxazole ring, a quinoline ring, a phthalazine ring, a benzimidazole ring, a benzopyrazole ring, a benzofuran ring, a benzothiophene ring, a thiazolopyridine ring, an oxazolopyridine ring, a thiazolopyrazine ring, an oxazolopyrazine ring, a thiazolopyridazine ring, an oxazolopyridazine ring, a thiazolopyrimidine ring, and an oxazolopyrimidine ring.

The aromatic ring of $A^x$ may have a substituent. Examples of the substituent may include a halogen atom, such as a fluorine atom and a chlorine atom; a cyano group; an alkyl group of 1 to 6 carbon atoms, such as a methyl group, an ethyl group, and a propyl group; an alkenyl group of 2 to 6 carbon atoms, such as a vinyl group and an allyl group; a halogenated alkyl group of 1 to 6 carbon atoms, such as a trifluoromethyl group; a substituted amino group, such as a dimethylamino group; an alkoxy group of 1 to 6 carbon atoms, such as a methoxy group, an ethoxy group, and an isopropoxy group; a nitro group; an aryl group, such as a phenyl group and a naphthyl group; —C(=O)—$R^5$; —C(=O)—$OR^5$; and —$SO_2R^6$. Herein, $R^5$ is an alkyl group of 1 to 20 carbon atoms, an alkenyl group of 2 to 20 carbon atoms, or a cycloalkyl group of 3 to 12 carbon atoms. $R^6$ is an alkyl group of 1 to 20 carbon atoms, an alkenyl group of 2 to 20 carbon atoms, a phenyl group, or a 4-methylphenyl group, which are the same as those for $R^4$ which will be described later.

The aromatic ring of $A^x$ may have a plurality of substituents that may be the same or different, and two adjacent substituents may be bonded together to form a ring. The formed ring may be a monocycle or a fused polycycle, and may be an unsaturated ring or a saturated ring.

The "number of carbon atoms" in the organic group of 2 to 30 carbon atoms of $A^x$ means the total number of carbon atoms in the entire organic group which excludes carbon atoms in the substituents (the same applies to $A^y$ which will be described later).

Examples of the organic group of 2 to 30 carbon atoms having at least one aromatic ring selected from the group consisting of an aromatic hydrocarbon ring and an aromatic heterocyclic ring, of $A^x$, may include an aromatic hydrocarbon ring group such as a benzene ring group, a naphthalene ring group, and an anthracene ring group; an aromatic heterocyclic ring group such as a pyrrole ring group, a furan ring group, a thiophene ring group, a pyridine ring group, a pyridazine ring group, a pyrimidine ring group, a pyrazine ring group, a pyrazole ring group, an imidazole ring group, an oxazole ring group, a thiazole ring group, a benzothiazole ring group, a benzoxazole ring group, a quinoline ring group, a phthalazine ring group, a benzimidazole ring group, a benzopyrazole ring group, a benzofuran ring group, a benzothiophene ring group, a thiazolopyridine ring group, an oxazolopyridine ring group, a thiazolopyrazine ring group, an oxazolopyrazine ring group, a thiazolopyridazine ring group, an oxazolopyridazine ring group, a thiazolopyrimidine ring group, and an oxazolopyrimidine ring group; a group containing a combination of an aromatic hydrocarbon ring and a heterocyclic ring; an alkyl group of 3 to 30 carbon atoms having at least one aromatic ring selected from the group consisting of an aromatic hydrocarbon ring and an aromatic heterocyclic ring; an alkenyl group of 4 to 30 carbon atoms having at least one aromatic ring selected from the group consisting of an aromatic hydrocarbon ring and an aromatic heterocyclic ring; and an alkynyl group of 4 to 30 carbon atoms having at least one aromatic ring selected from the group consisting of an aromatic hydrocarbon ring and an aromatic heterocyclic ring.

Preferable specific examples of $A^x$ are as follows. However, $A^x$ is not limited to the following examples. In the following formulae, "-" represents an atomic bonding at any position of the ring (the same applies to the following).

(1) An aromatic hydrocarbon ring group

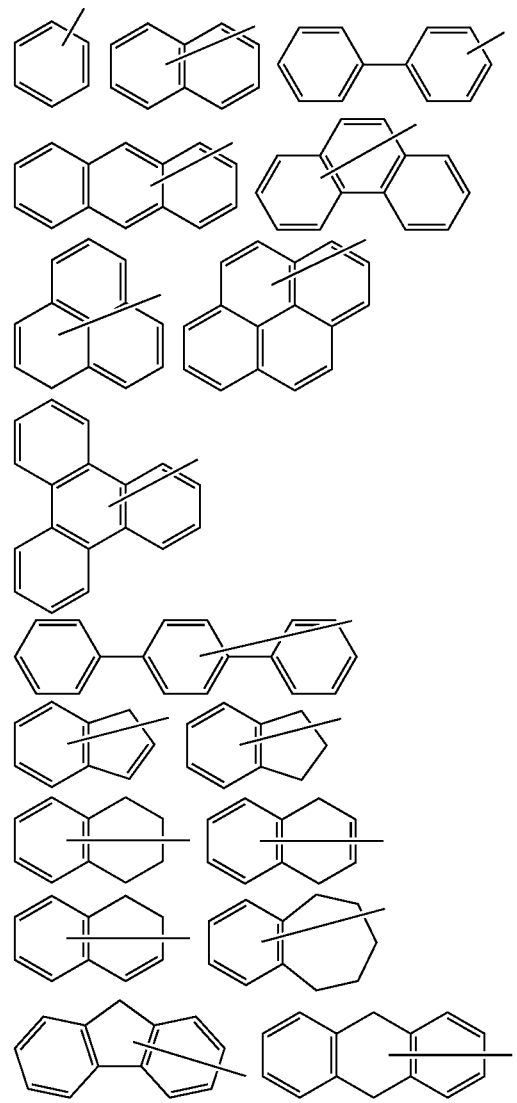

-continued

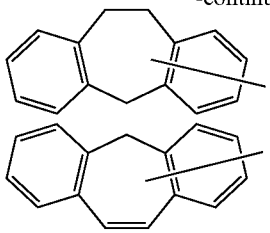

(2) An aromatic heterocyclic group

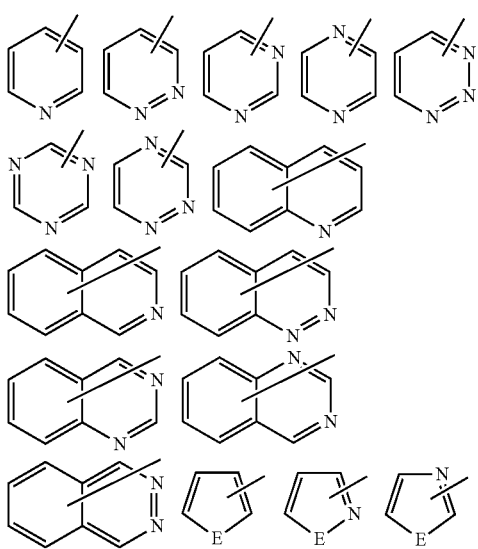

In the aforementioned formulae, E is $NR^{6a}$, an oxygen atom, or a sulfur atom. Herein, $R^{6a}$ is a hydrogen atom; or an alkyl group of 1 to 6 carbon atoms, such as a methyl group, an ethyl group, and a propyl group.

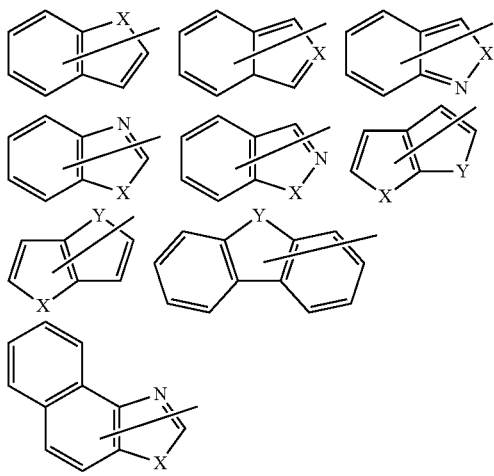

In the aforementioned formulae, X and Y are each independently $NR^7$, an oxygen atom, a sulfur atom, —SO—, or —SO$_2$— (with a proviso that cases where an oxygen atom, a sulfur atom, —SO—, and —SO$_2$— are each adjacent are excluded). $R^7$ is a hydrogen atom, or an alkyl group of 1 to 6 carbon atoms, such as a methyl group, an ethyl group, and a propyl group, which are the same as those for $R^{6a}$ described above.

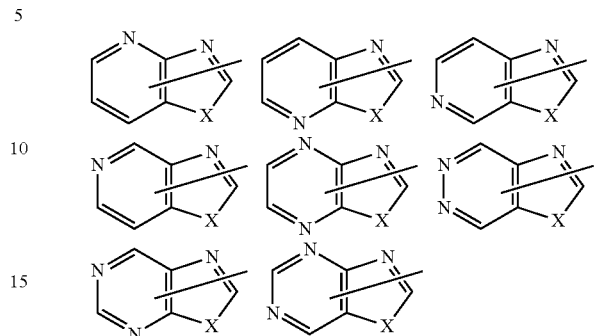

(In the aforementioned formulae, X has the same meanings as described above.)

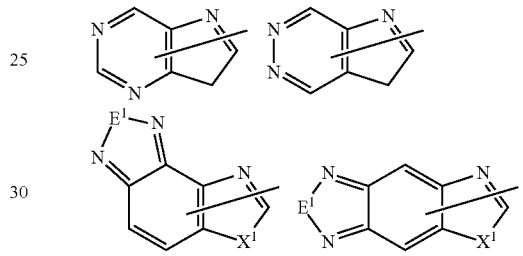

(In the aforementioned formulae, $X^1$ is —CH$_2$—, —NR$^c$—, an oxygen atom, a sulfur atom, —SO—, or —SO$_2$—, and E1 is —NR$^c$—, an oxygen atom or a sulfur atom. Herein, $R^c$ is a hydrogen atom, or an alkyl group of 1 to 6 carbon atoms such as a methyl group, an ethyl group, and a propyl group. (provided that, in each formula, each of the oxygen atom, the sulfur atom, —SO—, and —SO$_2$— is not adjacent.))

(3) A group containing a combination of an aromatic hydrocarbon ring and a heterocyclic ring

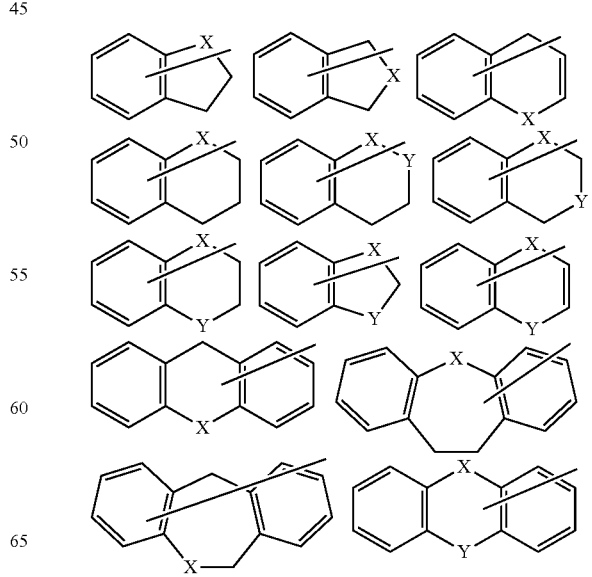

-continued

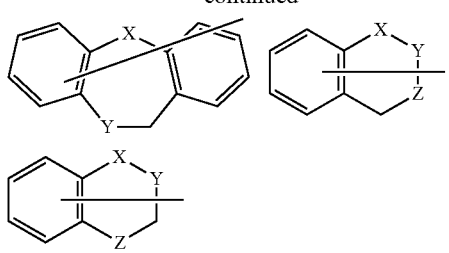
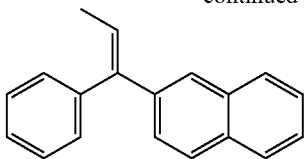

(In the aforementioned formulae, each of X and Y independently has the same meanings as described above. In the aforementioned formulae, Z represents $NR^7$, an oxygen atom, a sulfur atom, —SO—, or —$SO_2$— (with a proviso that cases where an oxygen atom, a sulfur atom, —SO—, and —$SO_2$— are each adjacent are excluded.).)

(4) An alkyl group having at least one aromatic ring selected from the group consisting of an aromatic hydrocarbon ring and an aromatic heterocyclic ring

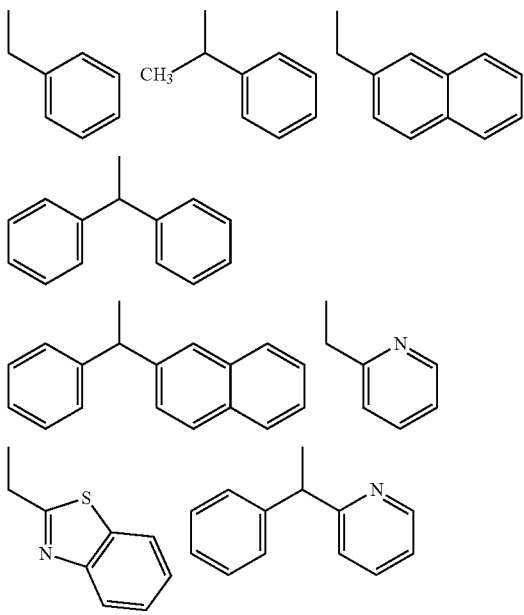

(5) An alkenyl group having at least one aromatic ring selected from the group consisting of an aromatic hydrocarbon ring and an aromatic heterocyclic ring

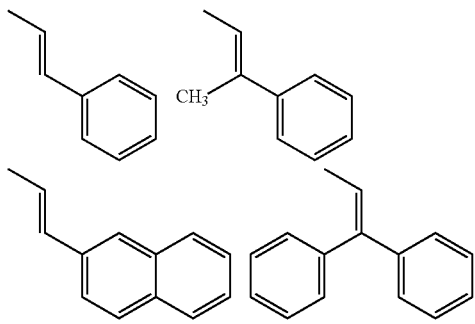

-continued

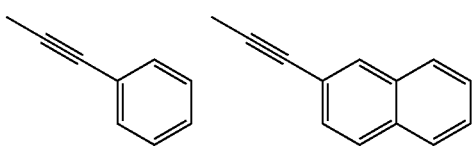

(6) An alkynyl group having at least one aromatic ring selected from the group consisting of an aromatic hydrocarbon ring and an aromatic heterocyclic ring Of $A^x$ described above, an aromatic hydrocarbon ring group of 6 to 30 carbon atoms, an aromatic heterocyclic group of 4 to 30 carbon atoms, and a group of 4 to 30 carbon atoms containing a combination of an aromatic hydrocarbon ring group and a heterocyclic ring are preferable, and any of the groups shown below are more preferable.

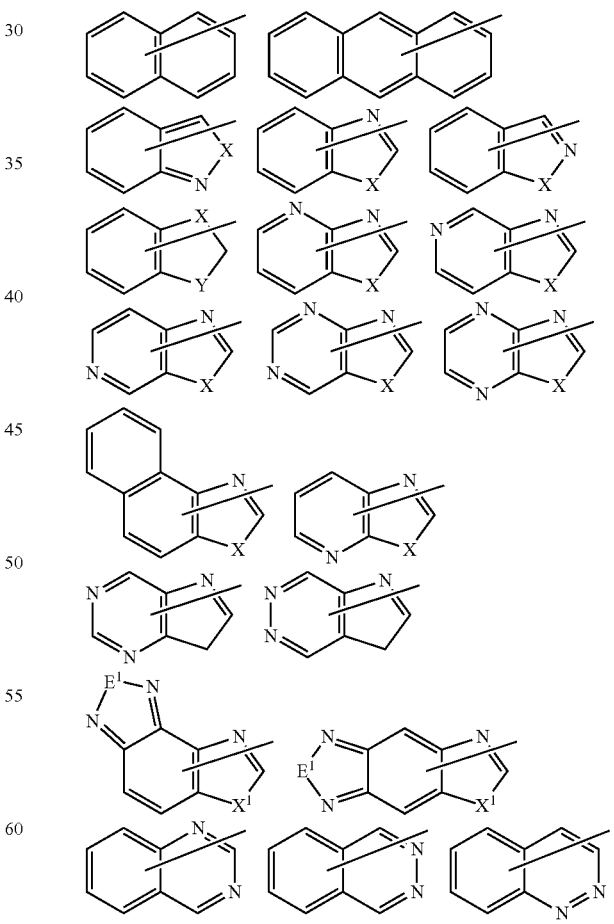

It is further preferable that $A^x$ is any of the following groups.

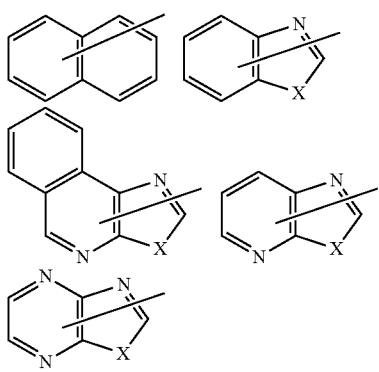

The ring that $A^x$ has may have a substituent. Examples of such a substituent may include a halogen atom, such as a fluorine atom and a chlorine atom; a cyano group; an alkyl group of 1 to 6 carbon atoms, such as a methyl group, an ethyl group, and a propyl group; an alkenyl group of 2 to 6 carbon atoms, such as a vinyl group and an allyl group; a halogenated alkyl group of 1 to 6 carbon atoms, such as a trifluoromethyl group; a substituted amino group, such as a dimethylamino group; an alkoxy group of 1 to 6 carbon atoms, such as a methoxy group, an ethoxy group, and an isopropoxy group; a nitro group; an aryl group, such as a phenyl group and a naphthyl group; —C(=O)—R$^8$; —C(=O)—OR$^8$; and —SO$_2$R$^6$. Herein, R$^8$ is an alkyl group of 1 to 6 carbon atoms, such as a methyl group and an ethyl group; or an aryl group of 6 to 14 carbon atoms, such as a phenyl group. In particular, it is preferable that the substituent is a halogen atom, a cyano group, an alkyl group of 1 to 6 carbon atoms, or an alkoxy group of 1 to 6 carbon atoms.

The ring that $A^x$ has may have a plurality of substituents that may be the same or different, and two adjacent substituents may be bonded together to form a ring. The formed ring may be a monocycle or a fused polycycle.

The "number of carbon atoms" in the organic group of 2 to 30 carbon atoms of $A^x$ means the total number of carbon atoms in the entire organic group which excludes carbon atoms in the substituents (the same applies to $A^y$ which will be described later).

In the aforementioned formula (I), $A^y$ is a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R$^8$, —SO$_2$—R$^4$, —C(=S)NH—R$^9$, or an organic group of 2 to 30 carbon atoms having at least one aromatic ring selected from the group consisting of an aromatic hydrocarbon ring and an aromatic heterocyclic ring. Herein, R$^3$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms. R$^4$ is an alkyl group of 1 to 20 carbon atoms, an alkenyl group of 2 to 20 carbon atoms, a phenyl group, or a 4-methylphenyl group. R$^9$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent.

Examples of the alkyl group of 1 to 20 carbon atoms in the alkyl group of 1 to 20 carbon atoms optionally having a substituent, of $A^y$, may include a methyl group, an ethyl group, a n-propyl group, an isopropyl group, a n-butyl group, an isobutyl group, a 1-methylpentyl group, a 1-ethylpentyl group, a sec-butyl group, a t-butyl group, a n-pentyl group, an isopentyl group, a neopentyl group, a n-hexyl group, an isohexyl group, a n-heptyl group, a n-octyl group, a n-nonyl group, a n-decyl group, a n-undecyl group, a n-dodecyl group, a n-tridecyl group, a n-tetradecyl group, a n-pentadecyl group, a n-hexadecyl group, a n-heptadecyl group, a n-octadecyl group, a n-nonadecyl group, and a n-icosyl group. The number of carbon atoms in the alkyl group of 1 to 20 carbon atoms optionally having a substituent is preferably 1 to 12, and further preferably 4 to 10.

Examples of the alkenyl group of 2 to 20 carbon atoms in the alkenyl group of 2 to 20 carbon atoms optionally having a substituent, of $A^y$, may include a vinyl group, a propenyl group, an isopropenyl group, a butenyl group, an isobutenyl group, a pentenyl group, a hexenyl group, a heptenyl group, an octenyl group, a decenyl group, an undecenyl group, a dodecenyl group, a tridecenyl group, a tetradecenyl group, a pentadecenyl group, a hexadecenyl group, a heptadecenyl group, an octadecenyl group, a nonadecenyl group, and an icocenyl group. The number of carbon atoms in the alkenyl group of 2 to 20 carbon atoms optionally having a substituent is preferably 2 to 12.

Examples of the cycloalkyl group of 3 to 12 carbon atoms in the cycloalkyl group of 3 to 12 carbon atoms optionally having a substituent, of $A^y$, may include a cyclopropyl group, a cyclobutyl group, a cyclopentyl group, a cyclohexyl group, and a cyclooctyl group.

Examples of the alkynyl group of 2 to 20 carbon atoms in the alkynyl group of 2 to 20 carbon atoms optionally having a substituent, of $A^y$, may include an ethynyl group, a propynyl group, a 2-propynyl group (propargyl group), a butynyl group, a 2-butynyl group, a 3-butynyl group, a pentynyl group, a 2-pentynyl group, a hexynyl group, a 5-hexynyl group, a heptynyl group, an octynyl group, a 2-octynyl group, a nonanyl group, a decanyl group, and a 7-decanyl group.

Examples of the substituents in the alkyl group of 1 to 20 carbon atoms optionally having a substituent and the alkenyl group of 2 to 20 carbon atoms optionally having a substituent, of $A^y$, may include a halogen atom, such as a fluorine atom and a chlorine atom; a cyano group; a substituted amino group, such as a dimethylamino group; an alkoxy group of 1 to 20 carbon atoms, such as a methoxy group, an ethoxy group, an isopropyl group, and a butoxy group; an alkoxy group of 1 to 12 carbon atoms that is substituted by an alkoxy group of 1 to 12 carbon atoms, such as a methoxymethoxy group and a methoxyethoxy group; a nitro group; an aryl group, such as a phenyl group and a naphthyl group; a cycloalkyl group of 3 to 8 carbon atoms, such as a cyclopropyl group, a cyclopentyl group, and a cyclohexyl group; a cycloalkyloxy group of 3 to 8 carbon atoms, such as a cyclopentyloxy group, and a cyclohexyloxy group; a cyclic ether group of 2 to 12 carbon atoms, such as a tetrahydrofuranyl group, a tetrahydropyranyl group, a dioxolanyl group, and a dioxanyl group; an aryloxy group of 6 to 14 carbon atoms, such as a phenoxy group, and a naphthoxy group; a fluoroalkoxy group of 1 to 12 carbon atoms in which at least one is substituted by a fluoro atom, such as a trifluoromethyl group, a pentafluoroethyl group, and —CH$_2$CF$_3$; a benzofuryl group; a benzopyranyl group;

a benzodioxolyl group; a benzodioxanyl group; —C(=O)—$R^{7a}$; —C(=O)—$OR^{7a}$; —$SO_2R^{8a}$; —$SR^{10}$; an alkoxy group of 1 to 12 carbon atoms substituted by —$SR^{10}$; and a hydroxyl group. Herein, $R^{7a}$ and $R^{10}$ are each independently an alkyl group of 1 to 20 carbon atoms, an alkenyl group of 2 to 20 carbon atoms, a cycloalkyl group of 3 to 12 carbon atoms, or an aromatic hydrocarbon ring group of 6 to 12 carbon atoms. $R^{8a}$ is an alkyl group of 1 to 20 carbon atoms, an alkenyl group of 2 to 20 carbon atoms, a phenyl group, or a 4-methylphenyl group, which are the same as those for $R^4$ described above.

Examples of the substituent in the cycloalkyl group of 3 to 12 carbon atoms optionally having a substituent, of $A^y$, may include a halogen atom, such as a fluorine atom and a chlorine atom; a cyano group; a substituted amino group, such as a dimethylamino group; an alkyl group of 1 to 6 carbon atoms, such as a methyl group, an ethyl group, and a propyl group; an alkoxy group of 1 to 6 carbon atoms, such as a methoxy group, an ethoxy group, and an isopropoxy group; a nitro group; an aryl group, such as a phenyl group and a naphthyl group; a cycloalkyl group of 3 to 8 carbon atoms, such as a cyclopropyl group, a cyclopentyl group, and a cyclohexyl group; —C(=O)—$R^{7a}$; —C(=O)—$OR^{7a}$; —$SO_2R^{8a}$; and a hydroxyl group. Herein, $R^{7a}$ and $R^{8a}$ have the same meanings as described above.

Examples of the substituent in the alkynyl group of 2 to 20 carbon atoms optionally having a substituent, of $A^y$, may include substituents that are the same as the substituents in the alkyl group of 1 to 20 carbon atoms optionally having a substituent and the alkenyl group of 2 to 20 carbon atoms optionally having a substituent.

In the group represented by —C(=O)—$R^3$ of $A^y$, $R^3$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms. Specific examples thereof may include those exemplified as the examples of the alkyl group of 1 to 20 carbon atoms optionally having a substituent, the alkenyl group of 2 to 20 carbon atoms optionally having a substituent, and the cycloalkyl group of 3 to 12 carbon atoms optionally having a substituent, of $A^y$; and the aromatic hydrocarbon ring group of 5 to 12 carbon atoms, among the aromatic hydrocarbon ring groups described in $A^x$ described above.

In the group represented by —$SO_2$—$R^4$ of $A^y$, $R^4$ is an alkyl group of 1 to 20 carbon atoms, an alkenyl group of 2 to 20 carbon atoms, a phenyl group, or a 4-methylphenyl group. Specific examples of the alkyl group of 1 to 20 carbon atoms and the alkenyl group of 2 to 20 carbon atoms, of $R^4$, may include those exemplified as the examples of the alkyl group of 1 to 20 carbon atoms, and the alkenyl group of 2 to 20 carbon atoms, of $A^y$ described above.

In the group represented by —C(=S)NH—$R^9$ of $A^y$, $R^9$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent. Specific examples thereof may include those exemplified as the examples of the alkyl group of 1 to 20 carbon atoms optionally having a substituent, the alkenyl group of 2 to 20 carbon atoms optionally having a substituent, and the cycloalkyl group of 3 to 12 carbon atoms optionally having a substituent, of $A^y$ described above; and the aromatic hydrocarbon ring group of 5 to 20 carbon atoms and aromatic heteroaromatic ring group of 5 to 20 carbon atoms, among the aromatic groups such as the aromatic hydrocarbon ring groups and aromatic heteroaromatic ring groups described in $A^x$ described above.

Examples of the organic group of 2 to 30 carbon atoms having at least one aromatic ring selected from the group consisting of an aromatic hydrocarbon ring and an aromatic heterocyclic ring of $A^y$ may include those exemplified as the examples of $A^x$ described above.

Among these, $A^y$ is preferably a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—$R^3$, —$SO_2$—$R^4$, or an organic group of 2 to 30 carbon atoms having at least one aromatic ring selected from the group consisting of an aromatic hydrocarbon ring and an aromatic heterocyclic ring, and further preferably a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, an aromatic hydrocarbon ring group of 6 to 12 carbon atoms optionally having a substituent, an aromatic heterocyclic group of 3 to 9 carbon atoms optionally having a substituent, an group of 3 to 9 carbon atoms containing a combination of an aromatic hydrocarbon ring and a heterocyclic ring and optionally having a substituent, —C(=O)—$R^3$, or a group represented by —$SO_2$—$R^4$. Herein, $R^3$ and $R^4$ have the same meanings as described above.

It is preferable that substituents in the alkyl group of 1 to 20 carbon atoms optionally having a substituent, the alkenyl group of 2 to 20 carbon atoms optionally having a substituent, and the alkynyl group of 2 to 20 carbon atoms optionally having a substituent, of $A^y$, are a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a phenylsulfonyl group, a 4-methylphenylsulfonyl group, a benzoyl group, or —$SR^{10}$. Herein, $R^{10}$ has the same meanings as described above.

It is preferable that substituents in the cycloalkyl group of 3 to 12 carbon atoms optionally having a substituent, the aromatic hydrocarbon ring group of 6 to 12 carbon atoms optionally having a substituent, the aromatic heterocyclic group of 3 to 9 carbon atoms optionally having a substituent, and an group of 3 to 9 carbon atoms containing a combination of an aromatic hydrocarbon ring and a heterocyclic ring and optionally having a substituent, of $A^y$, are a fluorine atom, an alkyl group of 1 to 6 carbon atoms, an alkoxy group of 1 to 6 carbon atoms, or a cyano group.

$A^x$ and $A^y$ may form a ring together. Examples of the ring may include an unsaturated heterocyclic ring of 4 to 30 carbon atoms optionally having a substituent and an unsaturated carbon ring of 6 to 30 carbon atoms optionally having a substituent.

The aforementioned unsaturated heterocyclic ring of 4 to 30 carbon atoms and the aforementioned unsaturated carbon ring of 6 to 30 carbon atoms are not particularly restricted, and may or may not have aromaticity.

Examples of the ring formed by $A^x$ and $A^y$ together may include rings shown below. The rings shown below are a moiety of:

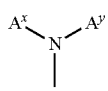

in the formula (I).

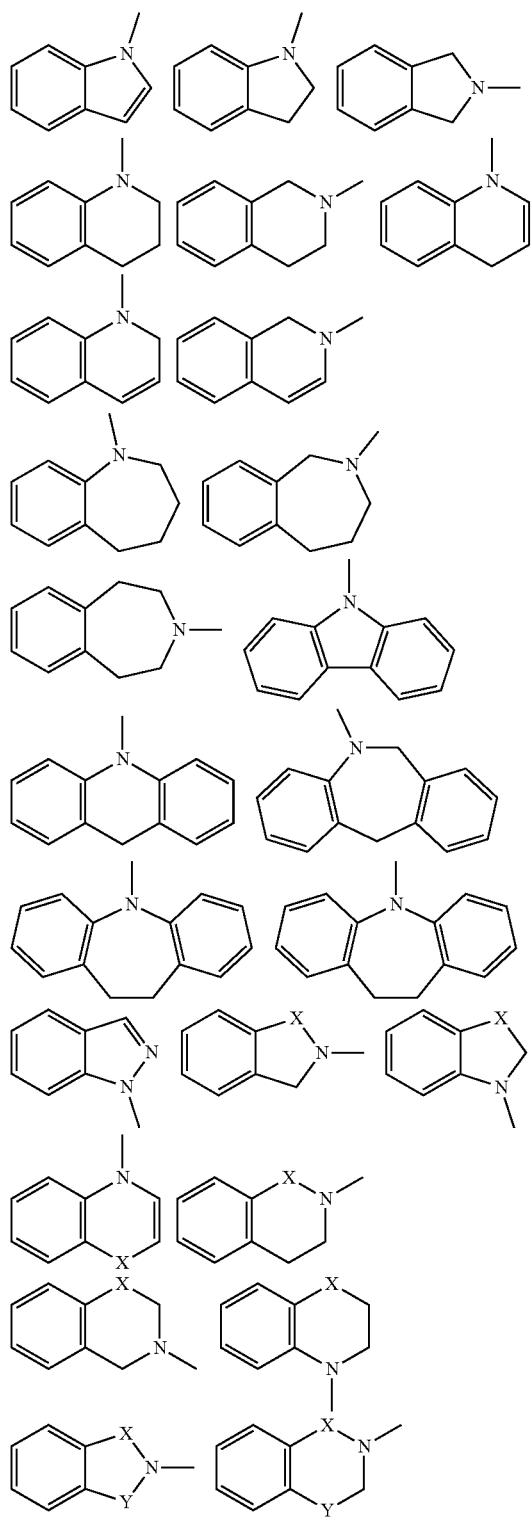

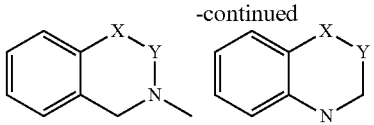
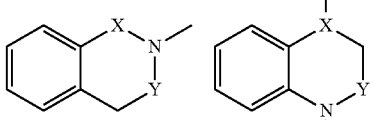
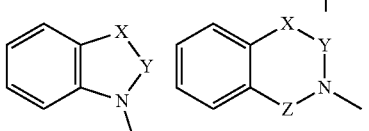
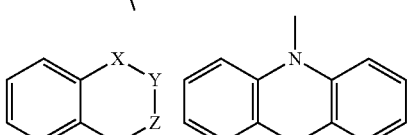
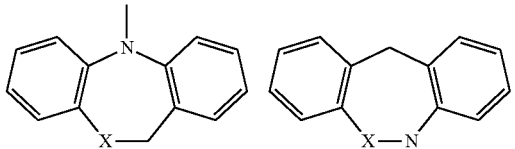
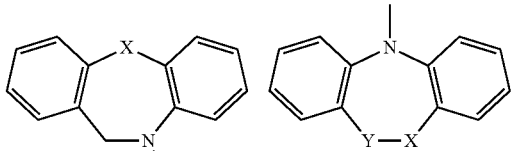
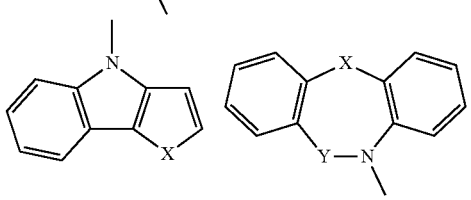

(In the formulae, X, Y, and Z have the same meanings as described above.)

The rings may have a substituent. Examples of the substituent may include those described as the substituent in the aromatic ring of $A^x$.

The total number of π electrons contained in $A^x$ and $A^y$ is preferably 4 or more and 24 or less, more preferably 6 or more and 20 or less, and still more preferably 6 or more and 18 or less from the viewpoint of favorably expressing the desired effect of the present invention.

Examples of preferred combination of $A^x$ and $A^y$ may include the following combinations (α) and (β).

(α) a combination of $A^x$ and $A^y$ in which $A^x$ is an aromatic hydrocarbon ring group of 4 to 30 carbon atoms, an aromatic heterocyclic group of 4 to 30 carbon atoms or a group containing a combination of an aromatic hydrocarbon ring and a heterocyclic ring, $A^y$ is a hydrogen atom, a cycloalkyl group of 3 to 8 carbon atoms, an aromatic hydrocarbon ring group of 6 to 12 carbon atoms optionally having a substituent (a halogen atom, a cyano group, an alkyl group of 1 to 6 carbon atoms, an alkoxy group of 1 to 6 carbon atoms, or a cycloalkyl group of 3 to 8 carbon atoms), an aromatic heterocyclic group of 3 to 9 carbon atoms optionally having a substituent (a halogen atom, an alkyl group of 1 to 6 carbon atoms, an alkoxy group of 1 to 6 carbon atoms, or a cyano group), a group of 3 to 9 carbon atoms containing a combination of an aromatic hydrocarbon ring and a heterocyclic ring and optionally having a substituent (a halogen atom, an alkyl group of 1 to 6 carbon atoms, an alkoxy group of 1 to 6 carbon atoms, or a cyano group), an alkyl group of 1 to 20 carbon atoms optionally having a substituent, an alkenyl group of 2 to 20 carbon atoms optionally having a substituent, or an alkynyl group of 2 to 20 carbon atoms optionally having a substituent, and the substituent is any of a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a benzenesulfonyl group, a benzoyl group, and $-SR^{10}$.

(β) a combination of $A^x$ and $A^y$ in which $A^x$ and $A^y$ together form an unsaturated heterocyclic ring or an unsaturated carbon ring.

Herein, $R^{10}$ has the same meanings as described above.

Examples of more preferred combination of $A^x$ and $A^y$ may include the following combination (γ).

(γ) a combination of $A^x$ and $A^y$ in which $A^x$ is any of groups having the following structures, $A^y$ is a hydrogen atom, a cycloalkyl group of 3 to 8 carbon atoms, an aromatic hydrocarbon ring group of 6 to 12 carbon atoms optionally having a substituent (a halogen atom, a cyano group, an alkyl group of 1 to 6 carbon atoms, an alkoxy group of 1 to 6 carbon atoms, or a cycloalkyl group of 3 to 8 carbon atoms), an aromatic heterocyclic group of 3 to 9 carbon atoms optionally having a substituent (a halogen atom, an alkyl group of 1 to 6 carbon atoms, an alkoxy group of 1 to 6 carbon atoms, or a cyano group), a group of 3 to 9 carbon atoms containing a combination of an aromatic hydrocarbon ring and a heterocyclic ring and optionally having a substituent (a halogen atom, an alkyl group of 1 to 6 carbon atoms, an alkoxy group of 1 to 6 carbon atoms, or a cyano group), an alkyl group of 1 to 20 carbon atoms optionally having a substituent, an alkenyl group of 2 to 20 carbon atoms optionally having a substituent, or an alkynyl group of 2 to 20 carbon atoms optionally having a substituent, and the substituent is any of a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a benzenesulfonyl group, a benzoyl group, and $-SR^{10}$.

Herein, $R^{10}$ has the same meanings as described above.

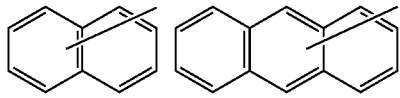

-continued

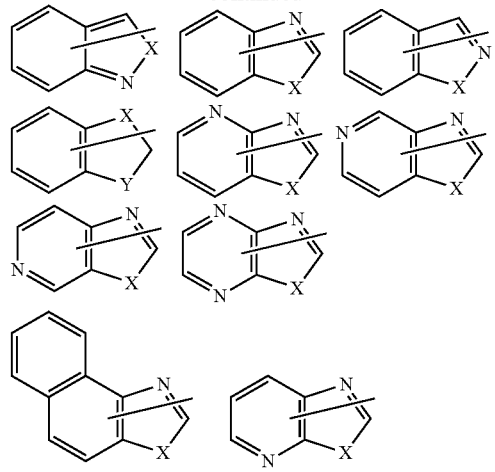

(In the formulae, X and Y have the same meanings as described above.)

Examples of particularly preferred combination of $A^x$ and $A^y$ may include the following combination (δ).

(δ) a combination of $A^x$ and $A^y$ in which $A^x$ is any of groups having the following structures, $A^y$ is a hydrogen atom, a cycloalkyl group of 3 to 8 carbon atoms, an aromatic hydrocarbon ring group of 6 to 12 carbon atoms optionally having a substituent (a halogen atom, a cyano group, an alkyl group of 1 to 6 carbon atoms, an alkoxy group of 1 to 6 carbon atoms, or a cycloalkyl group of 3 to 8 carbon atoms), an aromatic heterocyclic group of 3 to 9 carbon atoms optionally having a substituent (a halogen atom, an alkyl group of 1 to 6 carbon atoms, an alkoxy group of 1 to 6 carbon atoms, or a cyano group), a group of 3 to 9 carbon atoms containing a combination of an aromatic hydrocarbon ring and a heterocyclic ring and optionally having a substituent (a halogen atom, an alkyl group of 1 to 6 carbon atoms, an alkoxy group of 1 to 6 carbon atoms, or a cyano group), an alkyl group of 1 to 20 carbon atoms optionally having a substituent, an alkenyl group of 2 to 20 carbon atoms optionally having a substituent, or an alkynyl group of 2 to 20 carbon atoms optionally having a substituent, and the substituent is any of a halogen atom, a cyano group, an alkoxy group of 1 to 20 carbon atoms, an alkoxy group of 1 to 12 carbon atoms that is substituted by an alkoxy group of 1 to 12 carbon atoms, a phenyl group, a cyclohexyl group, a cyclic ether group of 2 to 12 carbon atoms, an aryloxy group of 6 to 14 carbon atoms, a hydroxyl group, a benzodioxanyl group, a benzenesulfonyl group, a benzoyl group, and $-SR^{10}$.

In the following formulae, X has the same meanings as described above. Herein, $R^{10}$ has the same meanings as described above.

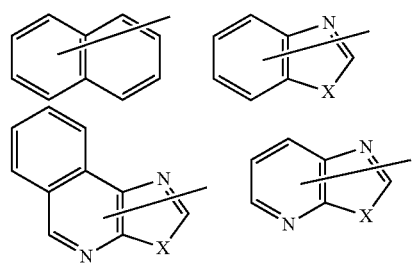

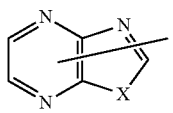

In the formula (I) mentioned above, $A^1$ is a trivalent aromatic group optionally having a substituent. The trivalent aromatic group may be a trivalent carbocyclic aromatic group or a trivalent heterocyclic aromatic group. From the viewpoint of favorably expressing the desired effect of the present invention, the trivalent aromatic group is preferably the trivalent carbocyclic aromatic group, more preferably a trivalent benzene ring group or a trivalent naphthalene ring group, and further preferably a trivalent benzene ring group or a trivalent naphthalene ring group that is represented by the following formula. In the following formulae, substituents $Y^1$ and $Y^2$ are described for the sake of convenience to clearly show a bonding state ($Y^1$ and $Y^2$ have the same meanings as described above, and the same applies to the following).

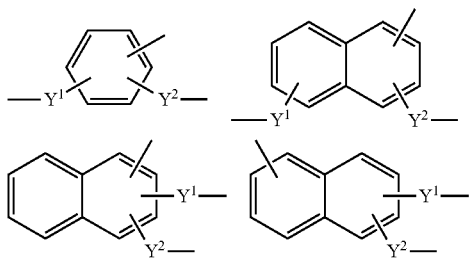

Among these, $A^1$ is more preferably a group represented by each of the following formulae (A11) to (A25), further preferably a group represented by the formula (A11), (A13), (A15), (A19), or (A23), and particularly preferably a group represented by the formula (A11) or (A23).

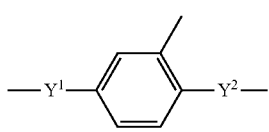
(A11)

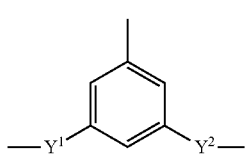
(A12)

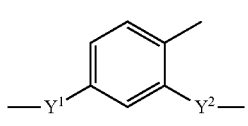
(A13)

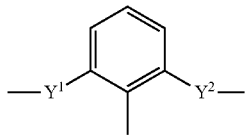
(A14)

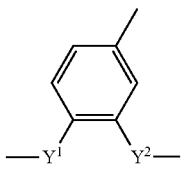
(A15)

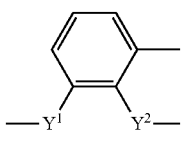
(A16)

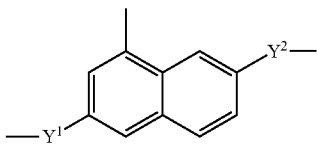
(A17)

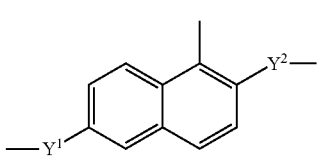
(A18)

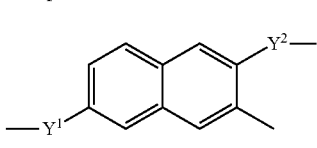
(A19)

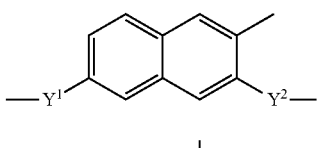
(A20)

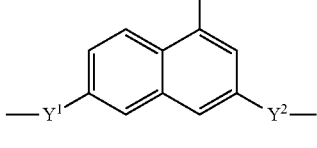
(A21)

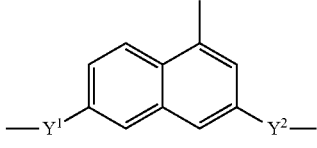
(A22)

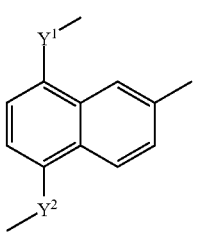
(A23)

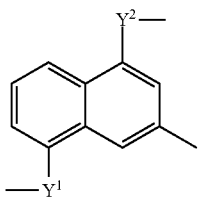

(A24)

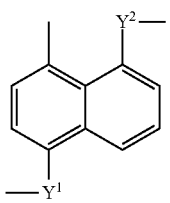

(A25)

Examples of the substituent that may be included in the trivalent aromatic group of $A^1$ may include those described as the substituent in the aromatic ring of $A^x$ described above. It is preferable that $A^1$ is a trivalent aromatic group having no substituent.

In the formula (I) mentioned above, $A^2$ and $A^3$ are each independently a divalent alicyclic hydrocarbon group of 3 to 30 carbon atoms optionally having a substituent. Examples of the divalent alicyclic hydrocarbon group of 3 to 30 carbon atoms may include a cycloalkanediyl group of 3 to 30 carbon atoms, and a divalent alicyclic fused ring group of 10 to 30 carbon atoms.

Examples of the cycloalkanediyl group of 3 to 30 carbon atoms may include a cyclopropanediyl group; a cyclobutanediyl group, such as a cyclobutane-1,2-diyl group and a cyclobutane-1,3-diyl group; a cyclopentanediyl group, such as a cyclopentane-1,2-diyl group and a cyclopentane-1,3-diyl group; a cyclohexanediyl group, such as a cyclohexane-1,2-diyl group, a cyclohexane-1,3-diyl group, and a cyclohexane-1,4-diyl group; a cycloheptanediyl group, such as a cycloheptane-1,2-diyl group, a cycloheptane-1,3-diyl group, and a cycloheptane-1,4-diyl group; a cyclooctanediyl group, such as a cyclooctane-1,2-diyl group, a cyclooctane-1,3-diyl group, a cyclooctane-1,4-diyl group, and a cyclooctane-1,5-diyl group; a cyclodecanediyl group, such as a cyclodecane-1,2-diyl group, a cyclodecane-1,3-diyl group, a cyclodecane-1,4-diyl group, and a cyclodecane-1,5-diyl group; a cyclododecanediyl group, such as a cyclododecane-1,2-diyl group, a cyclododecane-1,3-diyl group, a cyclododecane-1,4-diyl group, and a cyclododecane-1,5-diyl group; a cyclotetradecanediyl group, such as a cyclotetradecane-1,2-diyl group, a cyclotetradecane-1,3-diyl group, a cyclotetradecane-1,4-diyl group, a cyclotetradecane-1,5-diyl group, and a cyclotetradecane-1,7-diyl group; and a cycloeicosanediyl group, such as a cycloeicosane-1,2-diyl group and a cycloeicosane-1,10-diyl group.

Examples of the divalent alicyclic fused ring group of 10 to 30 carbon atoms may include a decalindiyl group, such as a decalin-2,5-diyl group and a decalin-2,7-diyl group; an adamantanediyl group, such as an adamantane-1,2-diyl group and an adamantane-1,3-diyl group; and a bicyclo[2.2.1]heptanediyl group, such as a bicyclo[2.2.1]heptane-2,3-diyl group, a bicyclo[2.2.1]heptane-2,5-diyl group, and a bicyclo[2.2.1]heptane-2,6-diyl group.

The divalent alicyclic hydrocarbon groups may further have a substituent at any position. Examples of the substituent may include those described as the substituent in the aromatic ring of $A^x$ described above.

Among these, $A^2$ and $A^3$ are preferably a divalent alicyclic hydrocarbon group of 3 to 12 carbon atoms, more preferably a cycloalkanediyl group of 3 to 12 carbon atoms, further preferably a group represented by each of the following formulae (A31) to (A34), and particularly preferably the group represented by the following formula (A32).

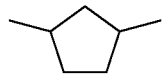

(A31)

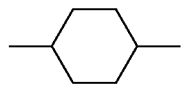

(A32)

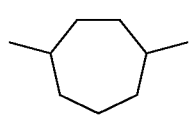

(A33)

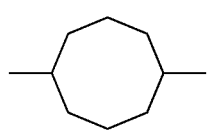

(A34)

The divalent alicyclic hydrocarbon group of 3 to 30 carbon atoms may exist in forms of cis- and trans-stereoisomers that are on the basis of difference of stereoconfiguration of carbon atoms bonded to $Y^1$ and $Y^3$ (or $Y^2$ and $Y^4$). For example, when the group is a cyclohexane-1,4-diyl group, a cis-isomer (A32a) and a trans-isomer (A32b) may exist, as described below.

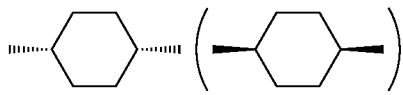

(A32a)

(A32b)

The aforementioned divalent alicyclic hydrocarbon group of 3 to 30 carbon atoms may be a cis-isomer, a trans-isomer, or an isomeric mixture of cis- and trans-isomers. Since the orientation quality is favorable, the group is preferably the trans-isomer or the cis-isomer, and more preferably the trans-isomer.

In the formula (I) mentioned above, $A^4$ and $A^5$ are each independently a divalent aromatic group of 6 to 30 carbon atoms optionally having a substituent. The aromatic group of $A^4$ and $A^5$ may be monocyclic or polycyclic. Specific preferable examples of $A^4$ and $A^5$ are as follows.

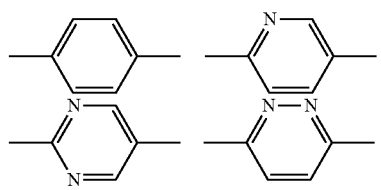

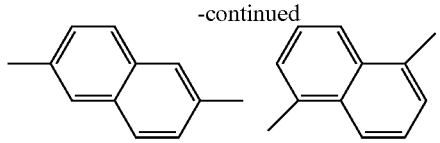

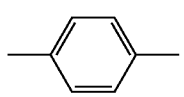

The divalent aromatic groups of $A^4$ and $A^5$ described above may have a substituent at any position. Examples of the substituent may include a halogen atom, a cyano group, a hydroxyl group, an alkyl group of 1 to 6 carbon atoms, an alkoxy group of 1 to 6 carbon atoms, a nitro group, and a —C(=O)—OR$^{8b}$ group. Herein, R$^{8b}$ is an alkyl group of 1 to 6 carbon atoms. In particular, it is preferable that the substituent is a halogen atom, an alkyl group of 1 to 6 carbon atoms, or an alkoxy group. Of the halogen atoms, a fluorine atom is more preferable, of the alkyl groups of 1 to 6 carbon atoms, a methyl group, an ethyl group, and a propyl group are more preferable, and of the alkoxy groups, a methoxy group and an ethoxy group are more preferable.

Among these, from the viewpoint of favorably expressing the desired effect of the present invention, $A^4$ and $A^5$ are each independently preferably a group represented by the following formula (A41), (A42), or (A43) and optionally having a substituent, and particularly preferably the group represented by the formula (A41) and optionally having a substituent.

(A41)

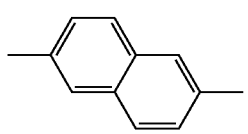

(A42)

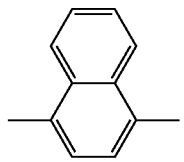

(A43)

In the formula (I) mentioned above, $Q^1$ is a hydrogen atom or an alkyl group of 1 to 6 carbon atoms optionally having a substituent. Examples of the alkyl group of 1 to 6 carbon atoms optionally having a substituent may include the alkyl group of 1 to 6 carbon atoms among the alkyl groups of 1 to 20 carbon atoms optionally having a substituent that are described as $A^y$ described above. Among these, $Q^1$ is preferably a hydrogen atom or an alkyl group of 1 to 6 carbon atoms, and more preferably a hydrogen atom or a methyl group.

In the formula (I) mentioned above, m each independently represents 0 or 1. Among these, m is preferably 1.

The compound (I) may be produced, for example, by a reaction of a hydrazine compound and a carbonyl compound as disclosed in International Publication No. 2012/147904.

Subsequently, the mesogen compound with reverse wavelength distribution will be described.

The mesogen compound with reverse wavelength distribution is a compound that does not solely exhibit liquid crystal property, and has a property such that the evaluation mixture obtained by mixing the mesogen compound with reverse wavelength distribution with an evaluator liquid crystal compound at a specific mixing ratio exhibits liquid crystal property. As the evaluator liquid crystal compound, a liquid crystal compound with forward wavelength distribution, which is a liquid crystal compound exhibiting an in-plane retardation with forward wavelength distribution during homogeneous orientation, is used. When the liquid crystal compound with forward wavelength distribution is used as the evaluator liquid crystal compound, wavelength distribution of in-plane retardation of the mesogen compound with reverse wavelength distribution during homogeneous orientation of the evaluation mixture can be easily evaluated. In particular, it is preferable that the evaluator liquid crystal compound is a liquid crystal compound having a rod-shaped structure that may form a liquid crystal phase at 100° C. Specific examples of particularly preferable evaluator liquid crystal compounds may include a liquid crystal compound "LC242" with forward wavelength distribution having a structure represented by the following formula (E1) and a liquid crystal compound with forward wavelength distribution having a structure represented by the following formula (E2). In the following formula, Me is a methyl group.

(E1)

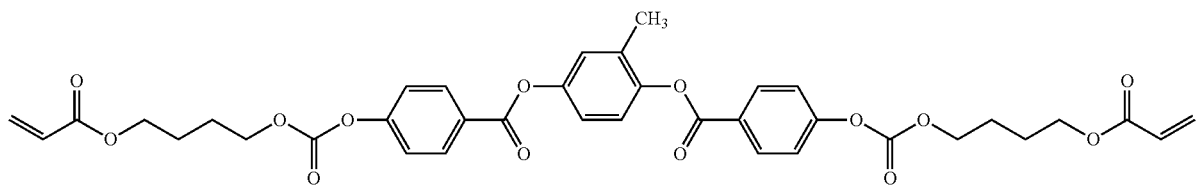

(E2)

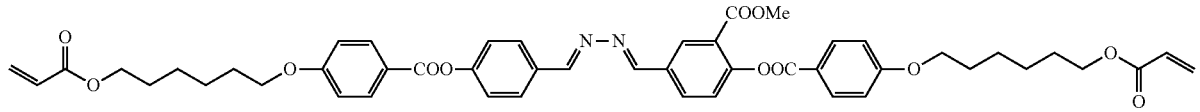

The mixing ratio of the mesogen compound with reverse wavelength distribution mixed with the evaluator liquid crystal compound to obtain the evaluation mixture is usually at least any one ratio in a range of 30 parts by weight to 70 parts by weight relative to 100 parts by weight of the total of the evaluator liquid crystal compound and the mesogen compound with reverse wavelength distribution. Thus, as long as the evaluation mixture having liquid crystal property is obtained by mixing the mesogen compound with reverse wavelength distribution with the evaluator liquid crystal compound at at least any one mixing ratio of the mesogen compound falling within the range of 30 parts by weight to 70 parts by weight relative to 100 parts by weight of the total of the evaluator liquid crystal compound and the mesogen compound with reverse wavelength distribution, a mixture obtained by mixing the mesogen compound with reverse wavelength distribution with the evaluator liquid crystal compound at another mixing ratio of the mesogen compound with reverse wavelength distribution falling within the range of 30 parts by weight to 70 parts by weight relative to 100 parts by weight of the total of the evaluator liquid crystal compound and the mesogen compound with reverse wavelength distribution may not exhibit liquid crystal property.

Whether or not the evaluation mixture exhibits liquid crystal property may be confirmed by the following method. The evaluation mixture is applied onto a substrate and dried to obtain a sample film including the substrate and a layer of the evaluation mixture. The sample film is disposed on a hot stage. While the sample film is observed by a polarized light microscope, the sample film is heated. When phase transition of the layer of the evaluation mixture to a liquid crystal phase is observed, the evaluation mixture can be judged to exhibit liquid crystal property.

When the aforementioned evaluation mixture is homogeneously oriented, the mesogen compound with reverse wavelength distribution in the evaluation mixture exhibits an in-plane retardation with reverse wavelength distribution. Herein, that the evaluation mixture is homogeneously oriented means that a layer of the evaluation mixture is formed and the evaluator liquid crystal compound in the layer is homogeneously oriented. Therefore, in the evaluation mixture homogeneously oriented, the long-axis direction of the mesogen skeleton of molecule of the evaluator liquid crystal compound is usually oriented in a direction parallel to the plane of the layer.

That the mesogen compound with reverse wavelength distribution in the evaluation mixture homogeneously oriented exhibits an in-plane retardation with reverse wavelength distribution means that the in-plane retardations Re(450) and Re(550) at wavelengths of 450 nm and 550 nm, respectively, of the mesogen compound with reverse wavelength distribution contained in the evaluation mixture satisfy Re(450)/Re(550)<1.00.

However, in the layer of the evaluation mixture, it is difficult to selectively measure only an in-plane retardation of the mesogen compound with reverse wavelength distribution. Whether or not the mesogen compound with reverse wavelength distribution in the evaluation mixture exhibits an in-plane retardation with reverse wavelength distribution may be confirmed by the following confirmation method taking advantage of the nature of the evaluator liquid crystal compound being the liquid crystal compound with forward wavelength distribution.

A liquid crystal layer containing the evaluator liquid crystal compound as the liquid crystal compound with forward wavelength distribution is formed, and the evaluator liquid crystal compound in the liquid crystal layer is homogeneously oriented. The ratio Re(X450)/Re(X550) of the in-plane retardation Re(X450) of the liquid crystal layer at a wavelength of 450 nm relative to the in-plane retardation Re(X550) thereof at a wavelength of 550 nm is measured.

Separately, a layer of the evaluation mixture containing the evaluator liquid crystal compound and the mesogen compound with reverse wavelength distribution is formed and the evaluation mixture in the layer of the evaluation mixture is homogeneously oriented. The ratio Re(Y450)/Re(Y550) of the in-plane retardation Re(Y450) of the layer of the evaluation mixture at a wavelength of 450 nm relative to the in-plane retardation Re(Y550) thereof at a wavelength of 550 nm is measured.

When the measurement results shows that the retardation ratio Re(Y450)/Re(Y550) of the layer of the evaluation mixture containing the mesogen compound with reverse wavelength distribution is smaller than the retardation ratio Re(X450)/Re(X550) of the liquid crystal layer containing no mesogen compound with reverse wavelength distribution, it can be determined that the mesogen compound with reverse wavelength distribution exhibits an in-plane retardation with reverse wavelength distribution.

From the viewpoint of favorably exhibiting the desired effects of the present invention, it is preferable that the ratio Re(Y650)/Re(Y550) of the in-plane retardation Re(Y650) of the layer of the evaluation mixture at a wavelength of 650 nm relative to the in-plane retardation Re(Y550) thereof at a wavelength of 550 nm is higher than the ratio Re(X650)/Re(X550) of the in-plane retardation Re(X650) of the liquid crystal layer at a wavelength of 650 nm relative to the in-plane retardation Re(X550) thereof at a wavelength of 550 nm in the aforementioned confirmation method.

As the mesogen compound with reverse wavelength distribution, for example, a compound having a main chain mesogen skeleton and a side chain mesogen skeleton bonded to the main chain mesogen skeleton in the molecule of the mesogen compound with reverse wavelength distribution may be used.

Further, it is preferable that the mesogen compound with reverse wavelength distribution has polymerizability. It is thus preferable that the mesogen compound with reverse wavelength distribution has a polymerizable group. When a mesogen compound with reverse wavelength distribution having polymerizability is used, the orientation state of the mesogen compound with reverse wavelength distribution can be easily fixed by polymerization. Therefore, an optically anisotropic layer having stable optical properties can be easily obtained.

When the mesogen compound with reverse wavelength distribution is a monomer, the molecular weight thereof is preferably 300 or more, more preferably 700 or more, and particularly preferably 1,000 or more, and is preferably 2,000 or less, more preferably 1,700 or less, and particularly preferably 1,500 or less. When the mesogen compound with reverse wavelength distribution has the aforementioned molecular weight, the coating property of a coating liquid for forming the optically anisotropic layer can be particularly improved.

As the mesogen compound with reverse wavelength distribution, one type thereof may be solely used, and two or more types thereof may also be used in combination at any ratio.

Examples of the mesogen compound with reverse wavelength distribution may include compounds that do not exhibit liquid crystal property among the compounds represented by the aforementioned formula (Ia). Preferable examples of the mesogen compound with reverse wavelength distribution may include compounds that do not exhibit liquid crystal property among the compounds represented by the aforementioned formula (I). In particular, examples of preferable mesogen compound with reverse wavelength distribution may include the following compounds.

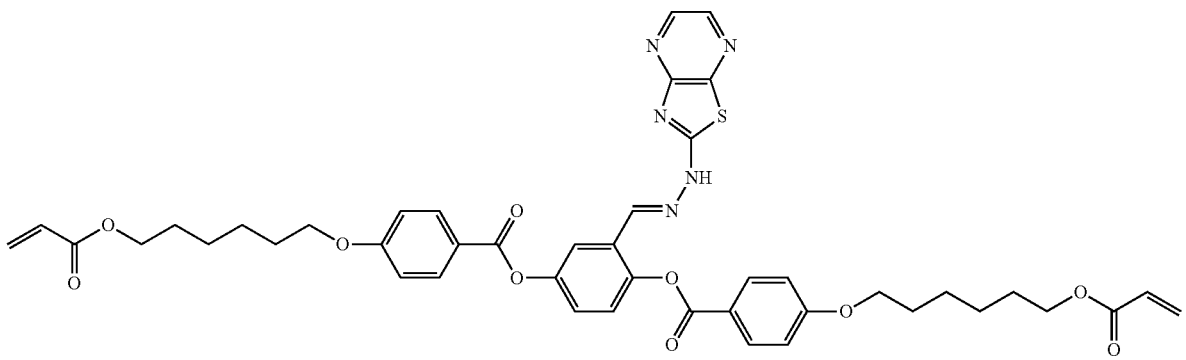

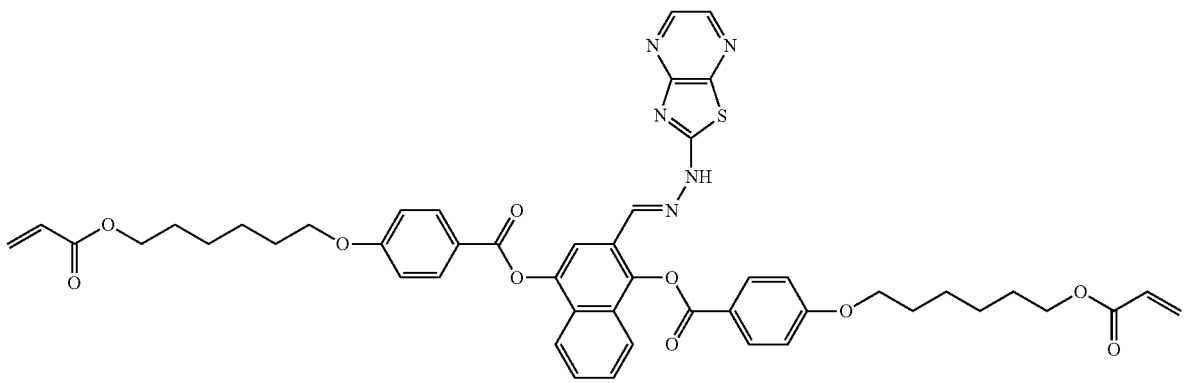

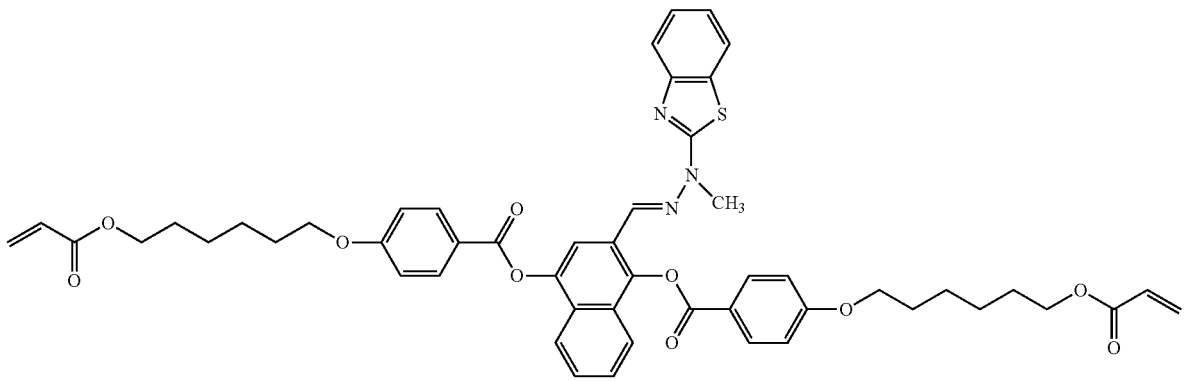

-continued

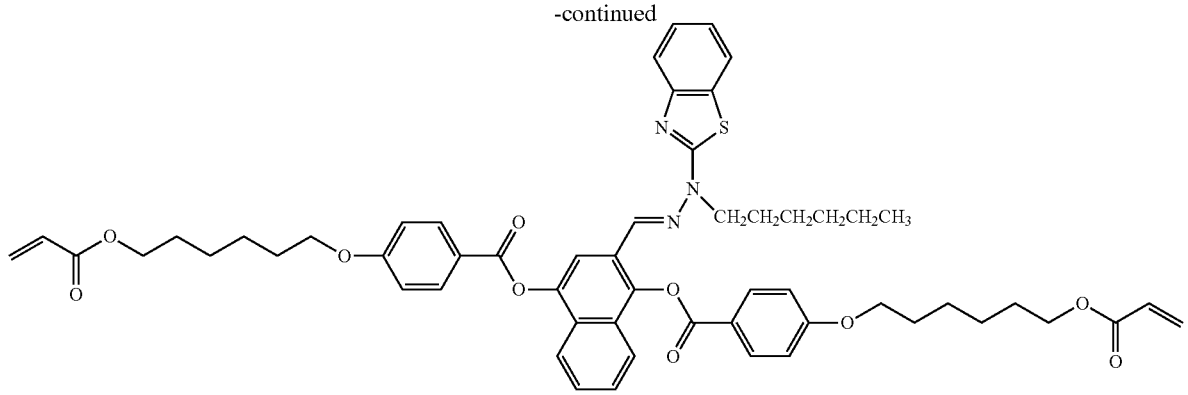

Among the aforementioned mesogen compounds, a mesogen compound containing, in the molecule thereof, at least one selected from the group consisting of a benzothiazole ring (ring represented by the following formula (10A)); and a combination of a cyclohexyl ring (ring represented by the following formula (10B)) and a phenyl ring (ring represented by the following formula (10C)), is preferable from the viewpoint of favorably exhibiting the desired effects of the present invention.

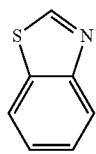
(10A)

(10B)

(10C)

The ratio of the mesogen compound in the total solid content of the optically anisotropic layer is preferably 20% by weight or more, more preferably 30% by weight or more, further preferably 35% by weight or more, and particularly preferably 40% by weight or more, and is preferably 60% by weight or less, more preferably 55% by weight or less, further preferably 50% by weight or less, and particularly preferably 45% by weight or less. When the ratio of the mesogen compound is equal to or more than the lower limit value of the aforementioned range, the wavelength distribution of the thickness direction retardation Rth of the optically anisotropic layer can be easily made closer to reverse distribution. When the ratio is equal to or less than the upper limit value of the aforementioned range, the mesogen compound can be uniformly dispersed in the optically anisotropic layer, and the mechanical strength of the optically anisotropic layer can be enhanced.

[1.3. Optional Component]

The optically anisotropic layer may further contain an optional component in combination with the positive C polymer and the mesogen compound.

[1.4. Properties of Optically Anisotropic Layer]

The optically anisotropic layer has refractive indices $nx(A)$, $ny(A)$, and $nz(A)$ that satisfy $nz(A) > nx(A) \geq ny(A)$. Herein, $nx(A)$ represents a refractive index in a direction which, among in-plane directions of the optically anisotropic layer, gives the maximum refractive index, $ny(A)$ represents a refractive index in a direction which is perpendicular to the direction of $nx(A)$ among the in-plane directions of the optically anisotropic layer, and $nz(A)$ represents a refractive index in a thickness direction of the optically anisotropic layer. The optically anisotropic layer having such refractive indices $nx(A)$, $ny(A)$, and $nz(A)$ may be used as a positive C film. Therefore, when the optically anisotropic layer is incorporated into a circularly polarizing plate and applied to an image display device, suppression of external light reflection and passage of image displaying light through polarized sunglasses can be achieved even in a tilt direction with respect to the display surface of the image display device. Further, when the image display device is a liquid crystal display device, the viewing angle can be usually increased. Thus, visibility of the image when the display surface of the image display device is observed in a tilt direction can be enhanced.

The values of the refractive indices $nx(A)$ and $ny(A)$ of the optically anisotropic layer are preferably the same as each other or close to each other. Specifically, the difference $nx(A)-ny(A)$ between the refractive indices $nx(A)$ and $ny(A)$ is preferably 0.00000 to 0.00100, more preferably 0.00000 to 0.00050, and particularly preferably 0.00000 to 0.00020. When the refractive index difference $nx(A)-ny(A)$ falls within the aforementioned range, the optical design for providing the optically anisotropic layer in an image display device can be made simple, and adjustment of a bonding direction during bonding to another phase difference film can be eliminated.

The thickness direction retardation $Rth(A450)$ of the optically anisotropic layer at a wavelength of 450 nm, the thickness direction retardation $Rth(A550)$ of the optically anisotropic layer at a wavelength of 550 nm, and the thickness direction retardation $Rth(A650)$ of the optically anisotropic layer at a wavelength of 650 nm usually satisfy the following expressions (1) and (2):

$$0.50 < Rth(A450)/Rth(A550) < 1.00 \quad (1), \text{ and}$$

$$1.00 \leq Rth(A650)/Rth(A550) < 1.25 \quad (2).$$

The aforementioned expression (1) will be described in detail. $Rth(A450)/Rth(A550)$ is usually more than 0.50, preferably more than 0.60, and more preferably more than 0.65, and is usually less than 1.00, preferably less than 0.90, and more preferably less than 0.85.

The aforementioned expression (2) will be described in detail. Rth(A650)/Rth(A550) is usually 1.00 or more, preferably 1.01 or more, and more preferably 1.02 or more, and is usually less than 1.25, preferably less than 1.15, and more preferably less than 1.10.

The optically anisotropic layer having the thickness direction retardations Rth(A450), Rth(550), and Rth(A650) that satisfy the aforementioned expressions (1) and (2) has the thickness direction retardation Rth exhibiting reverse wavelength distribution. When the optically anisotropic layer in which the thickness direction retardation Rth exhibits reverse wavelength distribution is incorporated into a circularly polarizing plate and applied to an image display device, functions to achieve suppression of external light reflection and passage of image displaying light through polarized sunglasses can be exerted in a wide wavelength range even in a tilt direction with respect to the display surface of the image display device. Further, when the image display device is a liquid crystal display device, the viewing angle can be usually effectively increased. Accordingly, the visibility of the image displayed on the display surface can be especially effectively improved.

The mechanism by which an optically anisotropic layer containing the positive C polymer and the mesogen compound in combination can exert the aforementioned optical properties is estimated as follows from the investigation of the present inventor. However, the technical scope of the present invention is not restricted by the mechanism described below.

In general, the birefringence of the liquid crystal layer containing the liquid crystal compound depends on the orientation state of the molecule of the liquid crystal compound in the liquid crystal layer. Therefore, to obtain a positive C film that is a film having a high refractive index in the thickness direction, the molecule of the liquid crystal compound is often oriented in the thickness direction of the liquid crystal layer. In the cases in prior art wherein orientation of the molecule of the liquid crystal compound in the thickness direction as described above is desired, a vertical orientation agent has been used.

When the liquid crystal layer is formed using the vertical orientation agent, usually a coating liquid containing the liquid crystal compound and the vertical orientation agent is prepared, applied, and dried, to obtain the liquid crystal layer. The molecule of the liquid crystal compound with reverse wavelength distribution has a specific steric structure. Therefore, even when the liquid crystal layer is formed by a prior art method using the vertical orientation agent, the tilt angle of molecule of the liquid crystal compound is made ununiform. Thus, there is a difficulty in obtaining a favorable liquid crystal layer. Specifically, in the liquid crystal layer produced by the prior art production method, a plurality of liquid crystal domains are formed as an aggregation of liquid crystal compound having the same tilt angle. However, since there exists a difference in the tilt angles between the liquid crystal domains, reflection, refraction, or dispersion of light occurs over the entire liquid crystal layer, and the liquid crystal layer is clouded. Herein, the tilt angle represents an angle of an orientation axis of molecule of a liquid crystal compound relative to a reference surface.

On the other hand, the positive C polymer contained in the optically anisotropic layer of the present invention generally includes a side chain having a rigid structure such as a naphthalene ring and a biphenyl group, with the side chain intersecting a main chain. In the optically anisotropic layer containing the positive C polymer, the main chain of the positive C polymer lies so as to be parallel to the in-plane direction of the optically anisotropic layer and the side chain thereof stands up in the thickness direction of the optically anisotropic layer. Therefore, when the positive C polymer is combined with the mesogen compound, the direction of molecule of the mesogen compound is corrected by the side chain of the positive C polymer. Therefore, the molecule of the mesogen compound is oriented so that the long-axis direction of the molecule becomes parallel to the thickness direction of the optically anisotropic layer. Accordingly, a high refractive index is exhibited in the thickness direction of the optically anisotropic layer. Thereby the optically anisotropic layer of the present invention exhibits a refractive index capable of functioning as a positive C film.

Further, the liquid crystal compound with reverse wavelength distribution and the mesogen compound such as the mesogen compound with reverse wavelength distribution are compounds that may exhibit an in-plane retardation with reverse wavelength distribution. Therefore, the thickness direction retardation of the optically anisotropy containing the mesogen compound in which the molecule is oriented in the thickness direction can exhibit reverse wavelength distribution.

It is considered that by such a function the optically anisotropic layer of the present invention can exert the aforementioned optical properties.

It is preferable that the in-plane retardation Re(A590) of the optically anisotropic layer at a wavelength of 590 nm satisfies the following expression (3):

$$Re(A590) \leq 10 \text{ nm} \tag{3}$$

The aforementioned expression (3) will be described in detail. Re(A590) is preferably 0 nm to 10 nm, more preferably 0 nm to 5 nm, and particularly preferably 0 nm to 2 nm. When Re(A590) falls within the aforementioned range, the optical design for providing the optically anisotropic layer in an image display device can be made simple and adjustment of bonding direction during bonding to another phase difference film can be eliminated.

It is preferable that the thickness direction retardation Rth(A590) of the optically anisotropic layer at a wavelength of 590 nm satisfies the following expression (4):

$$-200 \text{ nm} \leq Rth(A590) \leq -10 \text{ nm} \tag{4}$$

The aforementioned expression (4) will be described in detail. Rth(A590) is preferably −200 nm or more, more preferably −130 nm or more, and particularly preferably −100 nm or more, and is preferably −10 nm or less, more preferably −30 nm or less, and particularly preferably −50 nm or less. When such an optically anisotropic layer having Rth(A590) is incorporated into a circularly polarizing plate and applied to an image display device, suppression of external light reflection, reduction in color tone change of the reflected light, and passage of image displaying light through polarized sunglasses can be achieved even in a tilt direction with respect to the display surface of the image display device. Further, when the image display device is a liquid crystal display device, the viewing angle can be usually increased. Thus, when the display surface of the image display device is observed in a tilt direction, the visibility of the image can be enhanced.

The total light transmittance of the optically anisotropic layer is preferably 80% or more, more preferably 85% or more, and particularly preferably 90% or more. The total light transmittance may be measured in the wavelength range of 400 nm to 700 nm using an ultraviolet-visible spectrometer.

The haze of the optically anisotropic layer is preferably 5% or less, more preferably 3% or less, particularly preferably 1% or less, and ideally 0%. As the haze, an average value calculated from haze values measured at five points by using a "turbidimeter NDH-300A" manufactured by Nippon Denshoku Industries Co., Ltd., in accordance with JIS K7361-1997 may be adopted.

It is preferable that the optically anisotropic layer does not exhibit liquid crystal property. When the optically anisotropic layer does not exhibit liquid crystal property, the positive C polymer and the mesogen compound can be favorably dispersed in the optically anisotropic layer. In addition, as to an optically anisotropic layer having no liquid crystal property, occurrence of ununiformity in the mesogen compound orientation due to influence of air fluctuation such as drying wind can be suppressed during production of the optically anisotropic layer using the coating liquid.

The thickness of the optically anisotropic layer may be appropriately adjusted so as to obtain a desired retardation. The specific thickness of the optically anisotropic layer is preferably 1.0 μm or more, and more preferably 3.0 μm or more, and is preferably 50 μm or less, more preferably 40 μm or less, and particularly preferably 30 μm or less.

[1.5. Method for Producing Optically Anisotropic Layer]

The optically anisotropic layer may be produced by a production method including a step of preparing a coating liquid containing a positive C polymer, a mesogen compound, and a solvent; a step of applying the coating liquid onto a support surface to obtain a coating liquid layer; and a step of drying the coating liquid layer.

In the step of preparing a coating liquid, usually, a positive C polymer, a mesogen compound, and a solvent are mixed to obtain a coating liquid. The ratio of the positive C polymer and the mesogen compound in the total solid content of the coating liquid may be adjusted to the same range as the ratio of the positive C polymer and the mesogen compound in the total solid content of the optically anisotropic layer.

As the solvent, organic solvents are usually used. Examples of such organic solvents may include a hydrocarbon solvent such as cyclopentane and cyclohexane; a ketone solvent such as cyclopentanone, cyclohexanone, methyl ethyl ketone, acetone, methyl isobutyl ketone, and N-methylpyrrolidone; an acetate ester solvent such as butyl acetate and amyl acetate; a halogenated hydrocarbon solvent such as chloroform, dichloromethane, and dichloroethane; an ether solvent such as 1,4-dioxane, cyclopentyl methyl ether, tetrahydrofuran, tetrahydropyran, 1,3-dioxolane, and 1,2-dimethoxyethane; an aromatic hydrocarbon solvent such as toluene, xylene, and mesitylene; and mixtures thereof. The boiling point of the solvent is preferably 60° C. to 250° C., and more preferably 60° C. to 150° C. from the viewpoint of excellent handleability. As the solvent, one type thereof may be solely used, and two or more types thereof may also be used in combination at any ratio.

It is preferable that the amount of the solvent is adjusted so that the solid content concentration of the coating liquid falls within a desired range. The solid content concentration of the coating liquid is preferably 6% by weight or more, more preferably 8% by weight or more, and particularly preferably 10% by weight or more, and is preferably 20% by weight or less, more preferably 18% by weight or less, and particularly preferably 15% by weight or less. When the solid content concentration of the coating liquid falls within the aforementioned range, the optically anisotropic layer having desired optical properties can be easily formed.

The coating liquid to be used for forming the optically anisotropic layer may contain an optional component in combination with the positive C polymer, the mesogen compound, and the solvent. As the optional component, one type thereof may be solely used, and two or more types thereof may also be used in combination at any ratio.

The coating liquid may contain, for example, a plasticizer as an optional component. Examples of the plasticizer may include triphenyl phosphate, and glyceryl triacetate. As the plasticizer, one type thereof may be solely used, and two or more types thereof may also be used in combination at any ratio.

The amount of the plasticizer is preferably 2 parts by weight or more, more preferably 5 parts by weight or more, and particularly preferably 8 parts by weight or more, and is preferably 15 parts by weight or less, preferably 12 parts by weight or less, and particularly preferably 10 parts by weight or less, relative to 100 parts by weight of the positive C polymer. When the amount of the plasticizer is adjusted to fall within the aforementioned range, embrittlement of the optically anisotropic layer can be suppressed, and thereby mechanical strength can be increased.

The coating liquid may contain, for example, a polymerization initiator as an optional component. The type of the polymerization initiator may be appropriately selected depending on the type of the polymerizable group contained in the polymerizable compound in the coating liquid. Herein, the polymerizable compound is a generic term for compounds having polymerizability. Among these, a photopolymerization initiator is preferable. Examples of the photopolymerization initiator may include a radical polymerization initiator, an anionic polymerization initiator, and a cationic polymerization initiator. Specific examples of a commercially available photopolymerization initiator may include trade name: Irgacure 907, trade name: Irgacure 184, trade name: Irgacure 369, trade name: Irgacure 651, trade name: Irgacure 819, trade name: Irgacure 907, trade name: Irgacure 379, trade name: Irgacure 379EG, and trade name: Irgacure OXE02, manufactured by BASF, and trade name: Adeca Optomer N1919, manufactured by ADEKA Corporation. As the polymerization initiator, one type thereof may be solely used, and two or more types thereof may also be used in combination at any ratio.

The amount of the polymerization initiator is preferably 0.1 part by weight or more, and more preferably 0.5 part by weight or more, and is preferably 30 parts by weight or less, and more preferably 10 parts by weight or less, relative to 100 parts by weight of the polymerizable compound.

The coating liquid may further contain, as an optional component, optional additives such as a metal, a metal complex, a dye, a pigment, a fluorescent material, a phosphorescent material, a leveling agent, a thixotropic agent, a gelling agent, a polysaccharide, a surfactant, an ultraviolet absorber, an infrared absorber, an antioxidant, an ion exchange resin, and a metal oxide such as titanium oxide. The ratio of each of such optional additives is preferably 0.1 part by weight to 20 parts by weight relative to 100 parts by weight of the positive C polymer.

It is preferable that the coating liquid does not exhibit liquid crystal property. When a coating liquid that does not exhibit liquid crystal property is used, the positive C polymer and the mesogen compound can be dispersed well in the optically anisotropic layer. In addition, when a coating liquid not having liquid crystal property is used, it is possible to suppress occurrence of ununiformity in mesogen compound orientation due to influence of air fluctuation such as drying wind.

After the coating liquid is prepared as described above, the coating liquid is applied onto the support surface to obtain a coating liquid layer. As the support surface, any surface capable of supporting the coating liquid layer may be used. As the support surface, from the viewpoint of improving the surface state of the optically anisotropic layer, a flat surface without concave portions and convex portions is usually used. As the support surface, the surface of a long-length substrate is preferably used. When the long-length substrate is used, the coating liquid can be continuously applied onto the substrate that is continuously conveyed. Accordingly, when the long-length substrate is used, the optically anisotropic layer can be continuously produced. Therefore, the productivity can be improved.

When the coating liquid is applied onto a substrate, it is preferable that an appropriate tensile force (usually 100 N/m to 500 N/m) is applied to the substrate to suppress flopping of the substrate during conveyance and maintain the flatness during coating. The flatness is the swung amount of the substrate in its widthwise direction and up/down direction perpendicular to the conveyance direction of the substrate, and is ideally 0 mm, and usually 1 mm or less.

As the substrate, a substrate film is usually used. As the substrate film, a film usable as a substrate for an optical layered body may be appropriately selected for use. In particular, a transparent film is preferable as the substrate film from the viewpoint of rendering a multilayer film including the substrate film and the optically anisotropic layer available as an optical film to thereby eliminate the need of peeling the optically anisotropic layer from the substrate film. Specifically, the total light transmittance of the substrate film is preferably 80% or more, more preferably 85% or more, and particularly preferably 88% or more.

The material of the substrate film is not particularly limited, and various resins may be used. Examples of the resin may include resins containing various polymers. Examples of the polymer may include an alicyclic structure-containing polymer, a cellulose ester, a polyvinyl alcohol, a polyimide, a UV transparent acrylic, a polycarbonate, a polysulfone, a polyether sulfone, an epoxy polymer, a polystyrene, and combinations thereof. Among these, from the viewpoint of transparency, low hygroscopicity, size stability, and light-weight property, an alicyclic structure-containing polymer and a cellulose ester are preferable, and an alicyclic structure-containing polymer is more preferable.

The alicyclic structure-containing polymer is a polymer having an alicyclic structure in the repeating unit, and is usually an amorphous polymer. As the alicyclic structure-containing polymer, any of a polymer containing an alicyclic structure in the main chain and a polymer containing an alicyclic structure in the side chain may be used.

Examples of the alicyclic structure may include a cycloalkane structure, and a cycloalkene structure, and a cycloalkane structure is preferable from the viewpoint of thermal stability and the like.

The number of carbon atoms constituting one alicyclic structure repeating unit is not particularly limited, but is preferably 4 or more, more preferably 5 or more, and particularly preferably 6 or more, and is preferably 30 or less, more preferably 20 or less, and particularly preferably 15 or less.

The ratio of the repeating unit having the alicyclic structure in the alicyclic structure-containing polymer may be appropriately selected according to the use purpose, and is preferably 50% by weight or more, more preferably 70% by weight or more, and particularly preferably 90% by weight or more. When the repeating unit having the alicyclic structure is increased to the aforementioned level, heat resistance of the substrate film can be enhanced.

Examples of the alicyclic structure-containing polymer may include (1) a norbornene polymer, (2) a monocycle cyclic olefin polymer, (3) a cyclic conjugated diene polymer, (4) a vinyl alicyclic hydrocarbon polymer, and hydrogenated products of these. Among these, a norbornene polymer is more preferable from the viewpoint of transparency and moldability.

Examples of the norbornene polymer may include a ring-opening polymer of a norbornene monomer, a ring-opening copolymer of a norbornene monomer with another monomer ring-opening copolymerizable therewith, and hydrogenated products thereof; an addition polymer of a norbornene monomer, and an addition copolymer of a norbornene monomer with another monomer copolymerizable therewith. Among these, from the viewpoint of transparency, a hydrogenated product of a ring-opening polymer of a norbornene monomer is particularly preferable.

The above-described alicyclic structure-containing polymer may be selected from publicly known polymers disclosed in, for example, Japanese Patent Application Laid-Open No. 2002-321302 A and the like.

The glass transition temperature of the alicyclic structure-containing polymer is preferably 80° C. or more, and more preferably in a range of 100° C. to 250° C. The alicyclic structure-containing polymer having a glass transition temperature falling within such a range has low tendency to cause deformation and stress in use under high temperature, and is excellent in durability.

The weight-average molecular weight (Mw) of the alicyclic structure-containing polymer is preferably 10,000 to 100,000, more preferably 25,000 to 80,000, and further more preferably 25,000 to 50,000. When the weight-average molecular weight falls within such a range, the mechanical strength and molding processability of the substrate film are highly balanced, thus being suitable. The above-mentioned weight-average molecular weight may be measured as a polyisoprene-equivalent value by gel permeation chromatography (hereinafter abbreviated as "GPC") using cyclohexane as a solvent. When the resin is not dissolved in cyclohexane, the weight-average molecular weight may be measured as a polystyrene-equivalent value by the GPC using toluene as a solvent.

The molecular weight distribution (weight-average molecular weight (Mw)/number-average molecular weight (Mn)) of the alicyclic structure-containing polymer is preferably 1 or more, and more preferably 1.2 or more, and is preferably 10 or less, more preferably 4 or less, and particularly preferably 3.5 or less.

When a resin containing the alicyclic structure-containing polymer is used as the material of the substrate film, the thickness of the substrate film is preferably 1 μm to 1,000 μm, more preferably 5 μm to 300 μm, and particularly preferably 30 μm to 100 μm, from the viewpoint of productivity improvement, thickness reduction, and weight reduction.

The resin containing the alicyclic structure-containing polymer may be composed solely of the alicyclic structure-containing polymer. However, the polymer may contain an optional additive as long as the effect of the present invention is not significantly impaired. The ratio of the alicyclic structure-containing polymer in the resin containing the alicyclic structure-containing polymer is preferably 70% by weight or more, and more preferably 80% by weight or more.

Suitable specific examples of the resin containing the alicyclic structure-containing polymer may include "ZEONOR 1420" and "ZEONOR 1420 R" manufactured by ZEON Corporation.

As the cellulose ester, lower fatty acid esters of cellulose (for example, cellulose acetate, cellulose acetate butyrate, and cellulose acetate propionate) are representative examples. Lower fatty acid means a fatty acid of 6 or less carbon atoms per molecule. Examples of the cellulose acetate may include triacetyl cellulose (TAC) and cellulose diacetate (DAC).

The degree of acetylation of cellulose acetate is preferably 50% to 70%, and particularly preferably 55% to 65%. The weight-average molecular weight is preferably 70,000 to 120,000, and particularly preferably 80,000 to 100,000. In addition, the aforementioned cellulose acetate may be esterified with not only acetic acid but also partially with a fatty acid such as propionic acid and butyric acid. Further, the resin constituting the substrate film may contain cellulose acetate in combination with cellulose ester other than cellulose acetate (cellulose propionate, cellulose butyrate, and the like). In that case, it is preferable that the entirety of these cellulose esters satisfies the degree of acetylation described above.

When a film of triacetylcellulose is used as the substrate film, such a film is particularly preferably a triacetylcellulose film formed using triacetylcellulose dope that is prepared by dissolving triacetylcellulose in a solvent essentially free of dichloromethane by a low-temperature dissolution method or a high-temperature dissolution method, from the viewpoint of environmental conservation. The film of triacetylcellulose may be produced by a co-casting method. The co-casting method may be performed by preparing a solution (dope) containing raw material flakes of triacetylcellulose and a solvent, and as necessary, an optional additive, casting the dope on a support from a dope supply device (die), drying the cast material to some extent, peeling the cast material as a film from the support when rigidity has been imparted thereto, and further drying the film to remove the solvent. Examples of the solvent in which the raw material flakes are dissolved may include a halogenated hydrocarbon solvent (dichloromethane, etc.), an alcohol solvent (methanol, ethanol, butanol, etc.), an ester solvent (methyl formate, methyl acetate, etc.), and an ether solvent (dioxane, dioxolane, diethyl ether, etc.). Examples of the additive contained in the dope may include a retardation-increasing agent, a plasticizer, an ultraviolet absorber, a deterioration preventing agent, a lubricant, and a peeling accelerator. Examples of the support on which the dope is cast may include a horizontal endless metal belt and a rotating drum. For casting, a single dope may be cast in a single layer. Alternatively, co-casting of a plurality of layers may also be performed. In co-casting of a plurality of layers, for example, a plurality of dopes may be successively cast so that a layer of a low-concentration cellulose ester dope and layers of a high-concentration cellulose ester dope in contact with the front and back surfaces of the layer of the low-concentration cellulose ester dope are formed. Examples of a method for drying the film to remove the solvent may include a method of conveying the film to pass the film through a drying portion of which the interior portion is under conditions suitable for drying.

Preferable examples of the film of triacetylcellulose may include "TAC-TD80U" manufactured by Fuji Photo Film Co., Ltd. and those disclosed in JIII journal of technical disclosure Publication No. 2001-1745. The thickness of the film of triacetylcellulose is not particularly limited, but is preferably 20 μm to 150 μm, more preferably 40 μm to 130 μm, and still more preferably 70 μm to 120 μm.

Examples of the coating method of the coating liquid may include a curtain coating method, an extrusion coating method, a roll coating method, a spin coating method, a dip coating method, a bar coating method, a spray coating method, a slide coating method, a printing coating method, a gravure coating method, a die coating method, a gap coating method, and a dipping method. The thickness of the coating liquid to be applied may be appropriately set according to a desired thickness required for the optically anisotropic layer.

After the coating liquid is applied onto the support surface to obtain a coating liquid layer, the step of drying the coating liquid layer is carried out. By drying, the solvent is removed from the coating liquid layer to obtain the optically anisotropic layer. The drying method may be any drying method such as heat drying, reduced pressure drying, reduced pressure heating drying, and natural drying.

By the above-described method for producing the optically anisotropic layer, an optically anisotropic layer can be produced by a simple operation of applying the coating liquid containing a combination of the positive C polymer and the mesogen compound and drying. Therefore, an orientation film such as those described in Patent Literature 1 is unnecessary. Therefore, it is unnecessary to perform operations such as adjustment of the compatibility between the liquid crystal with reverse wavelength distribution and the orientation film and formation of the orientation film, so that the optically anisotropic layer can be easily produced.

Further, the coating liquid containing the positive C polymer and the mesogen compound in combination can suppress occurrence of ununiformity in the mesogen compound orientation due to influence of air fluctuation during drying. Consequently, an optically anisotropic layer in which the orientation state is uniform at a wide area in the in-plane direction can be easily obtained. Therefore, an optically anisotropic layer having an excellent surface state can be easily obtained. Accordingly, clouding due to orientation ununiformity of the optically anisotropic layer can be suppressed.

In addition to the aforementioned steps, the method for producing an optically anisotropic layer may further include an optional step. For example, in the method for producing an optically anisotropic layer, a step of fixing the orientation state of the mesogen compound in the optically anisotropic layer obtained after drying may be performed. In this step, the orientation state of the mesogen compound is usually fixed by polymerizing the mesogen compound.

For polymerization of the mesogen compound, a method that is suited to the properties of components contained in the coating liquid, such as the polymerizable compound and the polymerization initiator, may be appropriately selected. For example, a method of light irradiation is preferable. Herein, the light for irradiation may include visible light, ultraviolet light, and infrared light. Among these, a method of irradiation with ultraviolet light is preferable in terms of easy operation. The irradiation intensity of ultraviolet light is preferably in a range of 0.1 mW/cm$^2$ to 1,000 mW/cm$^2$, and more preferably in a range of 0.5 mW/cm$^2$ to 600 mW/cm$^2$. The irradiation time of ultraviolet light is preferably in a range of 1 second to 300 seconds, and more preferably in a range of 5 seconds to 100 seconds. The cumulative amount of ultraviolet light (mJ/cm$^2$) is determined by multiplying the ultraviolet irradiation intensity (mW/cm$^2$) by the irradiation time (sec). As an irradiation light source of ultraviolet light, a high-pressure mercury lamp, a metal halide lamp, or a low-pressure mercury lamp may be used. It is preferable that to perform the polymerization of the mesogen compound under an inactive gas atmosphere such as a nitrogen atmosphere. This is because thereby the ratio of residual monomer tends to be decreased.

The method for producing an optically anisotropic layer may include, for example, a step of peeling the optically anisotropic layer from the substrate.

[2. Optically Anisotropic Transfer Body]

The optically anisotropic transfer body of the present invention includes a substrate and the aforementioned optically anisotropic layer. Herein, an optically anisotropic transfer body is a member including a plurality of layers and is used in production process by transferring a part of the plurality of the layers to produce a product that includes the part of the layers. In the optically anisotropic transfer body of the present invention, the optically anisotropic layer is used in the production of the aforementioned product.

As the substrate, the same substrate as those described in the method for producing an optically anisotropic layer may be used. In particular, a substrate that can be peeled is preferable. An optically anisotropic transfer body including such a substrate may be produced by the aforementioned method for producing an optically anisotropic layer using the substrate.

The optically anisotropic transfer body may be used in production of an optical film. For example, an optical film including the optically anisotropic layer and a resin film may be produced by bonding the optically anisotropic layer of the optically anisotropic transfer body to a resin film, and then peeling the substrate.

[3. Optically Anisotropic Layered Body] The optically anisotropic layered body of the present invention includes the above-described optically anisotropic layer and a phase difference layer.

[3.1. Optically Anisotropic Layer in Optically Anisotropic Layered Body]

As the optically anisotropic layer of the optically anisotropic layered body, the aforementioned optically anisotropic layer may be used. In the optically anisotropic layered body, it is preferable that the in-plane retardation Re(A590) of the optically anisotropic layer at a wavelength of 590 nm and the thickness direction retardation Rth(A590) of the optically anisotropic layer at a wavelength of 590 nm satisfy the following expressions (8) and (9):

$$Re(A590) \leq 10 \text{ nm} \quad (8), \text{ and}$$

$$-110 \text{ nm} \leq Rth(A590) \leq -20 \text{ nm} \quad (9).$$

The aforementioned expression (8) will be described in detail. Re(A590) is preferably 0 nm to 10 nm, more preferably 0 nm to 5 nm, and particularly preferably 0 nm to 2 nm. When Re(A590) falls within the aforementioned range, the optical design for providing the optically anisotropic layered body in an image display device can be made simple.

The aforementioned expression (9) will be described in detail. Rth(A590) is preferably −110 nm or more, and more preferably −100 nm or more, and is preferably −20 nm or less, and more preferably −40 nm or less, and particularly preferably −50 nm or less. When an optically anisotropic layered body including an optically anisotropic layer having such Rth(A590) is incorporated into a circularly polarizing plate and is applied to an image display device, functions to achieve suppression of external light reflection and passage of image displaying light through polarized sunglasses can be effectively exerted even in a tilt direction with respect to the display surface of the image display device. Accordingly, the visibility of the image displayed on the display surface of the image display device that is viewed in a tilt direction can be effectively enhanced.

[3.2. Phase Difference Layer in Optically Anisotropic Layered Body]

(3.2.1. Optical Properties of Phase Difference Layer)

The phase difference layer is a layer of which refractive indices nx(B), ny(B), and nz(B) satisfy nx(B)>ny(B)≥nz(B). Herein, nx(B) represents a refractive index in a direction which, among in-plane directions of the phase difference layer, gives the maximum refractive index, ny(B) represents a refractive index in a direction that is perpendicular to the direction of nx(B) among the in-plane directions of the phase difference layer, and nz(B) represents a refractive index in a thickness direction of the phase difference layer. The optically anisotropic layered body including such a phase difference layer may be combined with a linear polarizer to produce a circularly polarizing plate. Regarding the cases wherein the display surface is viewed in a front direction, provision of this circularly polarizing plate to a display surface of an image display device can realize suppression of external light reflection and also realize passage of light for displaying an image through polarized sunglasses. Therefore, the visibility of the image can be enhanced.

In particular, the refractive indices ny(B) and nz(B) of the phase difference layer are preferably the same as each other or close to each other. Specifically, the absolute value |ny(B)−nz(B)| of difference between the refractive indices ny(B) and nz(B) is preferably 0.00000 to 0.00100, more preferably 0.00000 to 0.00050, and particularly preferably 0.00000 to 0.00020. When the absolute value |ny(B)−nz(B)| of difference between the refractive indices falls within the aforementioned range, the optical design for providing the optically anisotropic layered body to an image display device can be made simple.

The in-plane retardation Re(B590) of the phase difference layer at a wavelength of 590 nm preferably satisfies the following expression (7):

$$110 \text{ nm} \leq Re(B590) \leq 170 \text{ nm} \quad (7).$$

The aforementioned expression (7) will be described in detail. Re(B590) is preferably 110 nm or more, more preferably 120 nm or more, and particularly preferably 130 nm or more, and is preferably 170 nm or less, more preferably 160 nm or less, and particularly preferably 150 nm or less. An optically anisotropic layered body including a phase difference layer having such Re(B590) may be combined with a linear polarizer to obtain a circularly polarizing plate. Regarding the cases wherein the display surface is viewed in a front direction, provision of this circularly polarizing plate to a display surface of an image display device can realize suppression of external light reflection and also realize passage of light for displaying an image through polarized sunglasses. Therefore, the visibility of the image can be enhanced.

The in-plane retardation Re(B450) of the phase difference layer at a wavelength of 450 nm, the in-plane retardation Re(B550) of the phase difference layer at a wavelength of 550 nm, and the in-plane retardation Re(B650) of the phase difference layer at a wavelength of 650 nm preferably satisfy the following expressions (5) and (6):

$$0.75 < Re(B450)/Re(B550) < 1.00 \quad (5), \text{ and}$$

$$1.01 < Re(B650)/Re(B550) < 1.25 \quad (6).$$

The aforementioned expression (5) will be described in detail. Re(B450)/Re(B550) is preferably more than 0.75, more preferably more than 0.78, and particularly preferably more than 0.80, and is preferably less than 1.00, more preferably less than 0.95, and particularly preferably less than 0.90.

The aforementioned expression (6) will be described in detail. Re(B650)/Re(B550) is preferably more than 1.01, more preferably more than 1.02, and particularly preferably more than 1.04, and is preferably less than 1.25, more preferably less than 1.22, and particularly preferably less than 1.19.

A phase difference layer having the in-plane retardations Re(B450), Re(B550), and Re(B650) satisfying the aforementioned expressions (5) and (6) has an in-plane retardation Re exhibiting reverse wavelength distribution. When an optically anisotropic layered body including such a phase difference layer having the in-plane retardation Re exhibiting reverse wavelength distribution is incorporated into a circularly polarizing plate and is applied to an image display device, functions to achieve suppression of external light reflection and passage of image displaying light through polarized sunglasses can be exerted in a wide wavelength range in a front direction with respect to the display surface of the image display device. Therefore, the visibility of the image displayed on the display surface can be especially effectively improved.

The in-plane slow axis direction of the phase difference layer may be at any direction, and may be optionally set depending on applications of the optically anisotropic layered body. In particular, when the optically anisotropic layered body is a long-length film, an angle formed between the slow axis of the phase difference layer and the widthwise direction of the film is preferably larger than 0° and less than 90°. In one aspect, the angle formed between the in-plane slow axis of the phase difference layer and the widthwise direction of the film may fall within a specific range such as preferably 15°±5°, 22.5°±5°, 45°±5°, or 75°±5°, more preferably 15°±4°, 22.5°±4°, 45°±4°, or 75°±4°, and further preferably 15°±3°, 22.5°±3°, 45°±3°, or 75°±3°. When such an angle relationship is satisfied, a circularly polarizing plate can be effectively produced by bonding the optically anisotropic layered body to a long-length linear polarizer in a roll-to-roll manner.

The total light transmittance of the phase difference layer is preferably 80% or more, more preferably 85% or more, and particularly preferably 90% or more. The haze of the phase difference layer is preferably 5% or less, more preferably 3% or less, particularly preferably 1% or less, and ideally 0%.

(3.2.2. Stretched Film Layer as Phase Difference Layer)

As the phase difference layer as described above, a stretched film layer may be used. When a stretched film layer is used as the phase difference layer, the stretched film layer may contain a resin that is a material of the substrate film described in the method for producing the optically anisotropic layer. A film layer containing such a resin can exhibit optical properties such as retardation by subjecting it to a stretching treatment. Among these, the aforementioned stretched film layer preferably contains an alicyclic structure-containing polymer.

The stretching direction of the stretched film layer may be any direction. Therefore, the stretching direction may be a lengthwise direction, a widthwise direction, or an oblique direction. Furthermore, the stretching may be performed in two or more directions among these stretching directions. Herein, the oblique direction refers to a direction which, among in-plane directions of the film, is parallel to none of the lengthwise direction and the widthwise direction.

Among these, the stretched film layer is preferably an obliquely stretched film layer. That is, it is preferable that the stretched film layer is a long-length film and is a film stretched in a direction parallel to none of the lengthwise direction and the widthwise direction of the film. In the case of an obliquely stretched film layer, the angle between the film width direction and the stretching direction may be specifically larger than 0° and less than 90°. When such an obliquely stretched film layer is used as a phase difference layer, it is possible to efficiently produce a circularly polarizing plate by bonding an optically anisotropic layered body to a long-length linear polarizer in a roll-to-roll manner.

The angle formed between the stretching direction and the widthwise direction of the film may fall within a specific range such as preferably 15°±5°, 22.5°±5°, 45°±5°, or 75°±5°, more preferably 15°±4°, 22.5°±4°, 45°±4°, or 75°±4°, and further more preferably 15°±3°, 22.5°±3°, 45°±3°, or 75°±3°. When such an angular relationship is satisfied, it is possible to use the optically anisotropic layered body as a material that enables efficient production of the circularly polarizing plate.

Further, it is preferable that the stretched film layer has a multilayer structure including a plurality of layers. The stretched film layer having a multilayer structure can exert various properties depending on the combination of the functions of the respective layers included in the stretched film layer. For example, the stretched film layer preferably includes a first outer layer formed of a resin containing a polymer, an intermediate layer formed of a resin containing a polymer and an ultraviolet absorber, and a second outer layer formed of a resin containing a polymer in this order. In this case, although the polymers contained in respective layers may be different from each other, it is preferable that they are the same as each other. Such a stretched film layer including the first outer layer, the intermediate layer, and the second outer layer can suppress the transmission of ultraviolet rays. In addition, since the first outer layer and the second outer layer are provided on respective sides of the intermediate layer, bleed-out of the ultraviolet absorber can be suppressed.

The amount of the ultraviolet absorber in the resin contained in the intermediate layer is preferably 3% by weight or more, more preferably 4% by weight or more, and particularly preferably 5% by weight or more, and is preferably 20% by weight or less, more preferably 18% Or less, and particularly preferably 16 wt. % Or less. When the amount of the ultraviolet absorber is equal to or more than the lower limit value of the aforementioned range, the ability of the stretched film layer to prevent the transmission of ultraviolet light can be particularly enhanced. When the amount is equal to or less than the upper limit value of the aforementioned range, the transparency of the stretched film layer to visible light can be enhanced.

The thickness of the intermediate layer is preferably set so that the ratio represented by "the thickness of the intermediate layer"/"the entire thickness of the stretched film layer" falls within a specific range. The specific range is preferably 1/5 or more, more preferably 1/4 or more, and particularly preferably 1/3 or more, and is preferably 80/82 or less, more preferably 79/82 or less, and particularly preferably 78/82 or less. When the ratio is equal to or more than the lower limit value of the aforementioned range, the ability of the stretched film layer to prevent the transmission of ultraviolet light can be particularly enhanced. When the ratio is equal to or less than the upper limit value of the aforementioned range, the thickness of the stretched film layer can be reduced.

The thickness of the stretched film layer as the phase difference layer is preferably 10 µm or more, more preferably 13 µm or more, and particularly preferably 15 µm or more, and is preferably 60 µm or less, more preferably 58 µm or less, and particularly preferably 55 µm or less. When the thickness of the stretched film layer is equal to or more than the lower limit value of the aforementioned range, desired retardation can be exhibited. When the thickness is equal to or less than the upper limit value of the aforementioned range, the thickness of the stretched film layer can be reduced.

The stretched film layer may be produced by a method including, for example, a step of preparing a pre-stretch film layer and a step of stretching the prepared pre-stretch film layer.

The pre-stretch film layer may be produced, for example, by molding a resin to be a material of the stretched film layer by an appropriate molding method. Examples of the molding methods may include a cast molding method, an extrusion molding method, and an inflation molding method. Among these, a melt extrusion method without using a solvent can effectively reduce the amount of residual volatile components, and is therefore preferable from the viewpoint of the global environment and the working environment as well as the excellent production efficiency. As the melt extrusion method, an inflation method using a die or the like may be mentioned, and among these, a method using a T die is preferable from the viewpoint of excellent productivity and thickness accuracy.

When the stretched film layer having a multilayer structure is produced, a pre-stretch film layer having a multilayer structure is usually prepared as the pre-stretch film layer. The pre-stretch film layer having such a multilayer structure may be produced by molding resins corresponding to respective layers included in the multilayer structure by a molding method such as, for example, a co-extrusion method and a co-casting method. Among these molding methods, a co-extrusion method is preferable because of its excellent production efficiency and low tendency to cause remaining of volatile components in the film. Examples of the co-extrusion method may include a co-extrusion T die method, a co-extrusion inflation method, and a co-extrusion lamination method. Among these, a co-extrusion T die method is preferable. Examples of the co-extrusion T die method may include a feed block method and a multi-manifold method, and a multi-manifold method is particularly preferable from the viewpoint of reducing variation in thickness.

By the molding of the resin in the aforementioned manner, a long-length pre-stretch film may be obtained. By stretching this pre-stretch film, a stretched film layer may be obtained. Stretching is usually performed continuously while the pre-stretch film is conveyed in the lengthwise direction. In this case, the stretching direction may be a lengthwise direction or a widthwise direction of the film, but it is preferable that the stretching direction is an oblique direction. The stretching may be free uniaxial stretching in which no restraining force is applied in directions other than the stretching direction, or may be stretching in which a restraining force is also applied in directions other than the stretching direction. The stretching may be performed using an optional stretching machine, such as a roll stretching machine and a tenter stretching machine.

The stretching ratio is preferably 1.1 times or more, more preferably 1.15 times or more, and particularly preferably 1.2 times or more, and is preferably 3.0 times or less, more preferably 2.8 times or less, and particularly preferably 2.6 times or less. When the stretching ratio is equal to or more than the lower limit value of the aforementioned range, the refractive index in the stretching direction can be increased. When the stretching ratio is equal to or less than the upper limit value, the slow axis direction of the stretched film layer can be easily controlled.

The stretching temperature is preferably Tg−5° C. or higher, more preferably Tg−2° C. or higher, and particularly preferably Tg° C. or higher, and is preferably Tg+40° C. or lower, more preferably Tg+35° C. or lower, and particularly preferably Tg+30° C. or lower. As used herein, "Tg" represents the highest temperature among the glass transition temperatures of polymers contained in the stretched film layer. When the stretching temperature falls within the aforementioned range, molecules contained in the pre-stretch film layer can be reliably oriented. Therefore, the stretched film layer capable of functioning as a phase difference layer having desired optical properties can be easily obtained.

(3.2.3. Liquid Crystal Layer as Phase Difference Layer)

As the phase difference layer as described above, a liquid crystal layer containing a liquid crystal compound whose orientation state may be fixed (hereinafter may be referred to as "liquid crystal compound for a phase difference layer" as appropriate) may be used. In this case, as the liquid crystal compound for a phase difference layer, it is preferable to use the homogeneously oriented liquid crystal compound with reverse wavelength distribution described above. This makes it possible to obtain the same advantages as described in the section on the optically anisotropic layer also in the phase difference layer. In particular, it is particularly preferable that the liquid crystal layer as the phase difference layer contains a liquid crystal compound represented by the following formula (II) whose orientation state may be fixed.

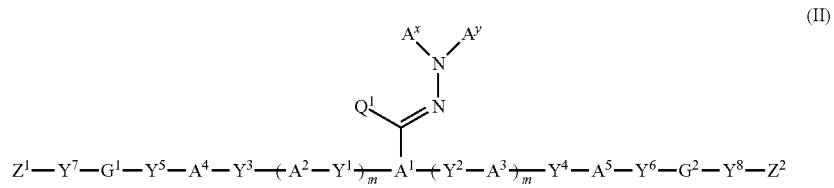

(II)

In the above-described formula (II), $Y^1$ to $Y^8$, $G^1$, $G^2$, $Z^1$, $Z^2$, $A^x$, $A^y$, $A^1$ to $A^5$, $Q^1$, and m represents the same meanings as those in the formula (I). Therefore, the liquid crystal compound represented by the formula (II) represents the same compound as the liquid crystal compound represented by the formula (I).

The thickness of the liquid crystal layer as the phase difference layer is not particularly limited, and may be appropriately adjusted so that properties such as retardation fall within desired ranges. Specifically, the thickness of the liquid crystal layer is preferably 0.5 μm or more, and more preferably 1.0 μm or more, and is preferably 10 μm or less, more preferably 7 μm or less, and particularly preferably 5 μm or less.

The liquid crystal layer as the phase difference layer may be produced by, for example, a method including a step of preparing a liquid crystal composition containing a liquid crystal compound for a phase difference layer; a step of applying the liquid crystal composition onto a support to obtain a layer of the liquid crystal composition; and a step of orienting the liquid crystal compound for a phase difference layer contained in the layer of the liquid crystal composition.

In the step of preparing a liquid crystal composition, the liquid crystal composition is usually obtained by mixing the liquid crystal compound for a phase difference layer with an optional component used as necessary.

The liquid crystal composition may contain a polymerizable monomer as an optional component. The term "polymerizable monomer" refers to a compound other than the liquid crystal compound for a phase difference layer described above, among the compounds having a polymerizability and capable of functioning as a monomer. As the polymerizable monomer, for example, those having one or more polymerizable groups per molecule may be used. When the polymerizable monomer is a crosslinkable monomer having two or more polymerizable groups per molecule, crosslinking polymerization can be achieved. Examples of such a polymerizable group may include the same groups as those of the groups $Z^1$—$Y^7$— and $Z^2$—$Y^8$— in the compound (I), and more specifically, may include an acryloyl group, a methacryloyl group, and an epoxy group. As the polymerizable monomer, one type thereof may be solely used, and two or more types thereof may also be used in combination at any ratio.

In the liquid crystal composition, the ratio of the polymerizable monomer is preferably 1 part by weight to 100 parts by weight, and more preferably 5 parts by weight to 50 parts by weight, relative to 100 parts by weight of the liquid crystal compound for a phase difference layer.

The liquid crystal composition may contain a photopolymerization initiator as an optional component. Examples of the polymerization initiator may include the same polymerization initiators as those which may be contained in the coating liquid for producing the optically anisotropic layer. As the polymerization initiator, one type thereof may be solely used, and two or more types thereof may also be used in combination at any ratio.

In the liquid crystal composition, the ratio of the polymerization initiator is preferably 0.1 part by weight to 30 parts by weight, and more preferably 0.5 part by weight to 10 parts by weight, relative to 100 parts by weight of the polymerizable compound.

The liquid crystal composition may contain a surfactant as an optional component. The surfactant is preferably a nonionic surfactant. As the nonionic surfactant, a commercially available product may be used. For example, a nonionic surfactant which is an oligomer having a molecular weight of about several thousand may be used. Specific examples of these surfactants may include PolyFox "PF-151N", "PF-636", "PF-6320", "PF-656", "PF-6520", "PF-3320", "PF-651", and "PF-652" manufactured by OMNOVA, Ftargent "FTX-209F", "FTX-208G", "FTX-204D", and "601AD" manufactured by Neos Co., Ltd., and Surflon "KH-40" and "S-420" manufactured by Seimi Chemical Co., Ltd. As the surfactant, one type thereof may be solely used, and two or more types thereof may also be used in combination at any ratio.

In the liquid crystal composition, the ratio of the surfactant is preferably 0.01 part by weight to 10 parts by weight, and more preferably 0.1 part by weight to 2 parts by weight, relative to 100 parts by weight of the polymerizable compound.

The liquid crystal composition may include a solvent as an optional component. Examples of the solvent may include the same solvents as those which may be contained in the coating liquid for producing the optically anisotropic layer. As the solvent, one type thereof may be solely used, and two or more types thereof may also be used in combination at any ratio.

In the liquid crystal composition, the ratio of the solvent is preferably 100 parts by weight to 1000 parts by weight relative to 100 parts by weight of the polymerizable compound.

The liquid crystal composition may further contain, as an optional component, additives such as a metal, a metal complex, a dye, a pigment, a fluorescent material, a phosphorescent material, a leveling agent, a thixotropic agent, a gelling agent, a polysaccharide, an ultraviolet absorber, an infrared absorber, an antioxidant, an ion exchange resin, and a metal oxide such as titanium oxide. The ratio of each of such additives is preferably 0.1 part by weight to 20 parts by weight relative to 100 parts by weight of the polymerizable compound.

After the liquid crystal composition as described above is prepared, a step of applying the liquid crystal composition onto a support to obtain a layer of the liquid crystal composition is performed. As the support, a long-length support is preferably used. When the long-length support is used, the liquid crystal composition can be continuously applied onto the support that is continuously conveyed. Accordingly, when the long-length support is used, the liquid crystal layer as the phase difference layer can be continuously produced. Therefore, the productivity can be improved.

When the liquid crystal composition is applied onto the support, it is preferable that an appropriate tensile force (usually 100 N/m to 500 N/m) is applied to the support to suppress flopping of the support during conveyance and maintain the flatness during coating. The flatness is the swung amount of the support in its widthwise direction and up/down direction perpendicular to the conveyance direction, and is ideally 0 mm, and usually 1 mm or less.

As the support, a support film is usually used. As the support film, a film usable as a support for an optical layered body may be appropriately selected for use. In particular, a transparent film is preferable as the support film from the viewpoint of rendering an optically anisotropic layered body including the phase difference layer and the optically anisotropic layer available as an optical film to thereby eliminate the need of peeling the support film. Specifically, the total light transmittance of the support film is preferably 80% or more, more preferably 85% or more, and particularly preferably 88% or more.

The material of the support film is not particularly limited, and various resins may be used. Examples of the resin may include resins containing polymers described as the materials for the substrate usable in forming the optically anisotropic layer. Among these, from the viewpoint of transparency, low hygroscopicity, size stability, and light-weight property, an alicyclic structure-containing polymer and a cellulose ester are preferable, and an alicyclic structure-containing polymer is more preferable, as the polymer contained in the resin.

As the support, one having an orientation regulating force may be used. The orientation regulating force of the support means a property of the support whereby the support can give orientation to the liquid crystal compound for a phase difference layer in the liquid crystal composition applied onto the support.

The orientation regulating force may be imparted by subjecting a member such as a film, which is a material of the support, to a treatment for imparting an orientation regulating force. Examples of such a treatment may include a stretching treatment and a rubbing treatment.

In a preferred aspect, the support is a stretched film. By using such a stretched film, it is possible to obtain a support having an orientation regulating force corresponding to the stretching direction.

The stretching direction of the stretched film may be any direction. Therefore, the stretching direction may be the lengthwise direction, widthwise direction, or oblique direction. Furthermore, the stretching may be performed in two or more directions among these stretching directions. The stretching ratio may be appropriately set within a range where an orientation regulating force is generated on the surface of the support. When the material of the support is a resin having a positive intrinsic birefringence value, the molecules are oriented in the stretching direction to exhibit a slow axis in the stretching direction. The stretching may be performed using a known stretching machine such as a tenter stretching machine.

In a further preferable aspect, the support is an obliquely stretched film. When the support is an obliquely stretched film, the angle between the stretching direction and the width direction of the stretched film may be specifically larger than 0° and less than 90°. When such an obliquely stretched film is used as the support, the optically anisotropic layered body can be used as a material capable of efficiently producing a circularly polarizing plate.

In a certain aspect, the angle formed between the stretching direction and the widthwise direction of the stretched film may fall within a specific range such as preferably 15°±5°, 22.5°±5°, 45°±5°, or 75°±5°, more preferably 15°±4°, 22.5°±4°, 45°±4°, or 75°±4°, and further more preferably 15°±3°, 22.5°±3°, 45°±3°, or 75°±3°. When such an angular relationship is satisfied, the optically anisotropic layered body can be used as a material capable of efficiently producing a circularly polarizing plate.

Examples of the application method of the liquid crystal composition may include a curtain coating method, an extrusion coating method, a roll coating method, a spin coating method, a dip coating method, a bar coating method, a spray coating method, a slide coating method, a printing coating method, a gravure coating method, a die coating method, a gap coating method, and a dipping method. The thickness of the layer of the liquid crystal composition to be applied may be appropriately set according to a desired thickness required for the liquid crystal layer as the phase difference layer.

After the layer of the liquid crystal composition is obtained by the application of the liquid crystal composition onto the support, the step of orienting the liquid crystal compound for a phase difference layer contained in the layer of the liquid crystal composition is performed. By this step, the liquid crystal compound for a phase difference layer contained in the layer of the liquid crystal composition is oriented in the orientation direction according to the orientation regulating force of the support. For example, when a stretched film is used as the support, the liquid crystal compound for a phase difference layer contained in the layer of the liquid crystal composition is oriented in a direction parallel to the stretching direction of the stretched film.

In some cases, the orientation of the liquid crystal compound for a phase difference layer may be achieved immediately by coating. In other cases, it may be achieved by performing an orientation treatment such as warming after coating, as necessary. The conditions for the orientation treatment may be appropriately set according to the properties of the liquid crystal composition to be used, but it may be, for example, a treatment condition of 30 seconds to 5 minutes under a temperature condition of 50° C. to 160° C.

By giving orientation to the liquid crystal compound for a phase difference layer in the layer of the liquid crystal composition as described above, desired optical properties are exhibited in the layer of the liquid crystal composition, and accordingly a liquid crystal layer which can function as a phase difference layer is obtained.

The above-described method for producing a liquid crystal layer as a phase difference layer may further include an optional step. In the method for producing the liquid crystal layer, for example, a step of drying the liquid crystal composition layer or the liquid crystal layer may be performed. Such drying may be accomplished by a drying method such as natural drying, heating drying, reduced pressure drying, and reduced pressure heating drying.

Further, in the method for producing a liquid crystal layer as a phase difference layer, for example, a step of fixing the orientation state of the liquid crystal compound for a phase difference layer may be performed after the liquid crystal compound for a phase difference layer contained in the liquid crystal composition is oriented. In this step, the orientation state of the liquid crystal compound for a phase difference layer is usually fixed by polymerizing the liquid crystal compound for a phase difference layer. By polymerizing the liquid crystal compound for a phase difference layer, the rigidity of the liquid crystal layer can be enhanced and the mechanical strength can thus be improved.

In the polymerization of the liquid crystal compound for a phase difference layer, a method suitable for the properties of the components of the liquid crystal composition may be appropriately selected. For example, a method of irradiating the compound with light is preferable. In particular, a method of irradiating with ultraviolet light is preferable because of its simple operation. Irradiation conditions such as ultraviolet irradiation intensity, ultraviolet irradiation time, cumulative amount of ultraviolet light, and ultraviolet irradiation light source and the like may be adjusted to the same range as the irradiation conditions in the method for producing the optically anisotropic layer.

During the polymerization, the liquid crystal compound for a phase difference layer usually polymerizes while maintaining the orientation of the molecules thereof. Thus, the polymerization may produce a liquid crystal layer containing the polymer of the liquid crystal compound for a phase difference layer which is oriented in a direction parallel to the orientation direction of the liquid crystal compound for a phase difference layer contained in the liquid crystal composition before polymerization. Thus, for example, when a stretched film is used as the support, a liquid crystal layer having an orientation direction parallel to the stretching direction of the stretched film can be obtained. Herein, the term "parallel" means that the deviation between the stretching direction of the stretched film and the orientation direction of the polymer of the liquid crystal compound for a phase difference layer is usually ±3°, preferably ±1°, and ideally 0°.

In the liquid crystal layer as the phase difference layer produced by the above-described production method, the molecules of the polymer obtained from the liquid crystal compound for a phase difference layer preferably have orientation regularity that is a horizontal orientation with respect to the support film. For example, when a support film having an orientation regulating force is used as the support film, the molecules of the polymer of the liquid crystal compound for a phase difference layer can be horizontally oriented in the liquid crystal layer. Herein, the term "horizontal orientation" of the molecules of the polymer of the liquid crystal compound for a phase difference layer with respect to the support film means an orientation in a certain direction such that the average direction of the long axis directions of the mesogen skeletons of the structural unit derived from the liquid crystal compound for a phase difference layer contained in the polymer is parallel to or close to parallel to the film surface (for example, the angle formed with the film surface is within 5°). When a plurality of types of mesogen skeletons having different orientation directions exist in the liquid crystal layer such as in the case where the compound represented by the formula (II) is used as the liquid crystal compound for a phase difference layer, the direction in which the long axis direction of the longest type mesogen skeleton among them is oriented is the orientation direction.

The method for producing the liquid crystal layer as the phase difference layer may include a step of peeling the support after obtaining the liquid crystal layer.

[3.3. Optional Layer in Optically Anisotropic Layered Body]

The optically anisotropic layered body may further include an optional layer in combination with the optically anisotropic layer and the phase difference layer. Examples of such an optional layer may include an adhesive layer, and a hard coat layer.

[3.4. Method for Producing Optically Anisotropic Layered Body]

The optically anisotropic layered body may be produced, for example, by the following production method 1 or 2.

Production Method 1:

A production method including a step of producing a phase difference layer, and a step of performing the method for producing the aforementioned optically anisotropic layer using the above-described phase difference layer as a substrate to form the optically anisotropic layer on the phase difference layer, for obtaining an optically anisotropic layered body.

When a coating liquid is applied onto the phase difference layer as in the production method 1, drying the coating liquid layer can form the optically anisotropic layer on the phase difference layer to obtain the optically anisotropic layered body.

Production Method 2:

A production method including a step of producing a phase difference layer, a step of producing an optically anisotropic transfer body, a step of bonding the optically anisotropic layer of the optically anisotropic transfer body to the phase difference layer to obtain an optically anisotropic layered body, and a step of peeling the substrate of the optically anisotropic transfer body.

When the optically anisotropic layered body is produced by bonding the optically anisotropic layer and the phase difference layer as in the production method 2, a suitable adhesive may be used for bonding. Examples of this adhesive may include the same adhesives as those used in the polarizing plate described later.

In addition to the above-described steps, the method for producing the optically anisotropic layered body may include an optional step. For example, the above-described production method may include a step of providing an optional layer such as a hard coat layer.

[4. Polarizing Plate]

The polarizing plate of the present invention includes a linear polarizer and the aforementioned optically anisotropic layer, optically anisotropic transfer body or optically anisotropic layered body. When the polarizing plate with such a configuration is provided to an image display device, the visibility of the image when the image display device is observed in a tilt direction can be enhanced.

As the linear polarizer, a known linear polarizer that has been used in devices such as liquid crystal display devices and other optical devices may be used. Examples of the linear polarizer may include a film obtained by giving a polyvinyl alcohol film an absorption treatment with iodine or dichromatic dye and then uniaxially stretching the polyvinyl alcohol film in a boric acid bath; and a film obtained by giving a polyvinyl alcohol film an absorption treatment with iodine or dichromatic dye, stretching the polyvinyl alcohol film, and then modifying a part of polyvinyl alcohol units in the molecular chain thereof into polyvinylene units. Other examples of the linear polarizer may include a polarizer having a function of separating polarized light into reflected light and transmitted light, such as a grid polarizer, a multilayer polarizer, or a cholesteric liquid crystal polarizer. Among these, a polarizer containing polyvinyl alcohol is preferably used as the linear polarizer.

When natural light is allowed to be incident on the linear polarizer, only one polarized light passes therethrough. The degree of polarization of the linear polarizer is not particularly limited, but is preferably 98% or more, and more preferably 99% or more.

The thickness of the linear polarizer is preferably 5 μm to 80 μm.

The polarizing plate may further include an adhesive layer for bonding the linear polarizer and the optically anisotropic layer, optically anisotropic transfer body or optically anisotropic layered body to each other. As the adhesive layer, a layer formed by curing a curable adhesive may be used. As the curable adhesive, a thermosetting adhesive may be used, but it is preferable to use a photocurable adhesive. As the photocurable adhesive, an adhesive containing a polymer or a reactive monomer may be used. The adhesive may contain a solvent, a photopolymerization initiator, other additives, and the like as necessary.

The photocurable adhesive is an adhesive that is capable of being cured by irradiation with light such as visible light, ultraviolet light, and infrared light. Among these, an adhesive which is capable of being cured by ultraviolet light is preferable because of its simple operation.

The thickness of the adhesive layer is preferably 0.5 μm or more, and more preferably 1 μm or more, and is preferably 30 μm or less, more preferably 20 μm or less, and still more preferably 10 μm or less. When the thickness of the adhesive layer falls within the aforementioned range, good adhesion can be achieved without impairing the optical properties of the optically anisotropic layered body.

When the polarizing plate includes the optically anisotropic layered body, the polarizing plate can function as a circularly polarizing plate. Such a circularly polarizing plate may include the linear polarizer, the optically anisotropic layer, and the phase difference layer in this order. Alternatively, such a circularly polarizing plate may include the linear polarizer, the phase difference layer, and the optically anisotropic layer in this order.

In the aforementioned circularly polarizing plate, an angle formed by the slow axis of the phase difference layer relative to the polarized light absorption axis of the linear polarizer is 45° or an angle close to 45°. Specifically, the angle is preferably 45°±5°, more preferably 45°±4°, and particularly preferably 45°±3°.

The aforementioned polarizing plate may further include an optional layer. The optional layer may include, for example, a polarizer protective film layer. As the polarizer protective film layer, any transparent film layer may be used. Among these, a film layer formed of a resin having excellent transparency, mechanical strength, thermal stability, moisture shielding property, and the like is preferable. Examples of such a resin may include an acetate resin such as triacetyl cellulose, a polyester resin, a polyethersulfone resin, a polycarbonate resin, a polyamide resin, a polyimide resin, a chain olefin resin, a cyclic olefin resin, and a (meth)acrylic resin. Examples of the optional layer which may be contained in the polarizing plate may include a hard coat layer such as an impact-resistant polymethacrylate resin layer, a mat layer for improving the sliding property of the film, an anti-reflection layer, and an anti-fouling layer. As these layers, one layer thereof may be solely provided, and two or more layers thereof may also be provided.

The polarizing plate may be produced by bonding the linear polarizer and the optically anisotropic layer, optically anisotropic transfer body or optically anisotropic layered body using an adhesive as necessary.

[5. Image Display Device]

An image display device of the present invention includes an image display element and the polarizing plate of the present invention described above. In the image display device, the polarizing plate is usually provided on the viewing side of the image display element. In this configuration, the orientation of the polarizing plate may be set to any direction according to the use application of the polarizing plate. Therefore, the image display device may include the optically anisotropic layer, optically anisotropic transfer body or optically anisotropic layered body; the polarizer; and the image display element in this order. Alternatively, the image display device may also include the polarizer; the optically anisotropic layer, optically anisotropic transfer body or optically anisotropic layered body; and the image display element in this order.

There are various types of image display devices depending on the type of image display element. Representative examples thereof may include a liquid crystal display device including a liquid crystal cell as an image display element, and an organic EL display device including an organic EL element as an image display element.

Hereinafter, preferable embodiments of the image display device will be described with reference to the drawings.

FIG. 1 is a cross-sectional view schematically illustrating an organic EL display device 100 as an image display device according to a first embodiment of the present invention.

As illustrated in FIG. 1, the organic EL display device 100 includes, in this order, an organic EL element 110 as an image display element; an optically anisotropic layered body 120 including a phase difference layer 121 and an optically anisotropic layer 122; and a linear polarizer 130. FIG. 1 illustrates an example in which the phase difference layer 121 and the optically anisotropic layer 122 are provided in this order from the organic EL element 110 side. Alternatively, inversely the optically anisotropic layer 122 and the phase difference layer 121 may be provided in this order from the organic EL element 110 side.

In the organic EL display device 100, the phase difference layer 121 is provided so that an angle formed by the slow axis of the phase difference layer 121 relative to the polarized light absorption axis of the linear polarizer 130 is 45° or an angle close to 45°. The angle of 45° or close to 45° is, for example, preferably 45°±5°, more preferably 45°±4°, and particularly preferably 45°±3°. By having such a feature, the function of a circularly polarizing plate is exhibited by a combination of the phase difference layer 121 and the linear polarizer 130. Thus, glare of a display surface 100U due to reflection of external light can be suppressed.

Specifically, when light is made incident from the outside of the device, only linearly polarized light constituting a portion of the light passes through the linear polarizer 130 and is then converted into circularly polarized light by passing through the optically anisotropic layered body 120 including the phase difference layer 121. The circularly polarized light is reflected on a component that reflects light in the display device (a reflection electrode (not illustrated) in the organic EL element 110, etc.), and then passes through the optically anisotropic layered body 120 again, resulting in linearly polarized light having a vibration direction orthogonal to a vibration direction of incident linearly polarized light. Thus, the light does not pass through the liner polarizer 130. The vibration direction of the linearly polarized light used herein means a vibration direction of an electric field of the linearly polarized light. Accordingly, a function of suppressing reflection is achieved (see Japanese Patent Application Laid-Open No. Hei. 9-127885 A for a principle of suppression of reflection in the organic EL display device).

Furthermore, since the optically anisotropic layered body 120 is provided with the optically anisotropic layer 122 which can function as a positive C film, the organic EL display device 100 can exert the reflection suppression function not only in the front direction of the display surface 100U but also in a tilt direction. Further, since the thickness direction retardation Rth of the optically anisotropic layer 122 exhibits reverse wavelength distribution, reflection of light in a wide wavelength range can be suppressed. Furthermore, as compared with the organic EL display device using the positive C film in which the thickness direction retardation exhibits the forward wavelength distribution, it is possible to suppress the color tone change of the reflected light when viewed in a tilt direction of the display surface 100U. Therefore, it is possible for the organic EL display device 100 to effectively suppress the reflection of external light in both the front direction and the tilt direction of the display surface 100U, thereby enhancing the visibility of the image.

Figure 2:
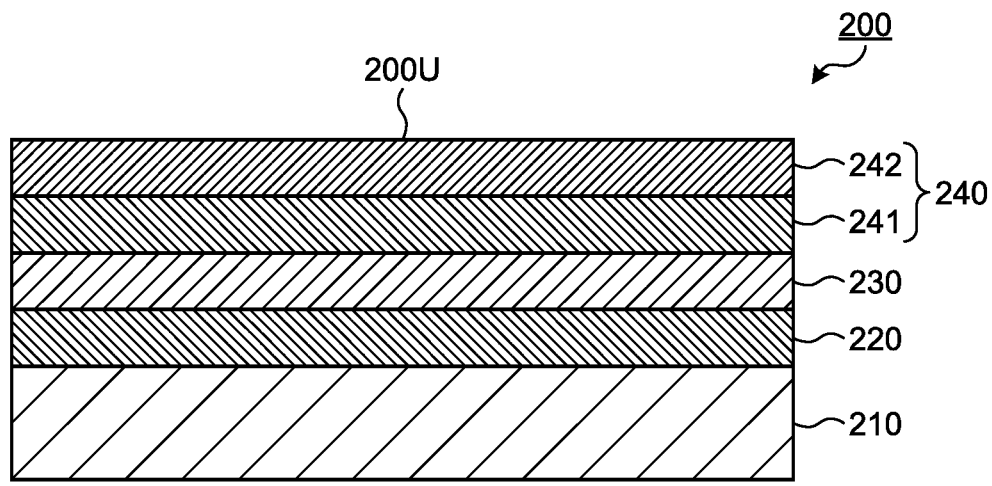
FIG. 2 is a cross-sectional view schematically illustrating an organic EL display device as an image display device according to a second embodiment of the present invention.

FIG. 2 is a cross-sectional view schematically illustrating an organic EL display device 200 as an image display device according to a second embodiment of the present invention.

As illustrated in FIG. 2, the organic EL display device 200 includes, in this order, an organic EL element 210 as an image display element; a λ/4 wave plate 220; a linear polarizer 230; and an optically anisotropic layered body 240 including a phase difference layer 241 and an optically anisotropic layer 242. FIG. 2 illustrates an example in which the phase difference layer 241 and the optically anisotropic layer 242 are provided in this order from the organic EL element 210 side. Alternatively, inversely the optically anisotropic layer 242 and the phase difference layer 241 may be provided in this order from the organic EL element 210 side.

As the λ/4 wave plate 220, a member that can convert linearly polarized light that has passed through the linear polarizer 230 into circularly polarized light may be used. As such a λ/4 wave plate 220, for example, a film having an in-plane retardation Re with the same range as that of the in-plane retardation Re which the phase difference layer 241 may have may be used. The λ/4 wave plate 220 is provided so that an angle formed by the slow axis of the λ/4 wave plate 220 relative to the polarized light absorption axis of the linear polarizer 230 is 45° or an angle close to 45°. The angle of 45° or close to 45° is, for example, preferably 45°±5°, more preferably 45°±4°, and particularly preferably 45°±3°. By having such a feature, the function of a circularly polarizing plate is exhibited by a combination of the λ/4 wave plate 220 and the linear polarizer 230. Thus, glare of a display surface 200U due to reflection of external light can be suppressed.

The phase difference layer 241 is provided in the organic EL display device 200 so that an angle formed by the slow axis of the phase difference layer 241 relative to the polarized light absorption axis of the linear polarizer 230 is 45° or an angle close to 45°. The angle of 45° or close to 45° is, for example, preferably 45°±5°, more preferably 45°±4°, and particularly preferably 45°±3°.

In such an organic EL display device 200, an image is displayed with light that has been emitted from the organic EL element 210, and passed through the λ/4 wave plate 220, the linear polarizer 230, and the optically anisotropic layered body 240. Therefore, the light for displaying an image is linearly polarized light at the time of passing through the linear polarizer 230, but is converted into circularly polarized light by passing through the optically anisotropic layered body 240 including the phase difference layer 241. Therefore, in the organic EL display device 200 described above, the image is displayed with circularly polarized light. Accordingly, the image can be visually recognized when the display surface 200U is viewed through polarized sunglasses.

In the organic EL display device 200, the optically anisotropic layered body 240 includes the optically anisotropic layer 242 that may function as a positive C film. Therefore, the light for displaying an image can pass through polarized sunglasses not only in a front direction of the display surface 200U but also in a tilt direction. Further, since the thickness direction retardation Rth of the optically anisotropic layer 242 exhibits reverse wavelength distribution, light in a wide wavelength range can pass through the polarized sunglasses. Therefore, the organic EL display device 200 can enhance the visibility of the image through the polarized sunglasses in both the front direction and the tilt direction of the display surface 200U.

The aforementioned organic EL elements 110 and 210 include a transparent electrode layer, a light-emitting layer, and an electrode layer in this order. When a voltage is applied to the transparent electrode layer and the electrode layer, the light-emitting layer can generate light. Examples of materials constituting the organic light-emitting layer may include a polyparaphenylene vinylene-based material, a polyfluorene-based material, and a polyvinyl carbazole-based material. In addition, the light-emitting layer may have a layered body of layers having different emission colors or a mixed layer in which a dye layer is doped with different dye. Further, the organic EL elements 110 and 210 may have functional layers such as a hole injection layer, a hole transport layer, an electron injection layer, an electron transport layer, an equipotential surface formation layer, and a electric charge generation layer.

Figure 3:
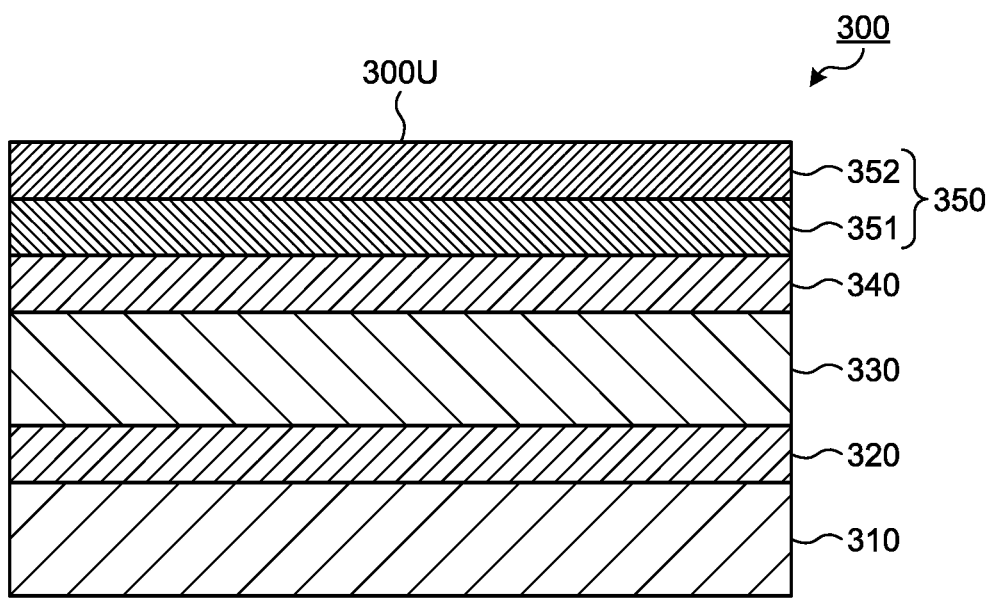
FIG. 3 is a cross-sectional view schematically illustrating a liquid crystal display device as an image display device according to a third embodiment of the present invention.

FIG. 3 is a cross-sectional view schematically illustrating a liquid crystal display device 300 as an image display device according to a third embodiment of the present invention.

As illustrated in FIG. 3, the liquid crystal display device 300 includes, in this order, a light source 310; a light source side linear polarizer 320; a liquid crystal cell 330 as an image display element; a viewing side linear polarizer 340; and an optically anisotropic layered body 350 including a phase difference layer 351 and an optically anisotropic layer 352. FIG. 3 illustrates an example in which the phase difference layer 351 and the optically anisotropic layer 352 are provided in this order from the liquid crystal cell 330 side. Alternatively, inversely the optically anisotropic layer 352 and the phase difference layer 351 may be provided in this order from the liquid crystal cell 330 side.

The phase difference layer 351 is provided in the liquid crystal display device 300 so that an angle formed by the slow axis of the phase difference layer 351 relative to the polarized light absorption axis of the viewing side linear polarizer 340 is 45° or an angle close to 45°. The angle of 45° or close to 45° is, for example, preferably 45°±5°, more preferably 45°±4°, and particularly preferably 45°±3°.

In such a liquid crystal display device 300, an image is displayed by light that has been emitted from the light source 310, and passed through the light source-side linear polarizer 320, the liquid crystal cell 330, the viewing side linear polarizer 340, and the optically anisotropic layered body 350. The light for displaying the image is linearly polarized light at the time of passing through the viewing side linear polarizer 340, but is converted into circularly polarized light by passing through the optically anisotropic layered body 350 including the phase difference layer 351. Therefore, in the liquid crystal display device 300 described above, the image is displayed with the circularly polarized light. Accordingly, the image can be visually recognized when the display surface 300U is viewed through polarization sunglasses.

In the liquid crystal display device 300, the optically anisotropic layered body 350 includes the optically anisotropic layer 352 that may function as a positive C film. Therefore, the light for displaying an image can pass through polarized sunglasses not only in a front direction of the display surface 300U but also in a tilt direction. Further, since the thickness direction retardation Rth of the optically anisotropic layer 352 exhibits reverse wavelength distribution, light in a wide wavelength range can pass through the polarized sunglasses. Therefore, the liquid crystal display device 300 can enhance the visibility of the image through the polarized sunglasses in both the front direction and the tilt direction of the display surface 300U.

As the liquid crystal cell 330, for example, a liquid crystal cell of any mode such as an in-plane switching (IPS) mode, a vertical alignment (VA) mode, a multi-domain vertical alignment (MVA) mode, a continuous pinwheel alignment (CPA) mode, a hybrid alignment nematic (HAN) mode, a twisted nematic (TN) mode, a super twisted nematic (STN) mode, and an optical compensated bend (OCB) mode may be used. Among these, the liquid crystal cell 330 of IPS mode is preferable since the viewing angle can be effectively increased by the optically anisotropic layer 352 and an effect of improving contrast and the color tone change during viewing the display surface 300U in a tilt direction can be exerted.

EXAMPLES

Hereinafter, the present invention will be specifically described by illustrating Examples. However, the present invention is not limited to the Examples described below. The present invention may be optionally modified for implementation without departing from the scope of claims of the present invention and the scope of their equivalents. In the following description, "%" and "part" representing quantity are on the basis of weight, unless otherwise specified. The operation described below was performed under the conditions of normal temperature and normal pressure in the atmospheric air, unless otherwise specified.

[Evaluation Method]
[Method for Measuring Retardation and Refractive Index and Method for Evaluating Reverse Wavelength Distribution Thereof]

The retardation and reverse wavelength distribution property of a sample layer (an optically anisotropic layer, a phase difference layer, etc.) formed on a certain film (a substrate film; a support film; a multilayer film composed of a support film and a phase difference layer, etc.) were measured by the following methods.

The sample layer as an evaluation subject was bonded to a slide glass with a tackiness agent (the tackiness agent was "CS9621T" available from Nitto Denko Corporation). After that, the film was peeled to obtain a sample including the slide glass and the sample layer. This sample was disposed on a stage of a phase difference meter (manufactured by Axometrics, Inc.), and the wavelength distribution of in-plane retardation Re of the sample layer was measured. Herein, the wavelength distribution of the in-plane retardation Re is represented in a form of a graph showing an in-plane retardation Re at each wavelength, for example, a graph having a coordinate in which the horizontal axis is wavelength and the vertical axis is in-plane retardation Re. From the obtained wavelength distribution of the in-plane retardation Re of the sample layer, the in-plane retardations Re(450), Re(550), Re(590), and Re(650) of the sample layer at wavelengths of 450 nm, 550 nm, 590 nm, and 650 nm, respectively, were determined.

The stage was tilted at 40° about a slow axis of the sample layer as a rotation axis, and the wavelength distribution of retardation Re40 of the sample layer in a tilt direction of 40° relative to a thickness direction of the sample layer was measured. Herein, the wavelength distribution of the retardation Re40 is represented in a form of a graph showing a retardation Re40 at each wavelength, for example, a graph having a coordinate in which the horizontal axis is wavelength and the vertical axis is in-plane retardation Re40.

Further, refractive indices nx in a direction which, among the in-plane directions of the sample layer, gave the maximum refractive index, refractive indices ny in a direction which was perpendicular to the direction of nx among the in-plane directions, and refractive indices nz in the thickness direction of the sample layer were measured by a prism coupler (manufactured by Metricon Corporation) at wavelengths of 407 nm, 532 nm, and 633 nm, and fit to a Cauchy model. As a result, wavelength distributions of the refractive indices nx, ny, and nz were obtained. Herein, the wavelength distribution of the refractive index is represented in a form of a graph showing a refractive index at each wavelength, for example, a graph having a coordinate in which the horizontal axis is wavelength and the vertical axis is refractive index.

Subsequently, the wavelength distribution of the thickness direction retardation Rth of the sample layer was calculated from data of the wavelength distribution of the retardation Re40 and the refractive indices. Herein, the wavelength distribution of the thickness direction retardation Rth is represented in a form of a graph showing a thickness direction retardation Rth at each wavelength, for example, a graph having a coordinate in which the horizontal axis is wavelength and the vertical axis is the thickness direction retardation Rth. From the obtained wavelength distribution of the thickness direction retardation Rth of the sample layer, the thickness direction retardations Rth(450), Rth(550), Rth (590), and Rth(650) of the sample layer at wavelengths of 450 nm, 550 nm, 590 nm, and 650 nm, respectively, were determined.

[Method for Measuring Thickness]

The thickness of a sample layer (an optically anisotropic layer, a phase difference layer, etc.) formed on a certain film (a substrate film; a support film; a multilayer film composed of a support film and a phase difference layer, etc.) was measured by a film thickness measurement device ("Filmetrics" manufactured by Filmetrics, Inc.).

[Method for Evaluating Surface State]

A glass plate with an optical tackiness agent (CS9621 available from Nitto Denko Corporation) was prepared. To the glass plate, the optically anisotropic layer of the optically anisotropic transfer body (Examples 1 to 2, 4, 5, 7, and 8, and Comparative Examples 1 to 4) or the optically anisotropic layered body (Example 3) was transferred to obtain a layered body for haze measurement. The haze of the optically anisotropic layer was measured using the layered body for haze measurement by a haze meter ("HAZE-GARD II" manufactured by Toyo Seiki Seisaku-sho, Ltd.). From the measurement results, a surface state in which the haze was less than 0.3% was judged to be "good", a surface state in which the haze was 0.3% or more and less than 1.0% was judged to be "slightly clouded", and a surface state in which the haze was 1.0% or more was judged to be "clouded".

In Example 6, the surface state of the optically anisotropic layer was visually observed under a fluorescent lamp. A case where shrinkage wrinkle of the film and clouding were not observed was judged to be "good", and a case where shrinkage wrinkle and clouding were observed was judged to be "poor".

Example 1

67 parts by weight of a photopolymerizable liquid crystal compound with reverse wavelength distribution represented by the following formula (B1) (CN point: 96° C.), 10 parts by weight of triphenyl phosphate (available from Wako) as a plasticizer, and 90 parts by weight of poly(9-vinyl carbazole) as a positive C polymer were dissolved in N-methyl-2-pyrrolidone (NMP) so that the solid content concentration was 12%. As a result, a coating liquid was prepared.

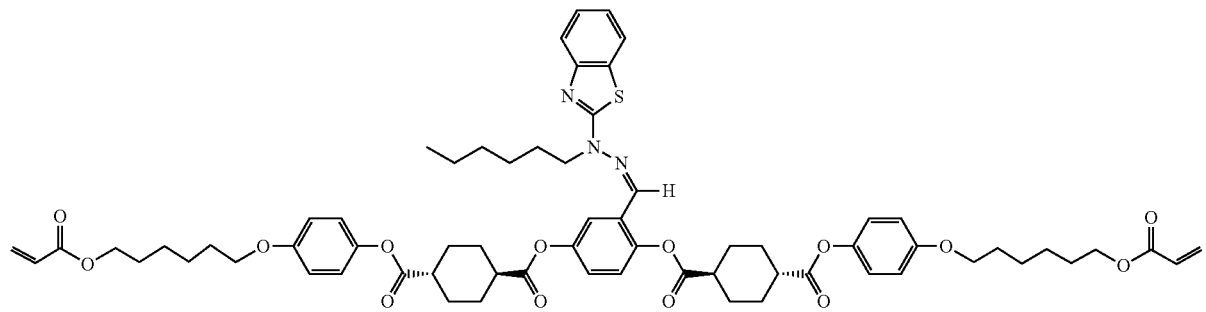

(B1)

As a substrate film, an unstretched film formed of a resin containing an alicyclic structure-containing polymer (available from ZEON Corporation, glass transition temperature (Tg) of resin: 163° C., thickness: 100 μm) was prepared. The coating liquid was applied onto a surface of the substrate film by an applicator to form a coating liquid layer. The thickness of the coating liquid layer was adjusted so that the thickness of the optically anisotropic layer to be obtained was about 10 μm.

The coating liquid layer was then dried in an oven of 85° C. for about 10 minutes to evaporate the solvent in the coating liquid layer. Thus, an optically anisotropic layer was formed on the substrate film to obtain an optically anisotropic transfer body including the substrate film and the optically anisotropic layer. The optically anisotropic layer was evaluated using the obtained optically anisotropic transfer body by the aforementioned method.

Example 2

The type of the positive C polymer was changed to a copolymer of diisopropyl fumarate with a cinnamic acid ester. The copolymer was a polyfumaric acid ester (weight-average molecular weight: 72,000) having a repeating unit represented by the following formula (P1) and a repeating unit represented by the following formula (P2). In the following formulae (P1) and (P2), R represents an isopropyl group, and the ratio m:n of the numbers m and n of the repeating units was 85:15.

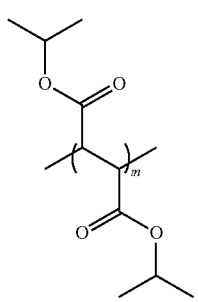

(P1)

-continued

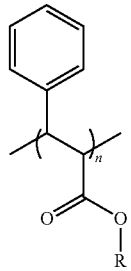

(P2)

An optically anisotropic transfer body including a substrate film and an optically anisotropic layer was produced and the optically anisotropic layer was evaluated in the same manner as that in Example 1 except for the aforementioned matters.

Example 3

A multilayer film including a support film and a phase difference layer was produced by the following method.

100 parts by weight of a photopolymerizable liquid crystal compound with reverse wavelength distribution represented by the following formula (B1) (CN point: 96° C.), 3 parts by weight of a photopolymerization initiator ("Irgacure 379EG" available from BASF), and 0.3 part by weight of surfactant ("MEGAFACE F-562" available from DIC Corporation) were mixed. To the mixture, a mixed solvent of cyclopentanone and 1,3-dioxolane (weight ratio of cyclopentanone relative to 1,3-dioxolane=4:6) was added as a solvent so that the solid content was 22% by weight. The mixture was dissolved in the solvent under heating to 50° C. The resulting mixture was filtered through a membrane filter with a pore diameter of 0.45 μm to obtain a liquid crystal composition in a liquid state.

As a support film, a long-length obliquely stretched film formed of a resin containing an alicyclic structure-containing polymer ("ZEONOR film" available from ZEON Corporation, glass transition temperature (Tg) of resin: 126° C., thickness: 47 μm, in-plane retardation at a wavelength of 550 nm: 141 nm, stretching direction: direction at 45° relative to widthwise direction) was prepared.

The aforementioned liquid crystal composition in a liquid state was applied onto the support film by a die coater to form a layer of the liquid crystal composition. The thickness of the layer of the liquid crystal composition was adjusted so that the thickness of the phase difference layer to be obtained was about 2.3 μm.

The layer of the liquid crystal composition was then dried in an oven of 110° C. for about 4 minutes, whereby the solvent in the layer of the liquid crystal composition was evaporated, and simultaneously the liquid crystal compound contained in the layer of the liquid crystal composition was homogeneously oriented in a stretching direction of the support film.

Subsequently, the layer of the liquid crystal composition was irradiated with ultraviolet light by an ultraviolet irradiation device. This irradiation with ultraviolet light was performed while the support film was fixed on a SUS plate heated to 60° C. by a tape under a nitrogen atmosphere. The layer of the liquid crystal composition was cured by irradiation with ultraviolet light, to form the phase difference layer on the support film. As a result, a multilayer film including the support film and the phase difference layer was obtained.

The retardation of the phase difference layer of the obtained multilayer film was measured by the aforementioned method. The in-plane retardations Re(B450), Re(B550), Re(B590), and Re(B650) at wavelengths of 450 nm, 550 nm, 590 nm, and 650 nm, respectively, were as shown in Table 1 described below. The refractive index of the phase difference layer was measured by the aforementioned method. The refractive index nx(B) in a direction which, among in-plane directions of the phase difference layer, gave the maximum refractive index, the refractive index ny(B) in a direction which was perpendicular to the direction of nx(B) among the in-plane directions of the phase difference layer, and the refractive index nz(B) in the thickness direction of the phase difference layer were as shown in Table 1.

TABLE 1

| [Optical anisotropy of phase difference layer] | |
|---|---|
| Re(B450) | 110 nm |
| Re(B550) | 138 nm |
| Re(B590) | 141 nm |
| Re(B650) | 144 nm |
| Re(B450)/Re(B550) | 0.80 |
| Re(B650)/Re(B550) | 1.02 |
| nx(B) | 1.62 |
| ny(B) | 1.56 |
| nz(B) | 1.56 |

As the substrate film, the multilayer film including the support film and the phase difference layer was used in place of the unstretched film used in Example 1. An optically anisotropic layered body including the support film, the phase difference layer, and the optically anisotropic layer was produced in the same manner as that of Example 1 except for the aforementioned matters. The optically anisotropic layer was evaluated by the aforementioned method using the thus obtained optically anisotropic layered body.

Example 4

As the substrate film, a long-length obliquely stretched film formed of a resin containing an alicyclic structure-containing polymer ("ZEONOR film" available from ZEON Corporation, glass transition temperature (Tg) of resin: 126° C., thickness: 47 μm, in-plane retardation at wavelength of 550 nm: 141 nm, stretching direction: direction at 45° relative to widthwise direction) was used in place of the unstretched film used in Example 1. An optically anisotropic transfer body including the substrate film and the optically anisotropic layer in this order was produced and the optically anisotropic layer was evaluated in the same manner as that of Example 1 except for the aforementioned matters.

Example 5

A photopolymerizable mesogen compound with reverse wavelength distribution represented by the following formula (B2) was used in place of the photopolymerizable liquid crystal compound with reverse wavelength distribution represented by the aforementioned formula (B1). An optically anisotropic transfer body including the substrate film and the optically anisotropic layer was produced and the optically anisotropic layer was evaluated in the same manner as that in Example 1 except for the aforementioned matters.

(B2)

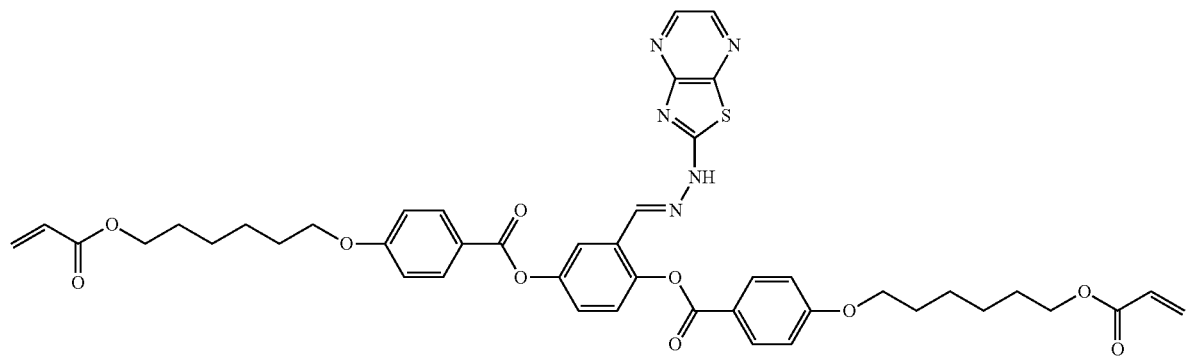

Example 6

As a stretched film layer that was a phase difference layer, an obliquely stretched film ("ZEONOR film" available from ZEON Corporation, glass transition temperature (Tg) of resin: 126° C., thickness: 47 µm, in-plane retardation at wavelength of 550 nm: 141 nm, refractive indices nx(B)>ny (B)≥nz(B), stretching direction: direction at 45° relative to widthwise direction) was prepared.

A surface on an optically anisotropic layer side of the optically anisotropic transfer body produced in Example 1 and a surface of the obliquely stretched film were bonded to each other through a tackiness layer ("CS9621T" available from Nitto Denko Corporation), to obtain a layered body including the substrate film, the optically anisotropic layer, the tackiness layer, and the obliquely stretched film in this order. At that time, a laminator was used in bonding.

Subsequently, the substrate film was peeled from the layered body, to obtain an optically anisotropic layered body including the optically anisotropic layer, the tackiness layer, and the obliquely stretched film in this order. The surface state of the thus obtained optically anisotropic layered body was evaluated by the aforementioned method. The surface state was favorable.

Example 7

The amount of the photopolymerizable liquid crystal compound with reverse wavelength distribution represented by the formula (B1) was changed from 67 parts by weight to 100 parts by weight. An optically anisotropic transfer body including the substrate film and the optically anisotropic layer was produced and the optically anisotropic layer was evaluated in the same manner as that in Example 1 except for the aforementioned matters.

Example 8

The amount of the photopolymerizable liquid crystal compound with reverse wavelength distribution represented by the formula (B1) was changed from 67 parts by weight to 122 parts by weight. An optically anisotropic transfer body including the substrate film and the optically anisotropic layer was produced and the optically anisotropic layer was evaluated in the same manner as that in Example 1 except for the aforementioned matters.

Comparative Example 1

The photopolymerizable liquid crystal compound with reverse wavelength distribution represented by the formula (B1) was not used in the production of the coating liquid.

As the substrate film, the same film as the unstretched film used in Example 1 except for the glass transition temperature of a resin (unstretched film formed of a resin containing an alicyclic structure-containing polymer (available from ZEON Corporation, glass transition temperature (Tg) of the resin: 126° C., thickness: 100 µm)) was used.

An optically anisotropic transfer body including the substrate film and the optically anisotropic layer was produced and the optically anisotropic layer was evaluated in the same manner as that of Example 1 except for the aforementioned matters.

Comparative Example 2

100 parts by weight of a photopolymerizable liquid crystal compound with reverse wavelength distribution represented by the following formula (B1) (CN point: 96° C.) and 3 parts by weight of a photopolymerization initiator ("Irgacure 379EG" available from BASF) were mixed. To the mixture, a mixed solvent of cyclopentanone and 1,3-dioxolane (weight ratio of cyclopentanone relative to 1,3-dioxolane=4:6) was added as a solvent so that the solid content was 22% by weight. The mixture was dissolved in the solvent under heating to 50° C. The resulting mixture was filtered through a membrane filter with a pore diameter of 0.45 µm to obtain a coating liquid.

A surface of the same unstretched film as that used in Example 1 was subjected to a corona treatment. Onto the surface of the unstretched film that had been subjected to the corona treatment, a silane coupling-based material for a vertical orientation film ("DMOAP" available from JNC) was applied by a bar coater, and baked at 100° C. for one hour. As a result, a vertical orientation substrate film including a stretched film and a vertical orientation film was obtained.

Onto the obtained vertical orientation substrate film, the coating liquid was applied by a bar coater, and dried at 110° C. for four minutes. Subsequently, a dried coating liquid layer was irradiated with ultraviolet light by an ultraviolet irradiation device. This irradiation with ultraviolet light was performed while the vertical orientation substrate film was fixed on a SUS plate by a tape under a nitrogen atmosphere. By irradiation with ultraviolet light, the coating liquid layer was cured. As a result, an optically anisotropic layer was formed on the vertical orientation substrate film to obtain an optically anisotropic transfer body including the vertical orientation substrate film and the optically anisotropic layer. The optically anisotropic layer was evaluated by the aforementioned method using the obtained optically anisotropic transfer body.

Comparative Example 3

50 parts by weight of a photopolymerizable liquid crystal compound with reverse wavelength distribution represented by the following formula (B1) (CN point: 96° C.), 50 parts by weight of 6-(4-cyanobiphenyl-4-yloxy)hexyl methacrylate ("ST03474" available from DKSH) as a liquid crystal monomer compound exhibiting strong vertical orientation with respect to the support film, and 3 parts by weight of a photopolymerization initiator ("Irgacure 379EG" available from BASF) were mixed. To the mixture, a mixed solvent of cyclopentanone and 1,3-dioxolane (weight ratio of cyclopentanone relative to 1,3-dioxolane=4:6) was added as a solvent so that the solid content was 22% by weight. The mixture was dissolved in the solvent under heating to 50° C. The resulting mixture was filtered through a membrane filter with a pore diameter of 0.45 µm to obtain a coating liquid.

Onto the same substrate film as that used in Example 1, the coating liquid was applied by a spin coater, to form a coating liquid layer. The thickness of the coating liquid layer was adjusted so that the thickness of optically anisotropic layer to be obtained was about 2.3 µm.

Subsequently, the coating liquid layer was dried in an oven of 110° C. for about 4 minutes, whereby the solvent in the coating liquid layer was evaporated, and simultaneously the liquid crystal compound contained in the coating liquid layer was oriented vertically to a plane of the substrate film.

The coating liquid layer was then irradiated with ultraviolet light by an ultraviolet irradiation device. This irradiation with ultraviolet light was performed while the substrate film was fixed on a SUS plate by a tape under a nitrogen atmosphere. By irradiation with ultraviolet light, the coating liquid layer was cured. As a result, an optically anisotropic layer was formed on the substrate film to obtain an optically anisotropic transfer body including the substrate film and the optically anisotropic layer. The optically anisotropic layer was evaluated by the aforementioned method using the obtained optically anisotropic transfer body.

Comparative Example 4

A photopolymerizable liquid crystal compound with forward wavelength distribution "LC242" (CN point of 66° C.) was used in place of the photopolymerizable liquid crystal compound with reverse wavelength distribution represented by the aforementioned formula (B1). An optically anisotropic transfer body including the substrate film and the optically anisotropic layer was produced and the optically anisotropic layer was evaluated in the same manner as that in Example 1 except for the aforementioned matters.

[Results]

The results in Examples and Comparative Examples described above are shown in Tables 2 and 3 described below. Abbreviations in Tables 2 and 3 mean as follows.

Unstretched film: an unstretched film formed of a resin containing an alicyclic structure-containing polymer Obliquely stretched film: an obliquely stretched film formed of a resin containing an alicyclic structure-containing polymer Positive A film: a multilayer film including a support film and a phase difference layer PVC: poly(9-vinyl carbazole)

PFDE: a copolymer of diisopropyl fumarate with a cinnamic acid ester.

Compound B1: a photopolymerizable liquid crystal compound with reverse wavelength distribution represented by the aforementioned formula (B1)

Compound B2: a mesogen compound with reverse wavelength distribution represented by the aforementioned formula (B2)

LC242: a photopolymerizable liquid crystal compound with forward wavelength distribution "LC242"

Mesogen compound ratio: a ratio of a mesogen compound in the total solid content of a coating liquid Blend coating: formation of a film by applying a coating liquid containing a positive C polymer and a mesogen compound Polymer coating: formation of a film by applying a coating liquid containing a positive C polymer and no mesogen compound Apply onto orientation film: formation of a film by applying a coating liquid containing a mesogen compound and no positive C polymer onto an orientation film Vertical orientation agent apply: formation of a film by applying a coating liquid containing a mesogen compound and a liquid crystal monomer compound exhibiting strong vertical orientation and no positive C polymer Posi C: the refractive indices nx(A), ny(A), and nz(A) satisfy nz(A)>nx(A)≥ny(A)

Wavelength distribution: wavelength distribution of thickness direction retardation Rth

TABLE 2

| | [Results of Examples] | | | | | | | |
|---|---|---|---|---|---|---|---|---|
| | Ex. 1 | Ex. 2 | Ex. 3 | Ex. 4 | Ex. 5 | Ex. 6 | Ex. 7 | Ex. 8 |
| Substrate film | Unstretched film | Unstretched film | Positive A film | Obliquely stretched film | Unstretched film | Unstretched film | Unstretched film | Unstretched film |
| Positive C polymer | PVC | PFDE | PVC | PVC | PVC | PVC | PVC | PVC |
| Mesogen compound type | Compound B1 | Compound B1 | Compound B1 | Compound B1 | Compound B2 | — | Compound B1 | Compound B1 |
| Mesogen compound ratio [wt %] | 40 | 40 | 40 | 40 | 40 | — | 50 | 55 |
| Film forming method | Blend coating | Blend coating | Blend coating | Blend coating | Blend coating | Blend coating | Blend coating | Blend coating |
| Optically anisotropic layer evaluation result | | | | | | | | |
| Thickness [μm] | 11.5 | 11 | 10 | 11.2 | 11.5 | — | 10.5 | 11.0 |
| Rth(A450) [nm] | −41.5 | −29.6 | −39.5 | −43.0 | −44.6 | — | −81.6 | −79.2 |
| Rth(A550) [nm] | −43.7 | −31.5 | −41.6 | −45.3 | −46.5 | — | −99.5 | −96.9 |
| Rth(A650) [nm] | −44.0 | −31.8 | −42.0 | −45.8 | −47.0 | — | −104.0 | −99.6 |
| Rth(A450)/Rth(A550) | 0.95 | 0.94 | 0.95 | 0.95 | 0.96 | — | 0.82 | 0.82 |
| Rth(A650)/Rth(A550) | 1.01 | 1.01 | 1.01 | 1.01 | 1.01 | — | 1.05 | 1.03 |
| Re(A590) [nm] | 1.65 | 0.3 | 0.2 | 0.5 | 0.3 | — | 0.44 | 1.57 |
| Rth(A590) [nm] | −44.0 | −32.3 | −42.3 | −46.0 | −46.9 | — | −102.1 | −99.6 |

TABLE 2-continued

[Results of Examples]

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| nx(A) | 1.5697 | 1.5168 | 1.5696 | 1.5697 | 1.5786 | — | 1.5738 | 1.5740 |
| ny(A) | 1.5697 | 1.5168 | 1.5696 | 1.5697 | 1.5786 | — | 1.5738 | 1.5740 |
| nz(A) | 1.5736 | 1.5198 | 1.5738 | 1.5736 | 1.5827 | — | 1.5835 | 1.5830 |
| nz > nx ≥ ny | Posi C | Posi C | Posi C | Posi C | Posi C | — | Posi C | Posi C |
| Wavelength distribution | Reverse | Reverse | Reverse | Reverse | Reverse | — | Reverse | Reverse |
| Haze value [%] | 0.06 | 0.06 | 0.07 | 0.07 | 0.09 | — | 0.34 | 0.89 |
| Surface state | Good | Good | Good | Good | Good | Good | slightly clouded | slightly clouded |

TABLE 3

[Results of Comparative Examples]

|  | Comp. Ex. 1 | Comp. Ex. 2 | Comp. Ex. 3 | Comp. Ex. 4 |
|---|---|---|---|---|
| Substrate film | Unstretched film | Unstretched film | Unstretched film | Unstretched film |
| Positive C polymer | PVC | None | None | PVC |
| Mesogen compound type | None | Compound B1 | Compound B1 | LC242 |
| Mesogen compound ratio [wt %] | 0 | 100 | 50 | 40 |
| Film forming method | Polymer coating | Apply onto orientation film | Vertical orientation agent apply | Blend coating |
| Optically anisotropic layer evaluation result |  |  |  |  |
| Thickness [μm] | 10.5 | — | — | 10.3 |
| Rth(A450) [nm] | −121 | — | — | −29.3 |
| Rth(A550) [nm] | −110 | — | — | −26.1 |
| Rth(A650) [nm] | −104 | — | — | −24.8 |
| Rth(A450)/Rth(A550) | 1.10 | — | — | 1.12 |
| Rth(A650)/Rth(A550) | 0.95 | — | — | 0.95 |
| Re(A590) [nm] | 0.9 | — | — | 0.24 |
| Rth(A590) [nm] | −107 | — | — | −25.5 |
| nx(A) | 1.5546 | — | — | 1.5542 |
| ny(A) | 1.5546 | — | — | 1.5542 |
| nz(A) | 1.5648 | — | — | 1.5567 |
| nz > nx ≥ ny | Posi C | — | — | Posi C |
| Wavelength distribution | Forward | — | — | Forward |
| Haze value[%] | 0.06 | 1.73 | 1.57 | 0.09 |
| Surface state | Good | Clouded | Clouded | Good |

In the evaluation of surface state in Comparative Examples 2 and 3, the molecules of the liquid crystal compound in the optically anisotropic layer were oriented vertically to the plane of the substrate film. However, the tilt angle of molecules of the liquid crystal compound was not uniform and the optically anisotropic layer was clouded.

As seen in Comparative Example 3, even when the liquid crystal monomer compound exhibiting highly vertical orientation to the support film was used with the liquid crystal compound with reverse wavelength distribution, there was a difficulty in obtaining a liquid crystal layer having uniform orientation. That is in a contrast with that, when a liquid crystal compound with forward wavelength distribution is combined with a liquid crystal monomeric compound exhibiting highly vertical orientation to a support film, a liquid crystal layer in which light is uniformly distributed is generally formed.

As seen in Comparative Example 2, even when the orientation film was used with the liquid crystal compound with reverse wavelength distribution, it was difficult to obtain a liquid crystal layer having uniform orientation without adjusting a compatibility between the orientation film and the liquid crystal compound with reverse wavelength distribution. Therefore, it was difficult to realize a positive C film by prior-art production methods using a liquid crystal layer containing a liquid crystal compound with reverse wavelength distribution oriented parallel to the thickness direction.

In contrast thereto, in Examples 1 to 4, 7, and 8, the liquid crystal layer having uniform orientation was obtained as an optically anisotropic layer by combining the liquid crystal compound with reverse wavelength distribution with the positive C polymer. Further, these optically anisotropic layers have an ability to function as positive C films.

As seen in Example 5, even when a mesogen compound with reverse wavelength distribution is used in place of the liquid crystal compound with reverse wavelength distribution, an optically anisotropic layer having uniform orientation can be obtained. Further, this optically anisotropic layer has an ability to function as a positive C film.

As confirmed from Examples described above, an optically anisotropic layer that can be produced without using an orientation film, and can be used as a positive C plate in which the thickness direction retardation Rth exhibits reverse wavelength distribution can be realized by the present invention.

Reference Example 1: Confirmation of Wavelength Distribution of Liquid Crystal Compound with Reverse Wavelength Distribution Represented by Formula (B1)

100 parts by weight of a photopolymerizable liquid crystal compound with reverse wavelength distribution represented by the following formula (B1), 3 parts by weight of a photopolymerization initiator ("Irgacure 379EG" available from BASF), and 0.3 part by weight of a surfactant ("MEGAFACE F-562" available from DIC Corporation) were mixed. To the mixture, a mixed solvent of cyclopentanone and 1,3-dioxolane (weight ratio of cyclopentanone relative to 1,3-dioxolane=4:6) was added as a dilution solvent so that the solid content was 22% by weight. The mixture was dissolved in the solvent under heating to 50° C. The resulting mixture was filtered through a membrane filter with a pore diameter of 0.45 μm to obtain a liquid crystal composition.

An unstretched film formed of a resin containing an alicyclic structure-containing polymer ("ZEONOR film" available from ZEON Corporation) was prepared. The unstretched film was subjected to a rubbing treatment, to prepare an orientation substrate.

Onto the aforementioned orientation substrate, the liquid crystal composition was applied by a bar coater, to form a layer of the liquid crystal composition. The thickness of the layer of the liquid crystal composition was adjusted so that the thickness of an optically anisotropic layer to be obtained after curing was about 2.3 μm.

The layer of the liquid crystal composition was then dried in an oven of 110° C. for about 4 minutes, whereby the solvent in the liquid crystal composition was evaporated, and simultaneously the liquid crystal compound with reverse wavelength distribution contained in the liquid crystal composition was homogeneously oriented.

Subsequently, the layer of the liquid crystal composition was irradiated with ultraviolet light by an ultraviolet irradiation device. This irradiation with ultraviolet light was performed while the orientation substrate was fixed on a SUS plate by a tape under a nitrogen atmosphere. By the irradiation with ultraviolet light, the layer of the liquid crystal composition was cured, to obtain a sample film including an optically anisotropic layer and the orientation substrate.

For this sample film, the wavelength distribution of in-plane retardation was measured by a phase difference meter (manufactured by Axometrics, Inc.). Since the orientation substrate has no in-plane retardation, the in-plane retardation obtained by the aforementioned measurement shows the in-plane retardation of the optically anisotropic layer. As a result of measurement, the in-plane retardations Re(450), Re(550), and Re(650) at wavelengths of 450 nm, 550 nm, and 650 nm, respectively, satisfied Re(450)<Re(550)<Re(650). Therefore, it was confirmed that the photopolymerizable liquid crystal compound with reverse wavelength distribution represented by the aforementioned formula (B1) exhibited an in-plane retardation with reverse wavelength distribution during homogeneous orientation.

Reference Example 2: Confirmation of Wavelength Distribution of Liquid Crystal Compound with Forward Wavelength Distribution "LC242"

A photopolymerizable liquid crystal compound with forward wavelength distribution "LC242" was used in place of the photopolymerizable liquid crystal compound with reverse wavelength distribution represented by the aforementioned formula (B1). A sample film including an optically anisotropic layer was prepared in the same manner as that of Reference Example 1 except for the aforementioned matter. The wavelength distribution of in-plane retardation was measured.

As a result of measurement, the in-plane retardations Re(450), Re(550), and Re(650) at wavelengths of 450 nm, 550 nm, and 650 nm, respectively, satisfied Re(450)>Re(550)>Re(650). Therefore, it was confirmed that the liquid crystal compound with forward wavelength distribution "LC242" exhibited an in-plane retardation with forward wavelength distribution during homogeneous orientation.

Reference Example 3: Confirmation of Poly(9-Vinyl Carbazole) being Positive C Polymer Poly(9-vinyl carbazole) was added to N-methylpyrrolidinone so that the solid content concentration was 12% by weight, and dissolved at room temperature, to obtain a polymer solution.

An unstretched film formed of a resin containing an alicyclic structure-containing polymer ("ZEONOR film" available from ZEON Corporation) was prepared. The aforementioned polymer solution was applied onto the unstretched film by an applicator, to form a layer of the polymer solution. Subsequently, the layer was dried in an oven of 85° C. for about 10 minutes, to evaporate the solvent. As a result, a sample film including a polymer film having a thickness of about 10 μm and the unstretched film was obtained.

This sample film was disposed on a stage of a phase difference meter (manufactured by Axometrics, Inc.), and the in-plane retardation Re0 of the sample film was measured at a measurement wavelength of 590 nm. Since the unstretched film is an optically isotropic film, the measured in-plane retardation Re0 represents the in-plane retardation Re0 of a polymer film. As a result of measurement, the in-plane retardation Re0 was 1 nm or less. It was thus confirmed that nx(P)≥ny(P) was satisfied.

Subsequently, the stage was tilted at 40° about a slow axis of the polymer film as a rotation axis of the stage. Thus, the retardation Re40 of the sample film in a tilt direction at an angle of 40° relative to the thickness direction of the sample film was measured. By this measurement, the slow axis direction of the polymer film was measured. When the "slow axis direction" is perpendicular to the "rotation axis of the stage", nz(P) and nx(P) can be judged to satisfy nz(P)>nx(P). In contrast, when the "slow axis direction" is parallel to the "rotation axis of the stage", ny(P) and nz(P) can be judged to satisfy ny(P)>nz(P). As a result of the measurement, the slow axis direction was perpendicular to the rotation axis of the stage. Therefore, the refractive indices nx(P) and nz(P) of the polymer film were judged to satisfy nz(P)>nx(P).

Accordingly, poly(9-vinyl carbazole) was confirmed to have a property such that, when a polymer film was formed by a coating method using a solution of this poly(9-vinyl carbazole), the refractive indices of the polymer film satisfied nz(P)>nx(P)≥ny(P). Consequently, poly(9-vinyl carbazole) was confirmed to be a positive C polymer.

Reference Example 4: Confirmation of Copolymer of Diisopropyl Fumarate with Cinnamic Acid Ester being Positive C Polymer A copolymer of diisopropyl fumarate with a cinnamic acid ester was used in place of poly(9-vinyl carbazole). In the same manner as that of Reference Example 3 except for the aforementioned matter, a polymer film was formed, and the refractive indices of the polymer film were confirmed to satisfy nz(P)>nx(P)≥ny(P). Therefore, the copolymer of diisopropyl fumarate with a cinnamic acid ester was confirmed to be a positive C polymer.

Reference Examples 5 to 9

A photopolymerizable liquid crystal compound with forward wavelength distribution "LC242" (CN point: 66° C.)

as a evaluator liquid crystal compound, a photopolymerizable mesogen compound with reverse wavelength distribution represented by the aforementioned formula (B2), 3 parts by weight of a photopolymerization initiator ("Irgacure 379EG" available from BASF), and 0.3 weight of a surfactant ("MEGAFACE F-562" available from DIC Corporation) were mixed. To the mixture, a mixed solvent of cyclopentanone and 1,3-dioxolane (weight ratio of cyclopentanone relative to 1,3-dioxolane=4:6) was added as a solvent so that the solid content was 22% by weight. The mixture was dissolved in the solvent under heating to 50° C. At that time, the amount of the liquid crystal compound with forward wavelength distribution "LC242" and the amount of the mesogen compound with reverse wavelength distribution represented by the aforementioned formula (B2) were as shown in Table 4 described below. The resulting mixture was filtered through a membrane filter with a pore diameter of 0.45 μm to obtain an evaluation mixture in a liquid state.

The evaluation mixture was applied onto a substrate and dried to obtain a sample film including the substrate and a layer of the evaluation mixture. The sample film was disposed on a hot stage (manufactured by Mettler Toledo). While the sample film was observed by a polarized light microscope, the sample film was heated. When phase transition of the layer of the evaluation mixture to a liquid crystal phase was observed, the evaluation mixture was judged to exhibit liquid crystal property. When the phase transition was not observed, the evaluation mixture was judged not to exhibit liquid crystal property.

A multilayer film including a phase difference layer formed of the aforementioned evaluation mixture was obtained in the same manner as the method for producing a multilayer film including a support film and a phase difference layer described in Example 3 except that the aforementioned evaluation mixture was used in place of the liquid crystal composition in a liquid state. The retardation of the phase difference layer of the obtained multilayer film was measured by the aforementioned method.

The results of Reference Examples 5 to 9 are shown in Table 4 described below. Abbreviations in Table 4 mean as follows.

Re(450)/Re(550): A ratio of an in-plane retardation Re(450) at a wavelength of 450 nm relative to an in-plane retardation Re(550) at a wavelength of 550 nm.

Re(650)/Re(550): A ratio of an in-plane retardation Re(650) at a wavelength of 650 nm relative to an in-plane retardation Re(550) at a wavelength of 550 nm.

TABLE 4

[Results of Reference Examples 5 to 9]

|  | Ref. Ex. 5 | Ref. Ex. 6 | Ref. Ex. 7 | Ref. Ex. 8 | Ref. Ex. 9 |
|---|---|---|---|---|---|
| Evaluator liquid crystal compound amount (wt parts) | 100 | 70 | 50 | 30 | 0 |
| Reverse wavelength mesogen compound amount (wt parts) | 0 | 30 | 50 | 70 | 100 |
| Existence of liquid crystal property | Liquid crystal | Liquid crystal | Liquid crystal | Liquid crystal | Non liquid crystal |
| Re(450)/Re(550) | 1.082 | 1 | 0.945 | 0.89 | — |
| Re(650)/Re(550) | 0.962 | 0.985 | 1.001 | 1.017 | — |

TABLE 4-continued

[Results of Reference Examples 5 to 9]

|  | Ref. Ex. 5 | Ref. Ex. 6 | Ref. Ex. 7 | Ref. Ex. 8 | Ref. Ex. 9 |
|---|---|---|---|---|---|
| Evaluation mixture wavelength distribution | Forward wavelength distribution | Forward wavelength distribution | Reverse wavelength distribution | Reverse wavelength distribution | — |

As seen from Reference Example 9, the mesogen compound with reverse wavelength distribution represented by the aforementioned formula (B2) is a compound that does not solely exhibit liquid crystal property.

The retardation ratio Re(450)/Re(550) of the phase difference layer in Reference Examples 6 to 8 in which the mesogen compound with reverse wavelength distribution was contained was smaller than the retardation ratio Re(450)/Re(550) of the phase difference layer in Reference Example 5 in which the mesogen compound with reverse wavelength distribution was not contained. Therefore, the mesogen compound with reverse wavelength distribution represented by the formula (B2) was confirmed to exhibit an in-plane retardation with reverse wavelength distribution in the homogeneously oriented evaluation mixture.

REFERENCE SIGN LIST 100 organic EL display device
110 organic EL element
120 optically anisotropic layered body
121 phase difference layer
122 optically anisotropic layer
130 linear polarizer
200 organic EL display device
210 organic EL element
220 λ/4 wave plate
230 linear polarizer
240 optically anisotropic layered body
241 phase difference layer
242 optically anisotropic layer
300 liquid crystal display device
310 light source
320 light source side linear polarizer
330 liquid crystal cell
340 viewing side linear polarizer
350 optically anisotropic layered body
351 phase difference layer
352 optically anisotropic layer

The invention claimed is:

1. An optically anisotropic layer comprising a polymer and a compound having a mesogen skeleton whose orientation state is optionally fixed, wherein
    the polymer has a property such that a film of the polymer that is formed by a coating method using a solution of the polymer satisfies $nz(P)>nx(P) \geq ny(P)$, wherein $nx(P)$ is a refractive index in a direction which, among in-plane directions of the film, gives a maximum refractive index, $ny(P)$ is a refractive index in a direction which is perpendicular to the direction of $nx(P)$ among the in-plane directions of the film, and $nz(P)$ a refractive index in a thickness direction of the film,
    the compound having a mesogen skeleton is at least one selected from the group consisting of a first compound that exhibits liquid crystal property and also exhibits, when homogeneously oriented, an in-plane retardation with reverse wavelength distribution; and a second compound that does not solely exhibit liquid crystal property, the second compound has a property such that a mixture of the second compound with an evaluator liquid crystal compound exhibits liquid crystal property, and, in a case where the mixture is homogeneously oriented, the second compound exhibits an in-plane retardation with reverse wavelength distribution, wherein the evaluator liquid crystal compound is a compound that exhibits an in-plane retardation with forward wavelength distribution in a case where the compound is homogeneously orientated, and wherein the mixture is a mixture obtained by mixing the second compound with the evaluator liquid crystal compound at at least any one ratio in a range of the second compound being 30 parts by weight to 70 parts by weight relative to 100 parts by weight of a total of the evaluator liquid crystal compound and the second compound, a refractive index nx(A) in a direction which, among in-plane directions of the optically anisotropic layer, gives a maximum refractive index, a refractive index ny(A) in a direction which is perpendicular to the direction of nx(A) among the in-plane directions of the optically anisotropic layer, and a refractive index nz(A) in a thickness direction of the optically anisotropic layer satisfy nz(A)>nx(A)≥ny(A), and a thickness direction retardation Rth(A450) of the optically anisotropic layer at a wavelength of 450 nm, a thickness direction retardation Rth(A550) of the optically anisotropic layer at a wavelength of 550 nm, and a thickness direction retardation Rth(A650) of the optically anisotropic layer at a wavelength of 650 nm satisfy the following expressions (1) and (2):

$$0.50 < Rth(A450)/Rth(A550) < 1.00 \quad (1), \text{ and}$$

$$1.00 \leq Rth(A650)/Rth(A550) < 1.25 \quad (2).$$

2. The optically anisotropic layer according to claim 1, wherein the compound having the mesogen skeleton includes a main chain mesogen skeleton and a side chain mesogen skeleton bonded to the main chain mesogen skeleton in a molecule of the compound having the mesogen skeleton.

3. The optically anisotropic layer according to claim 1, wherein the compound having the mesogen skeleton is represented by the following Formula (I):
(in the Formula (I), $G^1$ and $G^2$ are each independently a divalent aliphatic group of 1 to 20 carbon atoms optionally having a substituent; the aliphatic groups may have one or more per one aliphatic group of —O—, —S—, —O—C(=O)—, —C(=O)—O—, —O—C(=O)—O—, —NR²—C(=O)—, —C(=O)—NR²—, —NR²—, or —C(=O)— inserted therein; with a proviso that cases where two or more of each of —O— or —S— groups are adjacently inserted are excluded, wherein $R^2$ is a hydrogen atom or an alkyl group of 1 to 6 carbon atoms;

$Z^1$ and $Z^2$ are each independently an alkenyl group of 2 to 10 carbon atoms optionally being substituted by a halogen atom;

$A^x$ is an organic group of 2 to 30 carbon atoms having at least one aromatic ring selected from the group consisting of an aromatic hydrocarbon ring and an aromatic heterocyclic ring;

$A^y$ is a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R³, —SO₂—R⁴, —C(=S)NH—R⁹, or an organic group of 2 to 30 carbon atoms having at least one aromatic ring selected from the group consisting of an aromatic hydrocarbon ring and an aromatic heterocyclic ring, wherein $R^3$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms; $R^4$ is an alkyl group of 1 to 20 carbon atoms, an alkenyl group of 2 to 20 carbon atoms, a phenyl group, or a 4-methylphenyl group; $R^9$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent; the aromatic ring that $A^x$ and $A^y$ have may have a substituent; and $A^x$ and $A^y$ may form a ring together;

$A^1$ is a trivalent aromatic group optionally having a substituent;

$A^2$ and $A^3$ are each independently a divalent alicyclic hydrocarbon group of 3 to 30 carbon atoms optionally having a substituent;

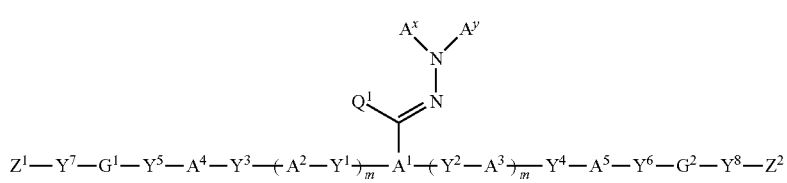

(I)

$Y^1$ to $Y^8$ are each independently a chemical single bond, —O—, —S—, —O—C(=O)—, —C(=O)—O—, —O—C(=O)—O—, —NR¹—C(=O)—, —C(=O)—NR¹—, —O—C(=O)—NR¹—, —NR¹—C(=O)—NR¹—, —O—NR¹—, or —NR¹—O—, wherein $R^1$ is a hydrogen atom or an alkyl group of 1 to 6 carbon atoms;

$A^4$ and $A^5$ are each independently a divalent aromatic group of 6 to 30 carbon atoms optionally having a substituent;

$Q^1$ is a hydrogen atom or an alkyl group of 1 to 6 carbon atoms optionally having a substituent; and m is each independently 0 or 1).

4. The optically anisotropic layer according to claim 1, wherein the compound having a mesogen skeleton contains at least one selected from the group consisting of a benzothiazole ring, and a combination of a cyclohexyl ring and a phenyl ring in the molecule of the compound having a mesogen skeleton.

5. The optically anisotropic layer according to claim 1, wherein the polymer is at least one polymer selected from the group consisting of polyvinyl carbazole, a polyfumaric acid ester, and a cellulose derivative.

6. The optically anisotropic layer according to claim 1, wherein a ratio of the compound having a mesogen skeleton in a total solid content of the optically anisotropic layer is 20% by weight to 60% by weight.

7. The optically anisotropic layer according to claim 1, wherein an in-plane retardation Re(A590) of the optically anisotropic layer at a wavelength of 590 nm and a thickness direction retardation Rth(A590) of the optically anisotropic layer at a wavelength of 590 nm satisfy the following formulae (3) and (4):

$$Re(A590) \leq 10 \text{ nm} \qquad (3), \text{ and}$$

$$-200 \text{ nm} \leq Rth(A590) \leq -10 \text{ nm} \qquad (4).$$

8. A polarizing plate comprising:
a linear polarizer; and
the optically anisotropic layer according to claim 1.

9. An image display device comprising the polarizing plate according to claim 8.

10. An optically anisotropic transfer body comprising a substrate and the optically anisotropic layer according to claim 1.

11. A method for producing an optically anisotropic layered body comprising the steps of:
bonding the optically anisotropic layer of the optically anisotropic transfer body according to claim 10 to a phase difference layer; and
peeling the substrate of the optically anisotropic transfer body,
wherein a refractive index nx(B) in a direction which, among in-plane directions of the phase difference layer, gives a maximum refractive index, a refractive index ny(B) in a direction which is perpendicular to the direction of nx(B) among the in-plane directions of the phase difference layer, and a refractive index nz(B) in a thickness direction of the phase difference layer satisfy nx(B)>ny(B)≥2 nz(B).

12. A polarizing plate comprising:
a linear polarizer; and
the optically anisotropic transfer body according to claim 10.

13. An image display device comprising the polarizing plate according to claim 12.

14. An optically anisotropic layered body comprising the optically anisotropic layer according to claim 1 and a phase difference layer, wherein a refractive index nx(B) in a direction which, among in-plane directions of the phase difference layer, gives a maximum refractive index, a refractive index ny(B) in a direction which is perpendicular to the direction of nx(B) among the in-plane directions of the phase difference layer, and a refractive index nz(B) in a thickness direction of the phase difference layer satisfy nx(B)>ny(B)≥nz(B).

15. The optically anisotropic layered body according to claim 14, wherein the phase difference layer is a stretched film having a multilayer structure.

16. The optically anisotropic layered body according to claim 14, wherein an in-plane retardation Re(B450) of the phase difference layer at a wavelength of 450 nm, an in-plane retardation Re(B550) of the phase difference layer at a wavelength of 550 nm, and an in-plane retardation Re(B650) of the phase difference layer at a wavelength of 650 nm satisfy the following formulae (5) and (6):

$$0.75 < Re(B450)/Re(B550) < 1.00 \qquad (5), \text{ and}$$

$$1.01 < Re(B650)/Re(B550) < 1.25 \qquad (6).$$

17. The optically anisotropic layered body according to claim 14, wherein the phase difference layer contains a liquid crystal compound for a phase difference layer whose orientation state is optionally fixed, the liquid crystal compound being represented by the following Formula (II):

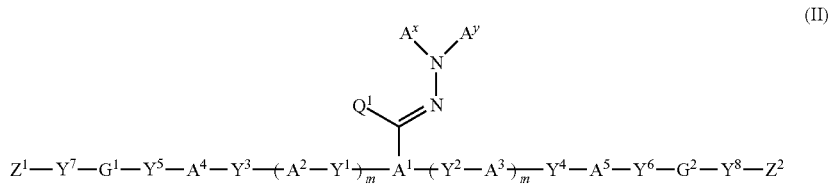

(in the Formula (II),
Y$^1$ to Y$^8$ are each independently a chemical single bond, —O—, —S—, —O—C(=O)—, —C(=O)—O—, —O—C(=O)—O—, —NR$^1$—C(=O)—, —C(=O)—NR$^1$—, —O—C(=O)—NR$^1$—, —NR$^1$—C(=O)—O—, —NR$^1$—C(=O)—NR$^1$—, —O—NR$^1$—, or —NR$^1$—O—, wherein R$^1$ is a hydrogen atom or an alkyl group of 1 to 6 carbon atoms;

G$^1$ and G$^2$ are each independently a divalent aliphatic group of 1 to 20 carbon atoms optionally having a substituent; the aliphatic groups may have one or more per one aliphatic group of —O—, —S—, —O—C(=O)—, —C(=O)—O—, —O—C(=O)—O—, —NR$^2$—C(=O)—, —C(=O)—NR$^2$—, —NR$^2$—, or —C(=O)— inserted therein; with a proviso that cases where two or more of each of —O— or —S— groups are adjacently inserted are excluded, wherein R$^2$ is a hydrogen atom or an alkyl group of 1 to 6 carbon atoms;

Z$^1$ and Z$^2$ are each independently an alkenyl group of 2 to 10 carbon atoms optionally being substituted by a halogen atom;

A$^x$ is an organic group of 2 to 30 carbon atoms having at least one aromatic ring selected from the group consisting of an aromatic hydrocarbon ring and an aromatic heterocyclic ring;

A^y is a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R$^3$, —SO$_2$—R$^4$, —C(=S)NH—R$^9$, or an organic group of 2 to 30 carbon atoms having at least one aromatic ring selected from the group consisting of an aromatic hydrocarbon ring and an aromatic heterocyclic ring, wherein R$^3$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms; R$^4$ is an alkyl group of 1 to 20 carbon atoms, an alkenyl group of 2 to 20 carbon atoms, a phenyl group, or a 4-methylphenyl group; R$^9$ is an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent; the aromatic ring that A$^x$ and A$^y$ have may have a substituent; and A$^x$ and A$^y$ may form a ring together;

A$^1$ is a trivalent aromatic group optionally having a substituent;

A$^2$ and A$^3$ are each independently a divalent alicyclic hydrocarbon group of 3 to 30 carbon atoms optionally having a substituent;

A$^4$ and A$^5$ are each independently a divalent aromatic group of 6 to 30 carbon atoms optionally having a substituent;

Q$^1$ is a hydrogen atom or an alkyl group of 1 to 6 carbon atoms optionally having a substituent; and m is each independently 0 or 1).

18. The optically anisotropic layered body according to claim 14, wherein an in-plane retardation Re(B590) of the phase difference layer at a wavelength of 590 nm, an in-plane retardation Re(A590) of the optically anisotropic layer at a wavelength of 590 nm, and a thickness direction retardation Rth(A590) of the optically anisotropic layer at a wavelength of 590 nm satisfy the following formulae (7), (8), and (9):

$$110\ \text{nm} \leq Re(B590) \leq 170\ \text{nm} \quad (7),$$

$$Re(A590) \leq 10\ \text{nm} \quad (8), \text{and}$$

$$-110\ \text{nm} \leq Rth(A590) \leq -20\ \text{nm} \quad (9).$$

19. An image display device comprising:
the optically anisotropic layered body according to claim 14;
a linear polarizer; and
an image display element, which are included in this order, wherein
the image display element is a liquid crystal cell or an organic electroluminescent element.

20. An image display device comprising:
a linear polarizer;
the optically anisotropic layered body according to claim 14; and
an organic electroluminescent element, which are included in this order.

21. The optically anisotropic layered body according to claim 14, wherein the phase difference layer is a stretched film containing an alicyclic structure-containing polymer.

22. The optically anisotropic layered body according to claim 21, wherein the phase difference layer is an obliquely stretched film.

23. A polarizing plate comprising:
a linear polarizer; and
the optically anisotropic layered body according to claim 14.

24. An image display device comprising the polarizing plate according to claim 23.

25. A method for producing an optically anisotropic layer comprising the steps of:
applying a coating liquid containing a polymer, a compound having a mesogen skeleton, and a solvent onto a support surface to obtain a coating liquid layer; and
drying the coating liquid layer,
the polymer has a property such that a film of the polymer that is formed by a coating method using a solution of the polymer satisfies nz(P)>nx(P)≥ny(P), wherein nx(P) is a refractive index in a direction which, among in-plane directions of the film, gives a maximum refractive index, ny(P) is a refractive index in a direction which is perpendicular to the direction of nx(P) among the in-plane directions of the film, and nz(P) a refractive index in a thickness direction of the film,
the compound having a mesogen skeleton is at least one selected from the group consisting of a first compound that exhibits liquid crystal property and also exhibits, when homogeneously oriented, an in-plane retardation with reverse wavelength distribution; and a second compound that does not solely exhibit liquid crystal property,
the second compound has a property such that a mixture of the second compound with an evaluator liquid crystal compound exhibits liquid crystal property, and, in a case where the mixture is homogeneously oriented, the second compound exhibits an in-plane retardation with reverse wavelength distribution, wherein the evaluator liquid crystal compound is a compound that exhibits an in-plane retardation with forward wavelength distribution in a case where the compound is homogeneously orientated, and wherein the mixture is a mixture obtained by mixing the second compound with the evaluator liquid crystal compound at at least any one ratio in a range of the second compound being 30 parts by weight to 70 parts by weight relative to 100 parts by weight of a total of the evaluator liquid crystal compound and the second compound,
a refractive index nx(A) in a direction which, among in-plane directions of the optically anisotropic layer, gives a maximum refractive index, a refractive index ny(A) in a direction which is perpendicular to the direction of nx(A) among the in-plane directions of the optically anisotropic layer, and a refractive index nz(A) in a thickness direction of the optically anisotropic layer satisfy nz(A)>nx(A)≥ny(A), and
a thickness direction retardation Rth(A450) of the optically anisotropic layer at a wavelength of 450 nm, a thickness direction retardation Rth(A550) of the optically anisotropic layer at a wavelength of 550 nm, and a thickness direction retardation Rth(A650) of the optically anisotropic layer at a wavelength of 650 nm satisfy the following expressions (1) and (2):

$$0.50 < Rth(A450)/Rth(A550) < 1.00 \quad (1), \text{and}$$

$$1.00 \leq Rth(A650)/Rth(A550) < 1.25 \quad (2).$$

* * * * *